US012720890B2

(12) United States Patent
Ahn et al.

(10) Patent No.: US 12,720,890 B2
(45) Date of Patent: Aug. 25, 2026

(54) IMAGE SENSOR INCLUDING COLOR SEPARATING LENS ARRAY AND ELECTRONIC DEVICE INCLUDING THE IMAGE SENSOR

(71) Applicant: SAMSUNG ELECTRONICS CO., LTD., Suwon-si (KR)

(72) Inventors: Sungmo Ahn, Yongin-si (KR); Sookyoung Roh, Yongin-si (KR); Sangyun Lee, Yongin-si (KR); Sangeun Mun, Yongin-si (KR); Seokho Yun, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 857 days.

(21) Appl. No.: 17/882,108

(22) Filed: Aug. 5, 2022

(65) Prior Publication Data

US 2023/0044798 A1 Feb. 9, 2023

(30) Foreign Application Priority Data

Aug. 5, 2021 (KR) ........................ 10-2021-0103467

(51) Int. Cl.
*H10F 39/00* (2025.01)
*H10F 39/18* (2025.01)

(52) U.S. Cl.
CPC ......... *H10F 39/806* (2025.01); *H10F 39/182* (2025.01); *H10F 39/8053* (2025.01); *H10F 39/807* (2025.01)

(58) Field of Classification Search
None
See application file for complete search history.

(56) References Cited

U.S. PATENT DOCUMENTS 7,646,551 B2 1/2010 Li et al.
8,115,854 B2 2/2012 Mouli
(Continued)

FOREIGN PATENT DOCUMENTS

CN 110429095 A 11/2019
KR 10-2019-0132385 A 11/2019
(Continued)

OTHER PUBLICATIONS

Communication dated Jan. 7, 2023, issued by the Korean Intellectual Property Office in Korean Patent Application No. 10-2021-0103467.

*Primary Examiner* — Twyler L Haskins
*Assistant Examiner* — Wesley J Chiu
(74) *Attorney, Agent, or Firm* — Sughrue Mion, PLLC

(57) ABSTRACT

Provided is an image sensor including a color separating lens array and an electronic device including the color sensor. The image sensor includes a sensor substrate including a plurality of first pixels and a plurality of second pixels and having a two-dimensional array of unit pixels including the first pixel and the second pixel; and a color separating lens array configured to concentrate light of a first wavelength on each of the first pixels, and concentrate light of a second wavelength on each of the second pixels, wherein at least one pixel of the unit pixel includes a plurality of light sensing cells for independently sensing light by being electrically separated by a deep trench isolation (DTI) structure, and the color separating lens array includes a nanopost array, which does not include a nanopost provided on the DTI structure.

25 Claims, 36 Drawing Sheets

(56) References Cited

U.S. PATENT DOCUMENTS

| | | | | |
|---|---|---|---|---|
| 2006/0187553 | A1* | 8/2006 | Tanaka | H10F 39/806 359/619 |
| 2015/0365640 | A1* | 12/2015 | Park | G02B 5/203 359/618 |
| 2017/0034500 | A1* | 2/2017 | Arbabi | H10F 39/8063 |
| 2020/0358989 | A1* | 11/2020 | Hoshino | H04N 25/533 |
| 2021/0125301 | A1 | 4/2021 | Park et al. | |
| 2021/0126035 | A1 | 4/2021 | Roh et al. | |
| 2021/0167110 | A1 | 6/2021 | Roh et al. | |
| 2024/0006441 | A1* | 1/2024 | Miyata | H10F 39/8053 |
| 2024/0014237 | A1* | 1/2024 | Miyata | H04N 23/11 |

FOREIGN PATENT DOCUMENTS

| | | | |
|---|---|---|---|
| KR | 10-2021-0048401 | A | 5/2021 |
| KR | 10-2021-0049670 | A | 5/2021 |

* cited by examiner

1100

| G | B | G | B | G | B | G | B |
|---|---|---|---|---|---|---|---|
| R | G | R | G | R | G | R | G |
| G | B | G | B | G | B | G | B |
| R | G | R | G | R | G | R | G |
| G | B | G | B | G | B | G | B |
| R | G | R | G | R | G | R | G |

FIG. 2B

| | | | | | | | |
|---|---|---|---|---|---|---|---|
| C | M | C | M | C | M | C | M |
| Y | G | Y | G | Y | G | Y | G |
| C | M | C | M | C | M | C | M |
| Y | G | Y | G | Y | G | Y | G |
| C | M | C | M | C | M | C | M |
| Y | G | Y | G | Y | G | Y | G |
| C | M | C | M | C | M | C | M |
| Y | G | Y | G | Y | G | Y | G |

| R | G | R | G | R | G | R | G |
|---|---|---|---|---|---|---|---|
| B | W | B | W | B | W | B | W |
| R | G | R | G | R | G | R | G |
| B | W | B | W | B | W | B | W |
| R | G | R | G | R | G | R | G |
| B | W | B | W | B | W | B | W |
| R | G | R | G | R | G | R | G |
| B | W | B | W | B | W | B | W |

1100
131
132
131
132
NP
130
120h
120
111
112
111
112
110
Z
Y
X 1100
133
134
133
134
NP
130
120h
120
113
114
113
114
110
Z
Y
X 110
111a
111b
111
111c
111d
112a
112b
112
112c
112d
113a
113b
113
113c
113d
114a
114b
114
114c
114d
Y
Z
X d1
d2
Pa'
Pb'
CSLA plane(130)
h
θ1
Sensing Plane(110)
C
Pa
Pb
VERTICAL DIRECTION
HORIZONTAL DIRECTION GL1
134
133
134
132
131
132
134
133
134
114
113
114
112
111
112
114
113
114
Z
Y
X

130
GL1
131
132
131
132
133
134
133
134
131
132
131
132
133
134
133
134
Y
Z
X

BL
133
134
133
131
132
131
133
134
133
113
114
113
111
112
111
113
114
113
Z
Y
X 130
131
132
131
132
133
134
133
134
131
132
131
132
BL
133
134
133
134
Y
Z
X

RL
132
131
132
134
133
134
132
131
132
112
111
112
114
113
114
112
111
112
Z
Y
X

130
RL
131
132
131
132
133
134
133
134
131
132
131
132
133
134
133
134
Y
Z
X

GL2
131
132
131
133
134
133
131
132
131
111
112
111
113
114
113
111
112
111
Z
Y
X

130
GL2
131
132
131
132
133
134
133
134
131
132
131
132
133
134
133
134
Y
Z
X

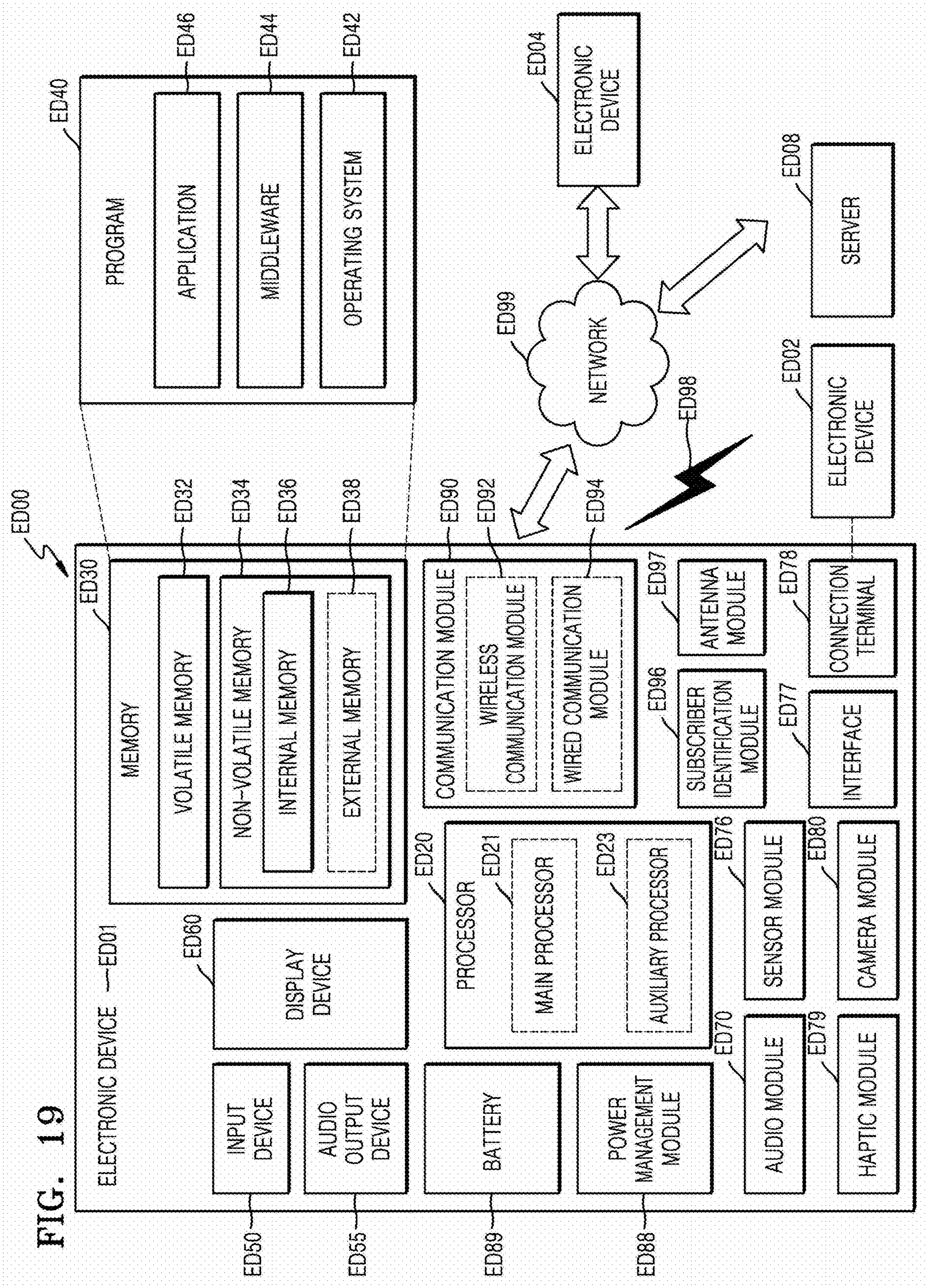

FIG. 19
ED00
ELECTRONIC DEVICE
ED01
MEMORY
ED30
VOLATILE MEMORY
ED32
NON-VOLATILE MEMORY
ED34
INTERNAL MEMORY
ED36
EXTERNAL MEMORY
ED38
PROGRAM
ED40
APPLICATION
ED46
MIDDLEWARE
ED44
OPERATING SYSTEM
ED42
INPUT DEVICE
ED50
AUDIO OUTPUT DEVICE
ED55
DISPLAY DEVICE
ED60
BATTERY
ED89
POWER MANAGEMENT MODULE
ED88
PROCESSOR
ED20
MAIN PROCESSOR
ED21
AUXILIARY PROCESSOR
ED23
COMMUNICATION MODULE
ED90
WIRELESS COMMUNICATION MODULE
ED92
WIRED COMMUNICATION MODULE
ED94
SUBSCRIBER IDENTIFICATION MODULE
ED96
ANTENNA MODULE
ED97
AUDIO MODULE
ED70
SENSOR MODULE
ED76
HAPTIC MODULE
ED79
CAMERA MODULE
ED80
INTERFACE
ED77
CONNECTION TERMINAL
ED78
NETWORK
ED99
ED98
ELECTRONIC DEVICE
ED04
ELECTRONIC DEVICE
ED02
SERVER
ED08

IMAGE SENSOR INCLUDING COLOR SEPARATING LENS ARRAY AND ELECTRONIC DEVICE INCLUDING THE IMAGE SENSOR

CROSS-REFERENCE TO RELATED APPLICATIONS

This application is based on and claims priority under 35 U.S.C. § 119 to Korean Patent Application Nos. 10-2021-0103467, filed on Aug. 5, 2021, in the Korean Intellectual Property Office, the disclosure of which is incorporated by reference herein in its entirety.

BACKGROUND

1. Field

The disclosure relates to an image sensor including a color separating lens array capable of separating incident light based on wavelength and collecting the separated light, and an electronic device including the image sensor.

2. Description of the Related Art

An image sensor generally senses a color of incident light by using a color filter. However, as the color filter absorbs light of all other colors except for light of one particular color, the light utilization efficiency of the color filter may be low. For example, when a RGB color filter is used, only one-third (⅓) of incident light is transmitted, and the other two-thirds (⅔) of the incident light is absorbed and wasted. Accordingly, the light utilization efficiency of the RGB color filter may be merely about 33%. Thus, most of optical loss occur at color filters in color display devices or color image sensors.

SUMMARY

Provided are an image sensor with improved light utilization efficiency due to use of a color separating lens array capable of separating incident light based on a wavelength and collecting the separated light, and an electronic device including the image sensor.

Additional aspects will be set forth in part in the description which follows and, in part, will be apparent from the description, or may be learned by practice of the presented example embodiments of the disclosure.

According to an aspect of the disclosure, there is provided an image sensor including: a sensor substrate including a plurality of first pixels configured to sense light of a first wavelength and a plurality of second pixels configured to sense light of a second wavelength different from the first wavelength, wherein the sensor substrate includes a two-dimensional array of unit pixels including the first pixels and the second pixels; and a color separating lens array configured to: concentrate the light of the first wavelength on each of the first pixels by changing a phase of the light of the first wavelength, and concentrate the light of the second wavelength on each of the second pixels by changing a phase of the light of the second wavelength, wherein at least one pixel of the unit pixel includes a plurality of light sensing cells arranged in at least one direction of a first direction and a second direction perpendicular to the first direction, and each of the plurality of light sensing cells configured to independently sense light by being electrically separated by a deep trench isolation (DTI) structure, and wherein the color separating lens array includes a plurality of nanoposts provided in a nanopost array without providing a nanopost at a first position which is spaced apart by h*tan(θ1) in a horizontal direction on the DTI structure between the plurality of light sensing cells, so that light is concentrated away from the DTI structure by the color separating lens array, where h is a distance between the color separating lens array and the sensor substrate, and θ1 is an angle formed by an area of the color separating lens array corresponding to a respective pixel of the sensor substrate in a vertical direction.

The plurality of light sensing cells include a first light sensing cell and a second light sensing cell arranged in the first direction, a third light sensing cell and a fourth light sensing cell arranged in the second direction with respect to the first light sensing cell and the second light sensing cell, wherein a first DTI structure is provided in the first direction between the first and second light sensing cells and the third and fourth light sensing cells, wherein a second DTI structure is provided in the second direction between the first and third light sensing cells and the second and fourth light sensing cells, and wherein the nanopost array does not include a nanopost at the first position in the horizontal direction, the first position being an intersection of the first DTI structure with the second DTI structure.

The nanopost array does not include a nanopost at the first position in the horizontal direction, the first position being at least one of the first DTI structure and the second DTI structure.

Each of the first sensing cells, the second sensing cells, the sensing cells and the fourth light sensing cells includes a photodiode or a plurality of photodiodes arranged in the first direction.

The nanopost array includes a deviated nanopost provided at a second position away from the first position in the horizontal direction on the intersection of the first DTI structure with the second DTI structure.

The nanopost array includes a plurality of grid points in an array structure, wherein one or more of the plurality of grid points includes a nanopost, among the plurality of nanoposts, and wherein the grid points of the array structure are not provided at the first position in the horizontal direction on the intersection of the DTI structures.

Each grid point, among the plurality of grid points of the array structure grid points includes nanopost.

An additional displacement is applied to a nanopost close to the first position in the horizontal direction on the intersection of the first DTI structure with the second DTI structure in a direction proceeding away from the first position with respect to the array structure grid point.

The array structure grid point has an array structure of 7×7, 8×8, 11×11, or 12×12 with respect to the unit pixel of the sensor substrate, and wherein the one or more of the plurality of grid points includes a nanopost, among the plurality of nanoposts or each grid point, among the plurality of grid points of the array structure grid points includes nanopost.

The plurality of light sensing cells include a first light sensing cell and a second light sensing cell arranged in the first direction, and the nanopost array is provided so that a nanopost is not provided at the first position in the horizontal direction on the DTI structure between the first light sensing cell and the second light sensing cell.

Each of the first and second light sensing cells includes a photodiode or a plurality of photodiodes arranged in the first direction.

The nanopost array includes a plurality of grid points in an array structure, wherein one or more of the plurality of grid points includes a nanopost, among the plurality of nanoposts, and wherein the array structure grid points are not provided at the first position in the horizontal direction on the DTI structure.

The one or more of the plurality of grid points includes a nanopost, among the plurality of nanoposts or each grid point, among the plurality of grid points of the array structure grid points includes nanopost.

The array structure grid point has an array structure of 7×7, 8×8, 11×11, or 12×12 with respect to the unit pixel of the sensor substrate, and wherein the one or more of the plurality of grid points includes a nanopost, among the plurality of nanoposts or each grid point, among the plurality of grid points of the array structure grid points includes nanopost.

According to another aspect of the disclosure, there is provided an electronic device including: an image sensor configured to convert an optical image into an electrical signal; a processor configured to control operations of the image sensor and store and output a signal generated by the image sensor; and a lens assembly configured to provide light from a subject to the image sensor, wherein the image sensor includes: a sensor substrate including a plurality of first pixels configured to sense light of a first wavelength and a plurality of second pixels configured to sense light of a second wavelength different from the first wavelength, wherein the sensor substrate includes a two-dimensional array of unit pixels including the first pixels and the second pixels; and a color separating lens array configured to: concentrate the light of the first wavelength on each of the first pixels by changing a phase of the light of the first wavelength, and concentrate the light of the second wavelength on each of the second pixels by changing a phase of the light of the second wavelength, wherein at least one pixel of the unit pixel includes a plurality of light sensing cells arranged in at least one direction of a first direction and a second direction perpendicular to the first direction and each of the plurality of light sensing cells configured to independently sense light by being electrically separated by a deep trench isolation (DTI) structure, wherein the color separating lens array includes a plurality of nanoposts provided in a nanopost array without providing a nanopost at a first position which is spaced apart by h*tan(θ1) in a horizontal direction on the DTI structure between the plurality of light sensing cells, so that light is concentrated at a second position away from the DTI structure by the color separating lens array, where h is a distance between the color separating lens array and the sensor substrate, and θ1 is an angle formed by an area of the color separating lens array corresponding to a respective pixel of the sensor substrate in a vertical direction, and wherein the processor is configured to generate an automatic focus signal based on a difference between light sensing signals of the plurality of light sensing cells.

The plurality of light sensing cells include a first light sensing cell and a second light sensing cell arranged in the first direction, a third light sensing cell and a fourth light sensing cell arranged in the second direction with respect to the first light sensing cell and the second light sensing cell, wherein a first DTI structure is provided in the first direction between the first and second light sensing cells and the third and fourth light sensing cells, wherein a second DTI structure is provided in the second direction between the first and third light sensing cells and the second and fourth light sensing cells, wherein the nanopost array does not include a nanopost at the first position in the horizontal direction, the first position being an intersection of the first DTI structure with the second DTI structure, and wherein the processor is further configured to generate an automatic focus signal based on a difference between a light sensing signal of the first and third light sensing cells and a light sensing signal of the second and fourth light sensing cells.

Each of the first sensing cells, the second sensing cells, the sensing cells and the fourth light sensing cells includes a photodiode or a plurality of photodiodes arranged in the first direction.

The plurality of light sensing cells include a first light sensing cell and a second light sensing cell arranged in the first direction, and the nanopost array is provided so that a nanopost is not provided at the first position on the first DTI structure between the first light sensing cell and the second light sensing cell, and wherein the processor is configured to generate an automatic focus signal based on a difference between a light sensing signal of the first light sensing cell and a light sensing signal of the second light sensing cell.

Each of the first and second light sensing cells includes a photodiode or a plurality of photodiodes arranged in the first direction.

The nanopost array includes a plurality of grid points in an array structure, wherein one or more of the plurality of grid points includes a nanopost, among the plurality of nanoposts, wherein the array structure grid points are not provided at the first position on the first DTI structure, wherein the array structure grid point includes an array structure of 7×7, 8×8, 11×11, or 12×12 with respect to the unit pixel of the sensor substrate, and wherein a nanopost is provided in some or every array structure grid points.

According to another aspect of the disclosure, there is provided an image sensor including: a sensor substrate including a plurality of pixels configured to sense light based on a wavelength; and a color separating lens array configured to direct the light on to the plurality of pixels based on the wavelength, wherein at least one pixel, among the plurality of pixels, includes a plurality of light sensing cells arranged in a first direction and a second direction perpendicular to the first direction and each of the plurality of light sensing cells configured to independently sense light by being electrically separated by a deep trench isolation (DTI) structure, and wherein the color separating lens array includes a plurality of nanoposts spaced apart from each other without having a nanopost provided at a position corresponding to the DTI structure so that light is directed away from the DTI structure by the color separating lens array.

The plurality of nanoposts are formed into a nanopost array without providing a nanopost at a first positon being spaced apart by h*tan(θ1) in a horizontal direction on the DTI structure between the plurality of light sensing cells, and where h is a distance between the color separating lens array and the sensor substrate, and θ1 is an angle formed by an area of the color separating lens array corresponding to a respective pixel of the sensor substrate in a vertical direction.

The nanopost array includes a plurality of grid points in an array structure, wherein one or more of the plurality of grid points includes a nanopost, among the plurality of nanoposts, and wherein the array structure grid points are not provided at the first position.

The plurality of light sensing cells include a first light sensing cell and a second light sensing cell arranged in the first direction, a third light sensing cell and a fourth light sensing cell arranged in the second direction with respect to the first light sensing cell and the second light sensing cell, wherein a first DTI structure is provided in the first direction between the first and second light sensing cells and the third and fourth light sensing cells, wherein a second DTI structure is provided in the second direction between the first and third light sensing cells and the second and fourth light sensing cells, and wherein the nanopost array does not include a nanopost at the first position in the horizontal direction, the first position being any of: a position on the first DTI structure; a position on the first DTI structure; a position at an intersection of the first DTI structure with the second DTI structure.

The nanopost array includes a deviated nanopost provided at a second position away from the first position in the horizontal direction on the intersection of the first DTI structure with the second DTI structure.

BRIEF DESCRIPTION OF THE DRAWINGS

The above and other aspects, features, and advantages of certain example embodiments of the disclosure will be more apparent from the following description taken in conjunction with the accompanying drawings, in which:

FIGS. 2A, 2B, and 2C are diagrams of various arrangements of a pixel array of an image sensor;

FIG. 19 is a block diagram of an electronic device including an image sensor according to an example embodiment;

DETAILED DESCRIPTION

Figure 1:
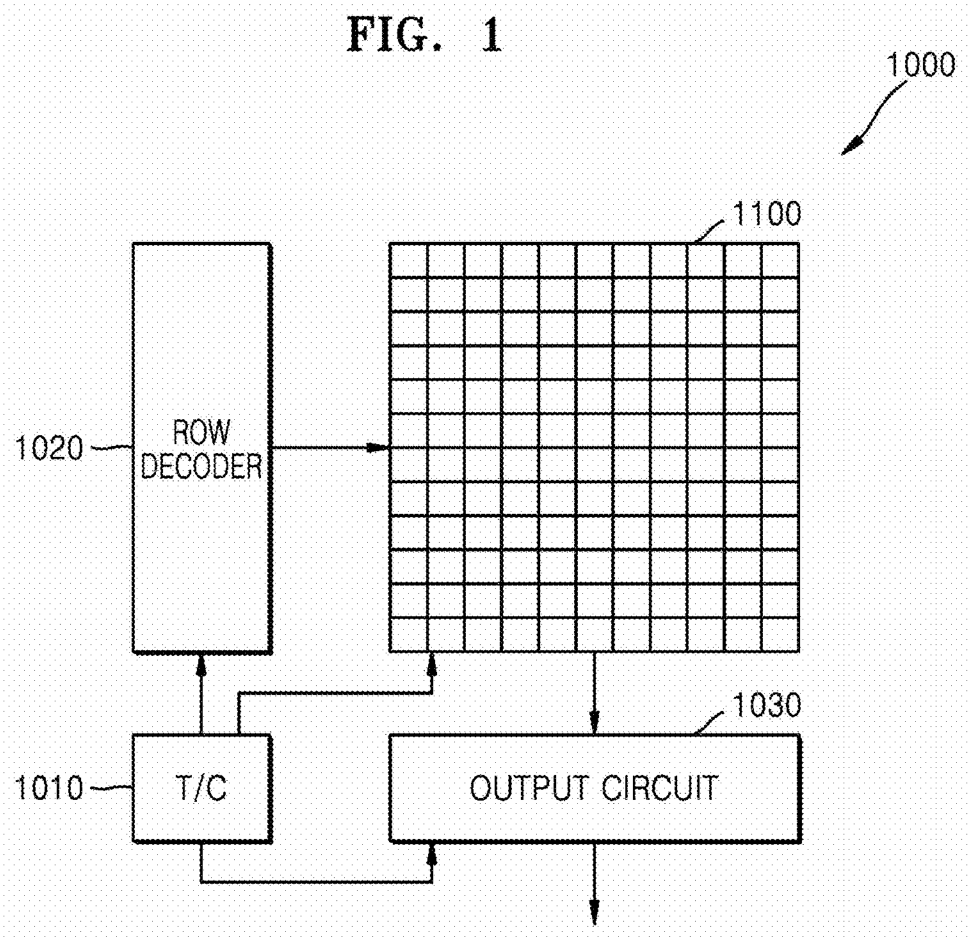
FIG. 1 is a schematic block diagram of an image sensor according to an example embodiment.

Reference will now be made in detail to example embodiments, examples of which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, example embodiments are described in detail with reference to the accompanying drawings. In the following drawings, like reference numerals refer to like elements, and the size of each element illustrated in the drawings may be exaggerated for convenience of explanation and clarity. Meanwhile, example embodiments described below are provided merely as an example, and various modifications may be made from the example embodiments.

When an element is arranged "above" or "on" another element, the element may not only be directly contacting the upper/lower/left/right sides of the other element, but also be above/under/on the left of/on the right of the other element in a non-contact manner. As used herein, the singular forms "a," "an" and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components unless otherwise indicated.

The use of the terms "a" and "an" and "the" and similar referents in the context of describing the disclosure are to be construed to cover both the singular and the plural. Also, the steps of all methods described herein can be performed in any suitable order unless otherwise indicated herein or otherwise clearly contradicted by context. The disclosure is not limited to the described order of the steps.

Furthermore, terms such as "portion," "unit," "module," etc. stated in the specification may signify a unit to process at least one function or operation and the unit may be embodied by hardware, software, or a combination of hardware and software.

Furthermore, the connecting lines, or connectors shown in the drawings are intended to represent functional relationships and/or physical or logical couplings between the various elements. It should be noted that many alternative or additional functional relationships, physical connections or logical connections may be present in a practical device.

The use of any and all examples, or language (e.g., "such as") provided herein, is intended merely to better illuminate the disclosure and does not pose a limitation on the scope of the disclosure unless otherwise claimed.

FIG. 1 is a schematic block diagram of an image sensor 1000 according to an example embodiment.

With reference to FIG. 1, the image sensor 1000 may include a pixel array 1100, a timing controller (T/C) 1010, a row decoder 1020, and an output circuit 1030. The image sensor 1000 may be a charge coupled device (CCD) image sensor or a complementary metal oxide semiconductor (CMOS) image sensor.

The pixel array 1100 may include pixels arranged in a two-dimensional manner along a plurality of rows and columns. The row decoder 1020 may select one of the rows of the pixel array 1100 in response to a row address signal output from the timing controller 1010. The output circuit 1030 may output a light sensing signal by column from a plurality of pixels arranged along the selected row. To this end, the output circuit 1030 may include a column decoder and an analog-to-digital converter (ADC). For example, the output circuit 1030 may include a plurality of ADCs respectively arranged between the column decoder and the pixel array 1100 for each column, or an ADC arranged at an output terminal of the column decoder. The timing controller 1010, the row decoder 1020, and the output circuit 1030 may be implemented in a single chip or separate chips. A processor for processing an image signal output through the output circuit 1030 may be implemented in a single chip together with the timing controller 1010, the row decoder 1020, and the output circuit 1030.

The pixel array 1100 may include a plurality of pixels configured to sense light of different wavelengths. The arrangement of the pixels may be implemented in various ways. For example, FIGS. 2A, 2B and 2C illustrate various arrangements of the pixel array 1100 of the image sensor 1000.

Figure 2A:
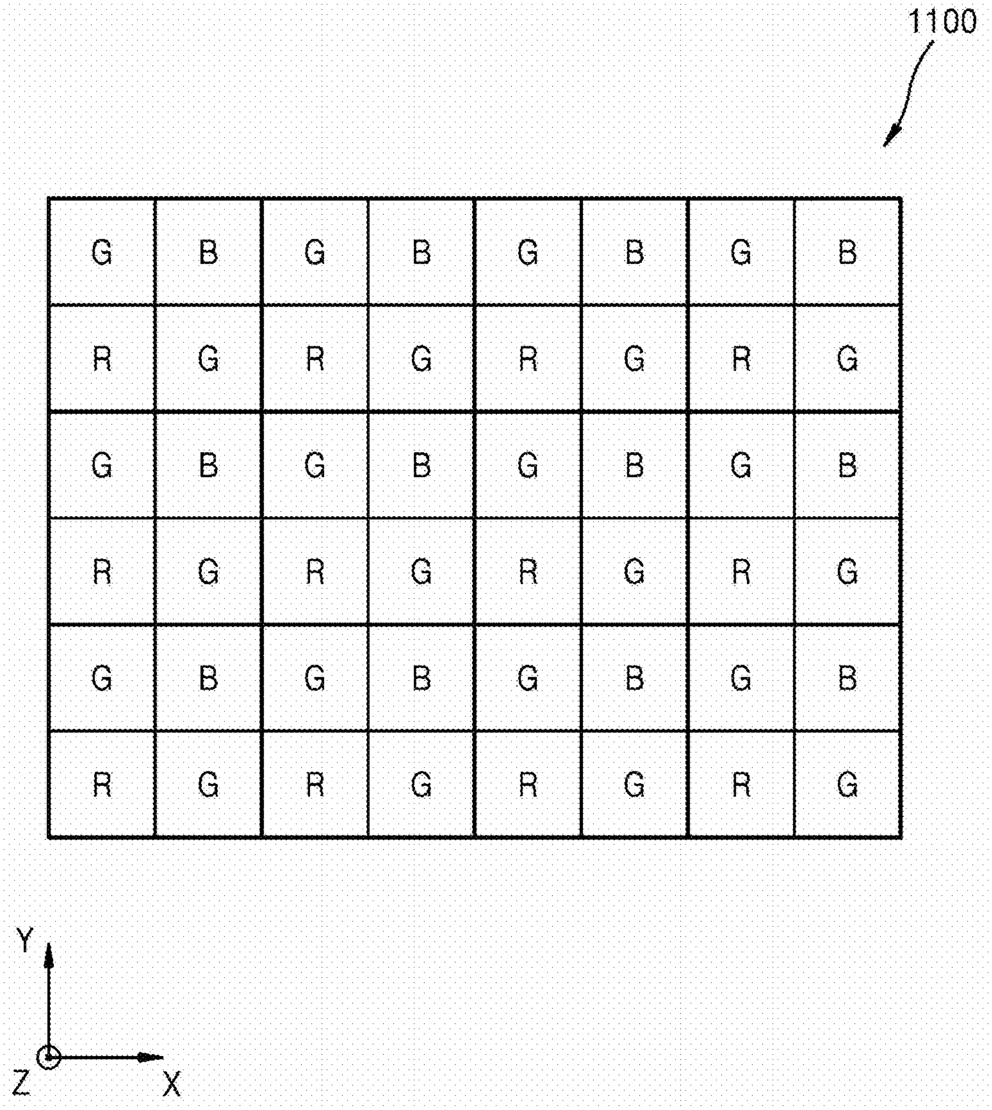
Figure 2C:
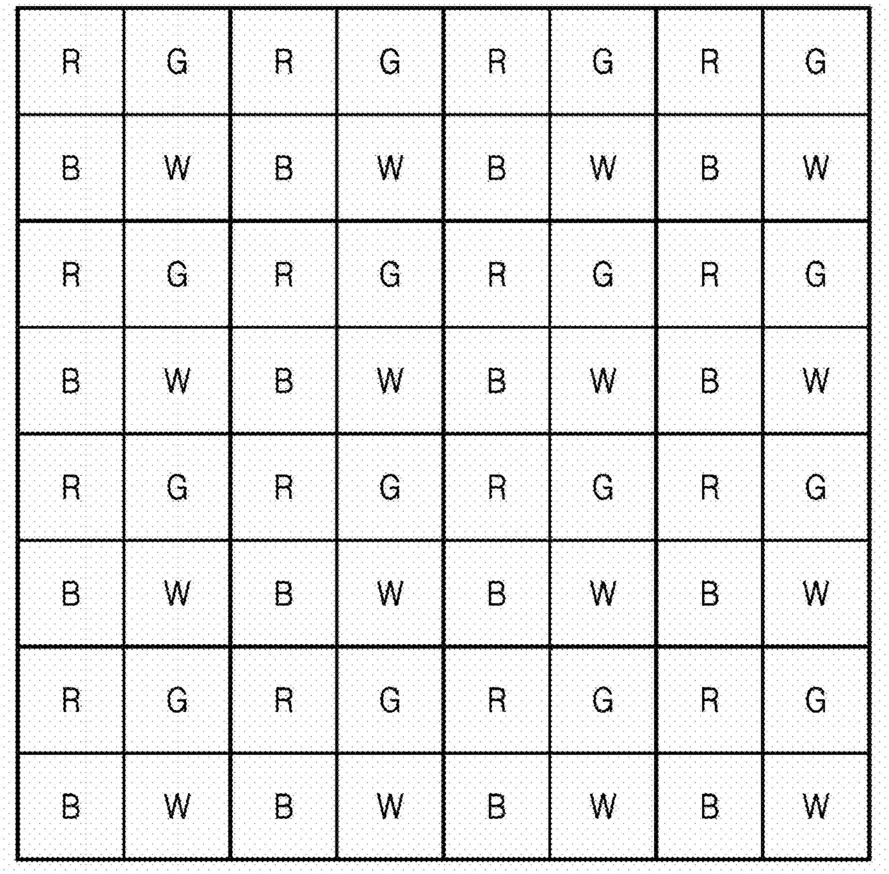

According to an example embodiment, FIG. 2A illustrates an example in which the pixel array 1100 of the image sensor 1000 includes a Bayer pattern. With reference to FIG. 2A, one unit pixel may include four quadrant regions, and the first to fourth quadrants may be a blue pixel B, a green pixel G, a red pixel R, and a green pixel G. Such unit pixel may be repeatedly arranged in a two-dimensional (2D) manner in a first direction (X direction) and a second direction (Y direction). In other words, in a unit pixel of 2×2 array, two green pixels G may be arranged in one diagonal direction, and one blue pixel B and one red pixel R may be arranged in another diagonal direction. As for the overall pixel arrangement, a first row in which a plurality of green pixels G and a plurality of blue pixels B are alternately arranged in the first direction, and a second row in which a plurality of red pixels R and a plurality of green pixels G are alternately arranged in the first direction may be repeatedly arranged in the second direction.

However, the arrangement of the pixel array 1100 is not limited to the Bayer pattern, and various arrangements other than the Bayer pattern may be employed according to other example embodiments. For example, according to another example embodiment, as illustrated in FIG. 2B, the pixel array 1100 may be arranged in a CYGM manner in which a magenta pixel M, a cyan pixel C, a yellow pixel Y, and a green pixel G constitute a unit pixel. Further, according to another example embodiment, as illustrated in FIG. 2C, it also may be arranged in a RGBW manner in which a green pixel G, a red pixel R, a blue pixel B, and a white pixel W constitute a unit pixel. According to another example embodiment, a unit pixel may have a 3×2 array form. In addition, the pixels of the pixel array 1100 may be arranged in various ways according to color characteristics of the image sensor 1000. Hereinafter, for the sake of convenience, example embodiments are described by taking an example in which the pixel array 1100 of the image sensor 1000 has a Bayer pattern; however, the principles of the example embodiments described below may also be applied to a pixel array other than the Bayer pattern.

The pixel array 1100 of the image sensor 1000 may include a color separating lens array configured to collect light of a certain color corresponding to a certain pixel.

Figure 3A:
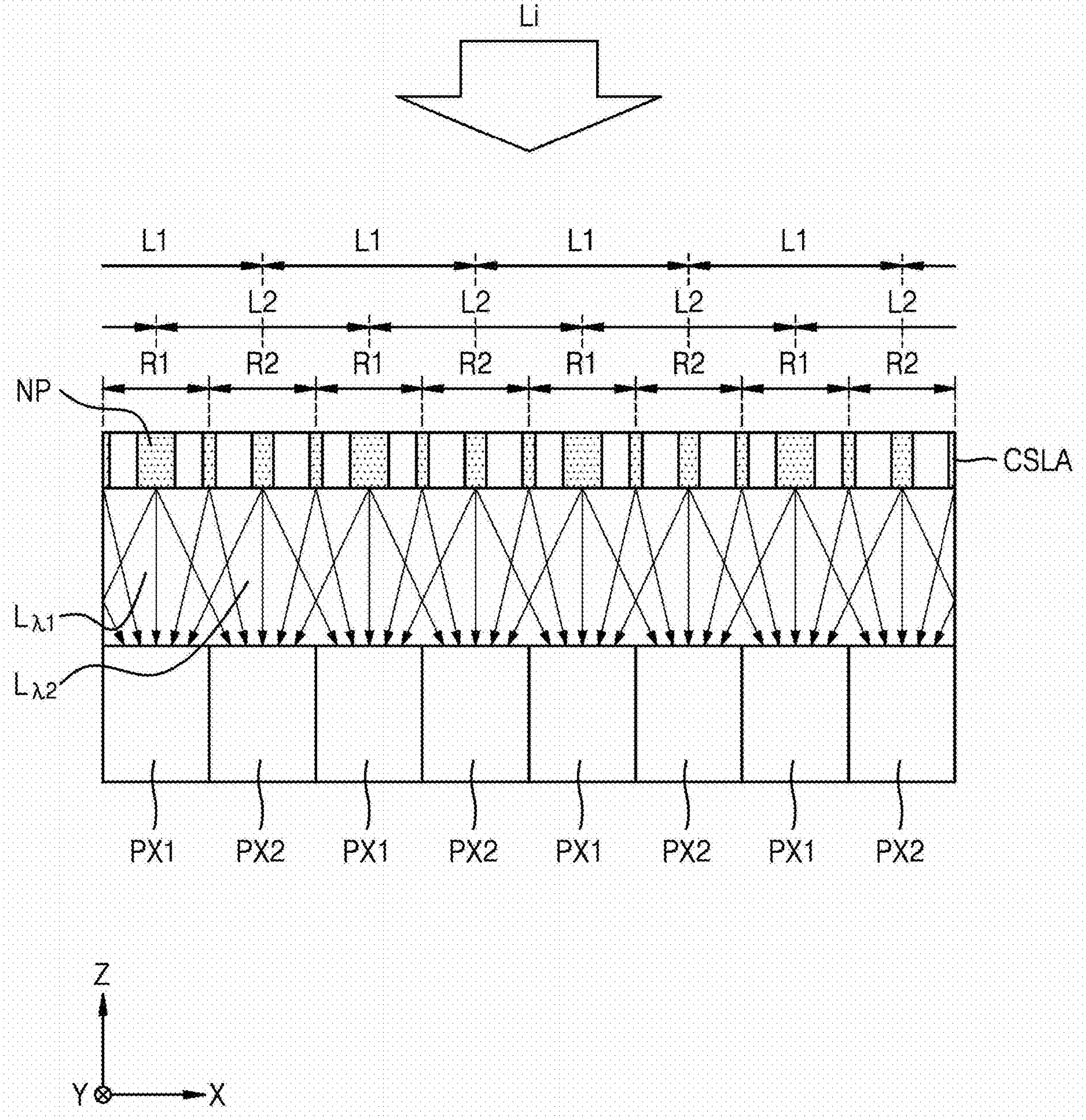
FIGS. 3A and 3B are conceptual diagrams illustrating a structure and operation of a color separating lens array.
Figure 3B:
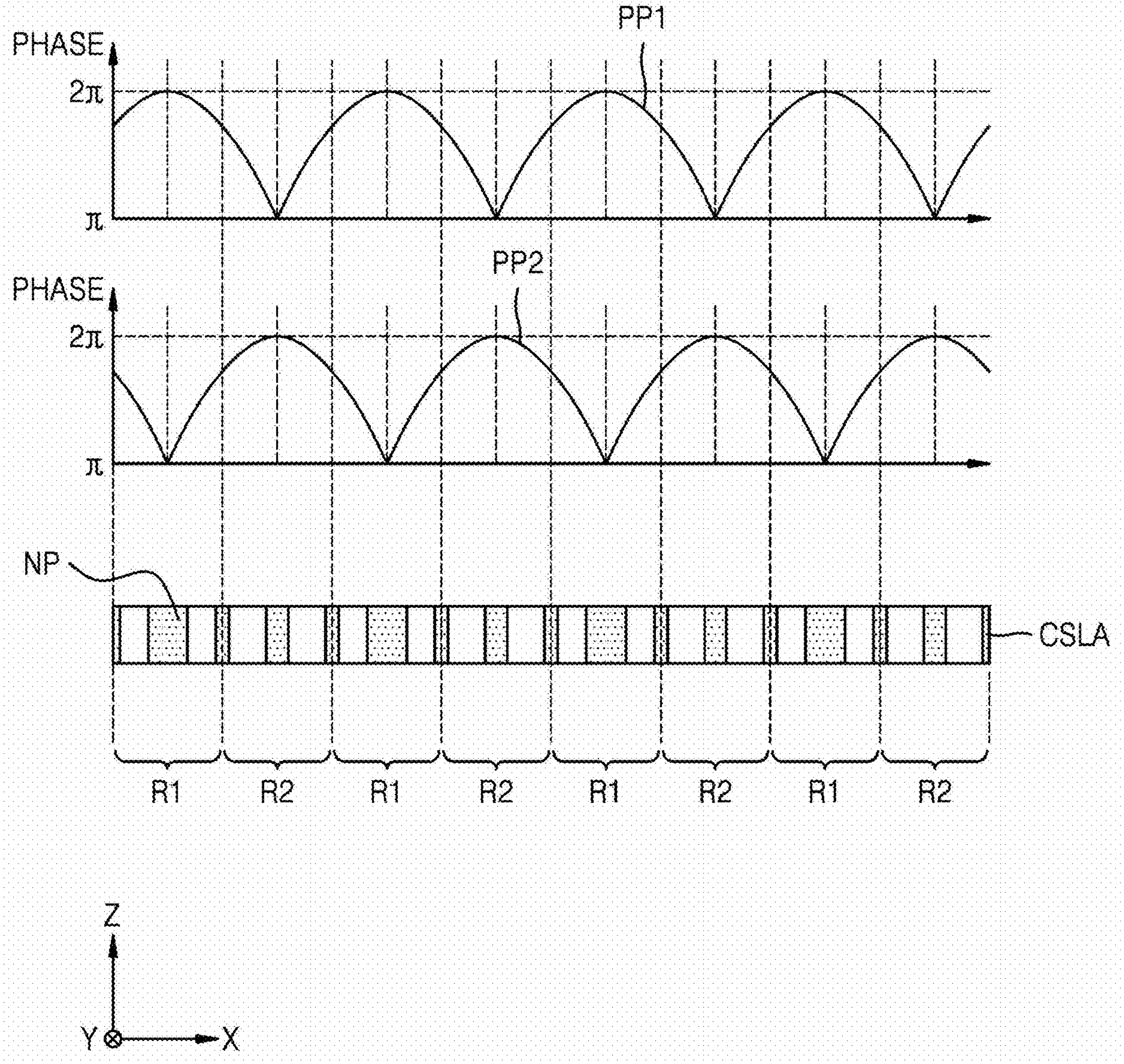

FIGS. 3A and 3B are conceptual diagrams of a structure and operation of a color separating lens array CSLA.

With reference to FIG. 3A, the color separating lens array CSLA may include a plurality of nanoposts NP which change the phase of the incident light Li differently according to a wavelength. The color separating lens array CSLA may be partitioned in various ways. For example, the color separating lens array CSLA may be partitioned into a first pixel-corresponding area R1 corresponding to a first pixel PX1, on which light of a first wavelength $L_{\lambda 1}$ included in the incident light Li is collected, and a second pixel-corresponding area R2 corresponding to a second pixel PX2, on which light of a second wavelength $L_{\lambda 2}$ included in the incident light Li is collected. The first and second pixel-corresponding areas R1 and R2 may respectively include one or more nanoposts NP, and be arranged to face the first pixel PX1 and the second pixel PX2, respectively. For another example, the color separating lens array CSLA may be divided into a first-wavelength light concentration area L1 collecting light of the first wavelength $L_{\lambda 1}$ on the first pixel PX1, and a second-wavelength light concentration area L2 collecting light of the second wavelength $L_{\lambda 2}$ on the second pixel P2. The first-wavelength light concentration area L1 and the second-wavelength light concentration area L2 may partially overlap.

The color separating lens array CSLA may concentrate the first-wavelength light $L_{\lambda 1}$ on the first pixel PX1 and the second-wavelength light $L_{\lambda 2}$ on the second pixel P2 by forming different phase profiles with respect to the first-wavelength light $L_{\lambda 1}$ and the second-wavelength light $L_{\lambda 2}$.

For example, with reference to FIG. 3B, at a position right after light passes through the color separating lens array CSLA, i.e., at a position of the bottom surface of the color separating lens array CSLA, the first-wavelength light $L_{\lambda 1}$ may have a first phase profile PP1, and the second-wavelength light $L_{\lambda 2}$ may have a second phase profile PP2, which allows the first-wavelength light $L_{\lambda 1}$ and the second-wavelength light $L_{\lambda 2}$ to be collected on the corresponding first and second pixels PX1 and PX2, respectively, by the color separating lens array CSLA. Specifically, light of the first wavelength $L_{\lambda 1}$ passed through the color separating lens array CSLA may have the first phase profile PP1 which is maximized at a certain portion of the first pixel-corresponding area R1, and is reduced in a direction proceeding away from the certain portion of the first pixel-corresponding area R1, i.e., in a direction to the second pixel-corresponding area R2. Such phase profile may be similar to a phase profile of light converging through a lens, and the first-wavelength light $L_{\lambda 1}$ may be focused on the first pixel PX1. Further, light of the second-wavelength $L_{\lambda 2}$ passed through the color separating lens array CSLA may have the second phase profile PP2 which is maximized at a certain portion of the second pixel-corresponding area R2, and be reduced in a direction proceeding away from certain portion of the second pixel-corresponding area R2, i.e., in a direction of the first pixel-corresponding area R1, which allows light of the second wavelength $L_{\lambda 2}$ to be focused on the second pixel PX2. According to an example embodiment, FIG. 3B illustrates that the first phase profile PP1 of light of the first wavelength $L_{\lambda 1}$ and the second phase profile PP2 of light of the second wavelength $L_{\lambda 2}$ passed through the color separating lens array CSLA have a peak of simple shape which becomes greatest at the center of the first pixel-corresponding area R1 and the second pixel-corresponding area R2; however, the first phase profile PP1 and the second phase profile PP2 are not limited thereto. For example, according to other example embodiments, the nanoposts NP of the color separating lens array CSLA may be arranged according to a certain rule so that the peaks of the first phase profile PP1 and the second phase profile PP2 may have a complex phase profile having a plurality of peaks. Here, the rule may be applied to parameters of the nanopost NP, such as a shape, size (width, height), interval, arrangement, etc., and such parameters may be determined according to a phase profile to be implemented through the color separating lens array CSLA.

As a refractive index of material may be different depending on a wavelength of reacting light, as illustrated in FIG. 3B, the color separating lens array CSLA may provide different phase profiles for the first-wavelength light $L_{\lambda 1}$ and the second-wavelength light $L_{\lambda 2}$. In other words, even for the same material, a refractive index is different on a wavelength of light reacting to the material, and the phase delay experienced by the light passed through the material may be different for wavelength, so different phase profiles may be formed for each wavelength. For example, as a refractive index of the first-wavelength light $L_{\lambda 1}$ of the first pixel-corresponding area R1 may be different from a refractive index of the second-wavelength light $L_{\lambda 2}$ of the first pixel-corresponding area R1, and a phase delay experienced by the first-wavelength light $L_{\lambda 1}$ passed through the first pixel-corresponding area R1 may be different from a phase delay experienced by the second-wavelength light $L_{\lambda 2}$ passed through the first pixel-corresponding area R1, when the color separating lens array CSLA is designed in consideration of such characteristics of light, it may provide different phase profiles for the first-wavelength light $L_{\lambda 1}$ and the second-wavelength light $L_{\lambda 2}$.

The color separating lens array CSLA may include nanoposts NP arranged according to a certain rule so that the first-wavelength light $L_{\lambda 1}$ and the second-wavelength light $L_{\lambda 2}$ have the first phase profile PP1 and the second phase profile PP2, respectively. Here, the rule may be applied to parameters of the nanopost NP, such as a shape, size (width, height), interval, arrangement, etc., and such parameters may be determined according to a phase profile to be implemented through the color separating lens array CSLA.

A rule applied to arrangement of nanopost NP in the first pixel-corresponding area R1 and a rule applied to arrangement of nanopost NP in the second pixel-corresponding area R2 may be different. In other words, a size, shape, interval and/or arrangement of the nanopost NP provided in the first pixel-corresponding area R1 may be different than those of the nanopost NP provided in the second pixel-corresponding area R2.

The diameter of cross-section of the nanopost NP may have a dimension of a subwavelength. Here, the subwavelength may refer to a wavelength smaller than a wavelength band of light subject to separation. The nanopost NP, for example, may have a smaller dimension than whichever shorter wavelength from the first wavelength and the second wavelength. When the incident light Li is visible light, the diameter of the cross-section of the nanopost NP may have a dimension smaller than, for example, 400 nm, 300 nm, or 200 nm. Meanwhile, the height of the nanopost NP may be 500 nm to 1500 nm, and may be greater than the diameter of the cross-section. According to an example embodiment, the nanopost NP may be two or more vertically (Z direction) stacked posts combined together.

The nanopost NP may include material having a higher refractive index than peripheral material. For example, the nanopost NP may include c-Si, p-Si, a-Si and Ill-V compound semiconductors (GaP, GaN, GaAs, etc.), SiC, $TiO_2$, SiN, and/or combinations thereof. The nanopost NP having a different refractive index from peripheral material may change a phase of light passing the nanopost NP. This is due to a phase delay caused by the shape dimension of a subwavelength of the nanopost NP, and the degree of phase delay may be determined by detailed shape dimensions, arrangement, etc. of the nanopost NP. The peripheral material of the nanopost NP may include a dielectric material having a lower refractive index than the nanopost NP. For example, the peripheral material may include $SiO_2$ or air.

The first wavelength λ1 and the second wavelength λ2 may be a wavelength band of infrared light and visible light, however, the disclosure is not limited thereto, and the first and second wavelengths λ1 and λ2 may operate in various wavelengths according to arrangement rules of the nanopost NP. In addition, although an example in which incident light is separated by two wavelengths for concentration is illustrated, according to another example embodiment, the incident light may be separated in three or more directions according to a wavelength for concentration.

Also, even though some example embodiments describe that the color separating lens array CSLA is a single layer structure, the color separating lens array CSLA may be a structure made of a plurality of layers stacked together. For example, the color separating lens array CSLA may be design to allow a first layer to concentrate visible light on a particular pixel, and a second layer to concentrate infrared light on another pixel.

Hereinafter, the pixel array 1100 of the image sensor 1000 employing the color separating lens array CSLA is described in more detail.

Figure 4A:
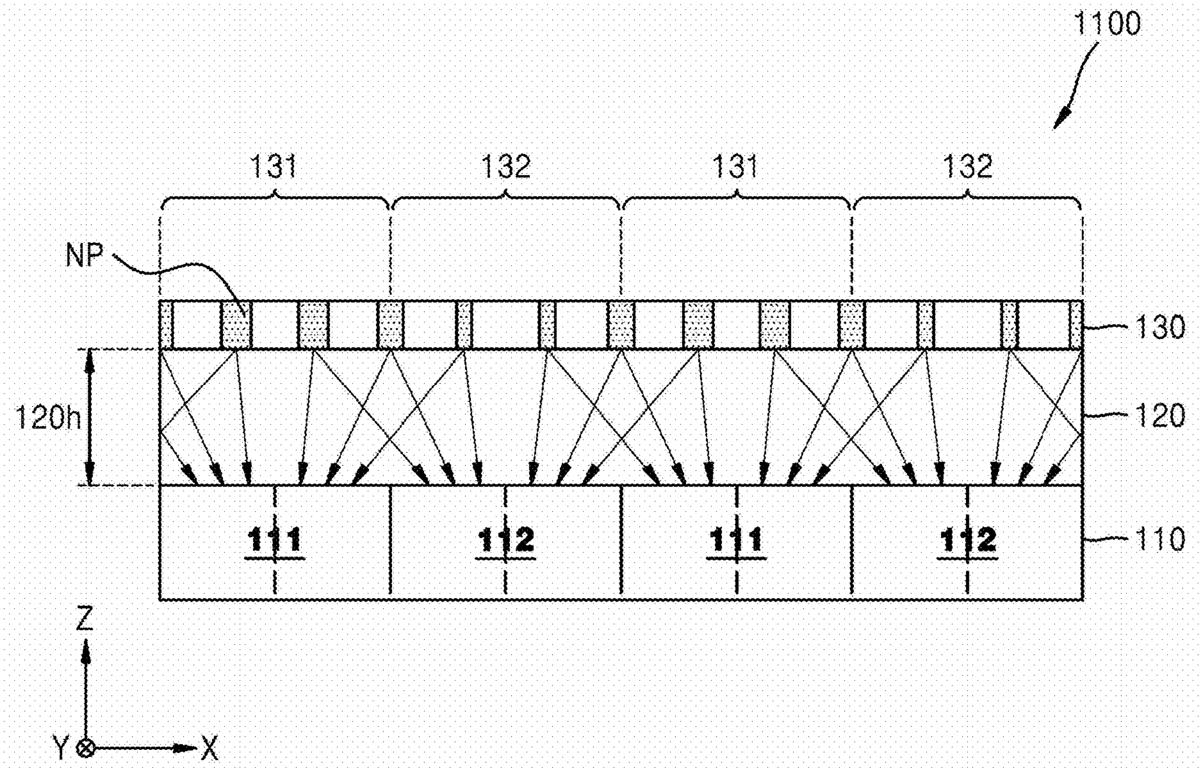
FIGS. 4A and 4B are schematic cross-sectional views of different cross-sections of a pixel array of an image sensor according to one example embodiment.
Figure 4B:
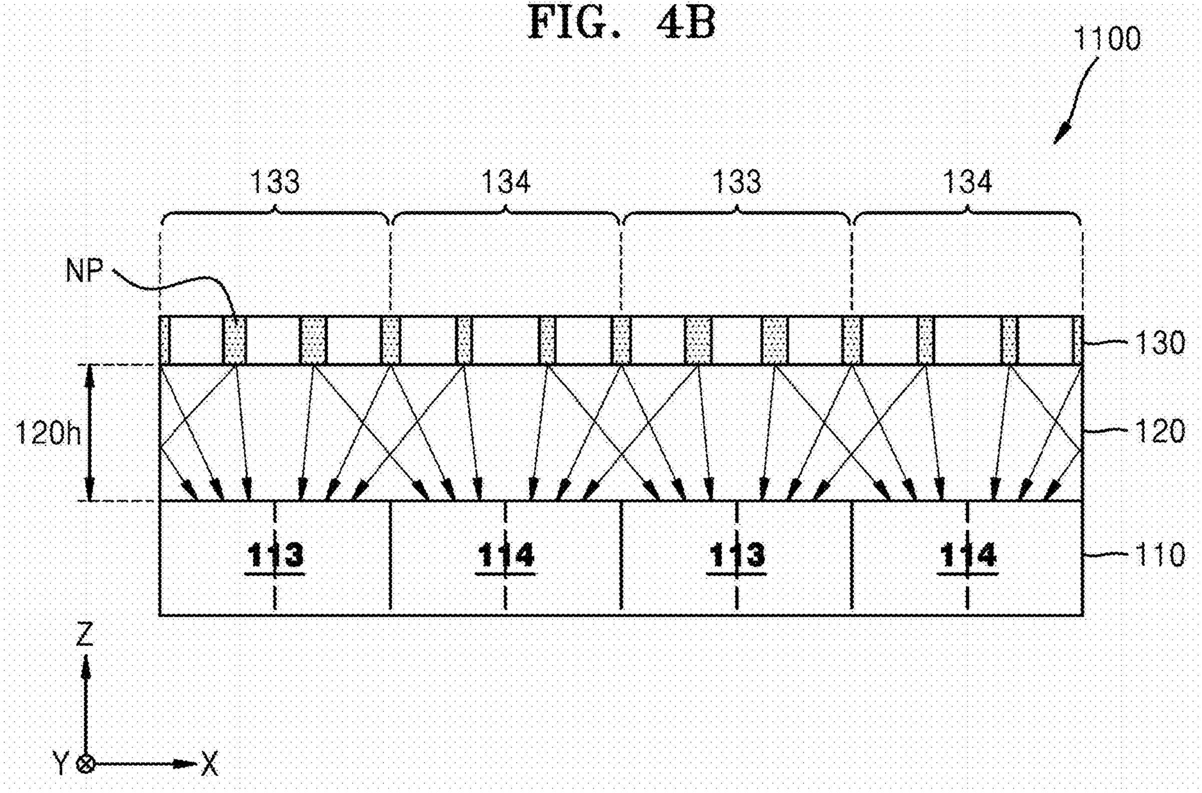

FIGS. 4A and 4B are schematic cross-sectional views of different cross-sections of the pixel array 1100 of the image sensor 1000 according to one example embodiment.

With reference to FIGS. 4A and 4B, the pixel array 1100 of the image sensor 1000 may include a sensor substrate 110 including a plurality of pixels 111, 112, 113, and 114 for sensing light, a transparent spacer layer 120 provided on the sensor substrate 110, and a color separating lens array 130 provided on the spacer layer 120.

The sensor substrate 110 may include a plurality of first pixels for sensing light of a first wavelength and a plurality of second pixels for sensing light of a second wavelength different from the first wavelength, and having a two-dimensional array of unit pixels including the first pixel and the second pixel. The sensor substrate 110 may include a repeating arrangement of the first pixels and the second pixels in the first direction, and a repeating arrangement of the first pixels and the second pixels in a second direction perpendicular to the first direction, and a unit pixel may include four pixels in 2×2 arrangement. Further, the color separating lens array 130 may change a phase of light of the first wavelength to concentrate the light of the first wavelength on each first pixel, and change a phase of light of the second wavelength to concentrate the light of the second wavelength on each second pixel.

For example, when the pixel array 1100 of the image sensor 1000 of FIGS. 4A and 4B includes a pixel array having a Bayer pattern as shown in FIG. 2A, the sensor substrate 110 may include a first green pixel 111, a blue pixel 112, a red pixel 113, and a second green pixel 114 converting received light into an electrical signal. As shown in FIG. 4A, the first green pixel 111 and the blue pixel 112 may be alternately arranged in the first direction (X direction), and in cross-section of different position in Y direction, the red pixel 113 and the second green pixel 114 may be alternately arranged as shown in FIG. 4B.

Figure 5A:
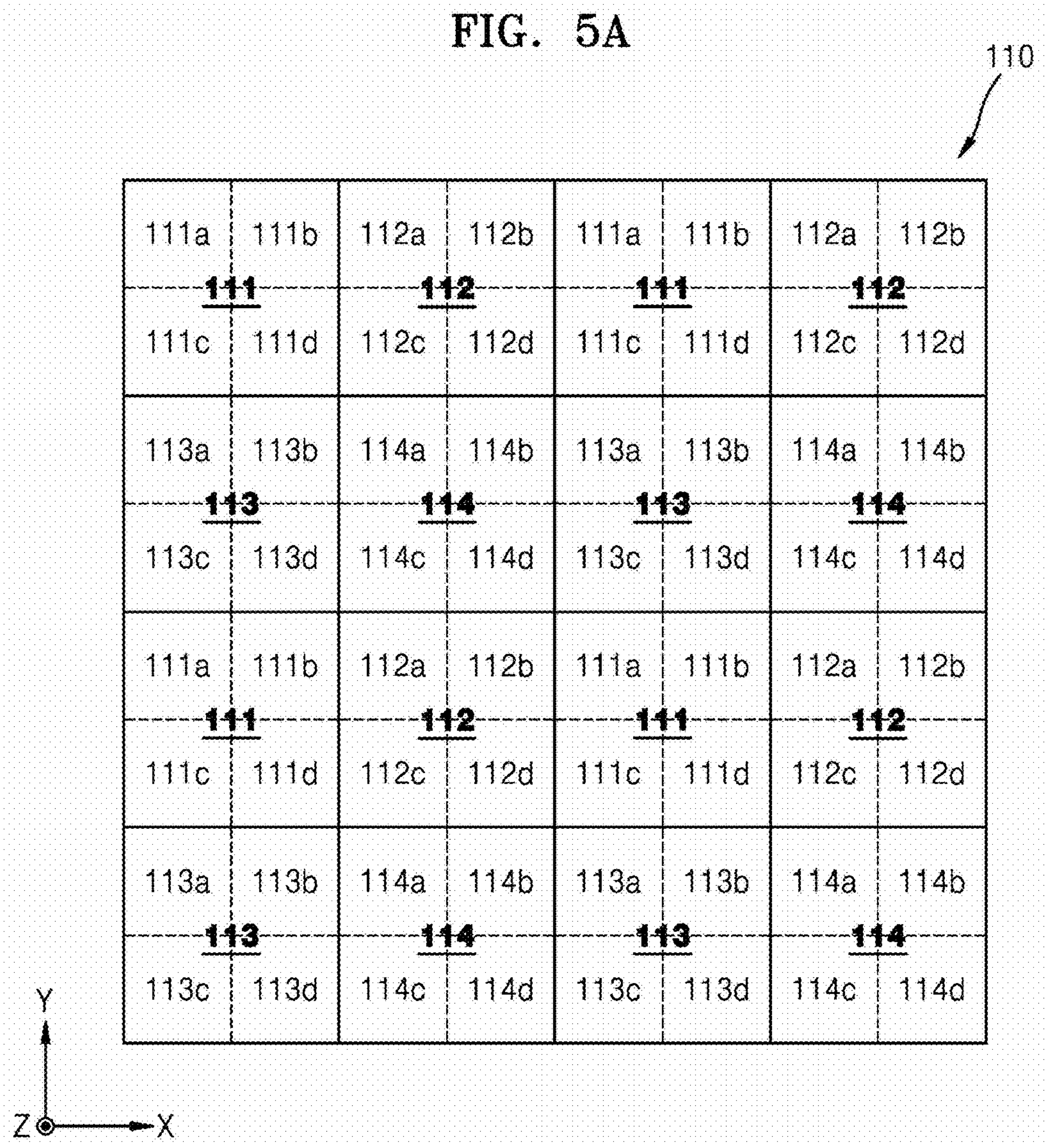
FIG. 5A is a planar view exemplarily illustrating an arrangement example of a pixel in a pixel array of an image sensor.

Meanwhile, at least one of the first green pixel 111, the blue pixel 112, the red pixel 113, and the second green pixel 114 of the unit pixel in the image sensor 1000 according to an example embodiment may include a plurality of light sensing cells, as exemplarily shown in FIG. 5A, so that the automatic focus function of a camera device including the image sensor 1000 may be implemented. The plurality of light sensing cells may be arranged in at least one direction of the first direction (X direction) and the second direction (Y direction) perpendicular to the first direction (X direction), and may be configured to independently sense light by being electrically separated by a DTI structure.

Figure 5B:
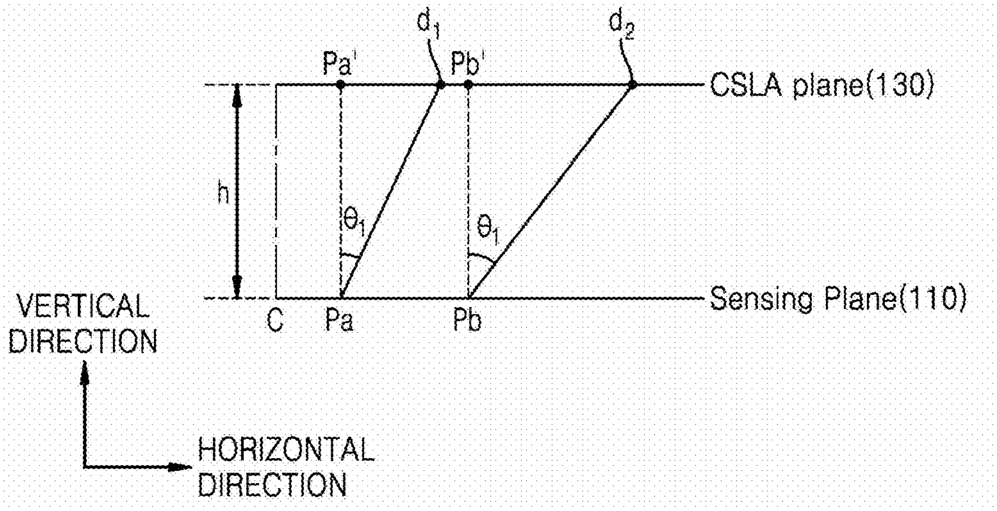
FIG. 5B is a diagram exemplarily illustrating the relationship between pixels on a sensing plane of a sensor substrate and corresponding positions of an area of a color separating lens array in an image sensor according to an example embodiment.

FIG. 5A is a planar view exemplarily illustrating an arrangement example of pixels in the pixel array 1100 of the image sensor 1000. FIG. 5A illustrates arrangement of pixels when the pixel array 1100 of the image sensor 1000 has the Bayer pattern as in FIG. 2A. FIG. 5B is a diagram exemplarily illustrating the relationship between pixels on a sensing plane of the sensor substrate 110 and corresponding positions of an area of the color separating lens array 130 in the image sensor 1000 according to an example embodiment. FIG. 5B exemplarily illustrates a case in which converged light is incident on the image sensor 1000, and when parallel light is incident on the image sensor 1000, areas d1 and d2 of the color separating lens array 130 respectively corresponding to pixels Pa and Pb of the sensor substrate 110 may be located in Pa' and Pb' on the pixels Pa and Pb.

With reference to FIG. 5A, in a Bayer pattern array, a unit pixel may include the first and second green pixels 111 and 114, the blue pixel 112, and the red pixel 113, and the pixel array 1100 may include a two-dimensional array in which the unit pixels are repeated. The first and second green pixels 111 and 114 may sense green light, the blue pixel 112 may sense blue light, and the red pixel 113 may sense red light.

Meanwhile, at least one of the first green pixel 111, the blue pixel 112, the red pixel 113, and the second green pixel 114 of the unit pixel may include a plurality of light sensing cells to implement the automatic focus function of the camera device including the image sensor 1000, as shown in FIG. 5A.

For example, with reference to FIG. 5A, all or some of the first green pixel 111, the blue pixel 112, the red pixel 113, and the second green pixel 114 may include a plurality of light sensing cells, and the plurality of light sensing cells included in one pixel may share a light concentration area of the color separating lens array 130. When a plurality of light sensing cells capable of independently sensing light are included in one pixel, the resolution of the image sensor 1000 may be improved, and by using a difference between signals obtained from each of the light sensing cells, the automatic focus function of the image sensor 1000 and/or a camera device including the image sensor 1000 may be implemented. In the example embodiment of FIG. 5A, the first green pixel 111, the blue pixel 112, the red pixel 113, and the second green pixel 114 respectively include four light sensing cells in 2×2 array. For example, the first green pixel 111 may include first to fourth green light sensing cells 111*a*, 111 *b*, 11*c*, and 11*d*, the blue pixel 112 may include first to fourth blue light sensing cells 112*a*, 112*b*, 112*c*, and 112*d*, the red pixel 113 may include first to fourth red light sensing cells 113*a*, 113*b*, 113*c*, and 113*d*, and the second green pixel 114 may include first to fourth green light sensing cells 114*a*, 114*b*, 114*c*, and 114*d*.

As such, when a plurality of light sensing cells are included in one pixel, the light sensing cells may be electrically separated by deep trench isolation (DTI) structure. Accordingly, as illustrated in FIG. 5A, when one pixel includes, for example, four light sensing cells, and the four light sensing cells have a 2×2 array, the DTI structures between the light sensing cells may intersect at the centers of each pixel as shown in dotted line in each pixel. Therefore, when the color separating lens array 130 forms a phase profile allowing light to be focused on the center of each pixel, significant amount of light may be irradiated on an intersection of the DTI structures between the light sensing cells, resulting in an optical loss. In a high resolution image sensor having a small pixel size, the optical loss caused by irradiating a significant amount of light on the intersections of the DTI structures may result in degradation of an automatic focus signal ratio when the automatic focus function is implemented by using a difference in signals obtained from the light sensing cells, and accordingly, the automatic focus adjusting performance may be weakened in an electronic device employing such image sensor.

According to the image sensor 1000 of an example embodiment, by forming the color separating lens array 130 to obtain a phase profile allowing light to be concentrated mainly at a position out of the DTI structure between the light sensing cells, the light efficiency as well as the automatic focus signal ratio may be improved. For example, referring to FIG. 5B, according to the image sensor 1000 of an example embodiment, the color separating lens array 130 may be provided to include a nanopost array allowing a nanopost not to be provided at a first position spaced apart by h*tan(θ1) in the horizontal direction on the DTI structure between the plurality of light sensing cells, thereby a phase profile allowing light to be focused mainly at a position out of the DTI structure between the light sensing cells may be obtained, and by such color separating lens array 130, the light may be concentrated at the position out of the DTI structure.

With reference to FIG. 5B, h represents a distance in the vertical direction between the color separating lens array 130 and the sensor substrate 110, θ1 indicates an angle formed by an area (e.g., d1, d2, etc.) of the color separating lens array 130 corresponding to a pixel (e.g., Pa, Pb, etc.) of the sensor substrate 110 in the vertical direction (Z direction). Here, h may correspond to a thickness of the spacer layer 120 in FIGS. 4A and 4B.

When an incident angle of light incident on the image sensor 1000 is $\theta_0$, θ61=arcsin(sin($\theta_0$)/n), and a pixel of the sensor substrate 110 and an area of the color separating lens array 130 corresponding thereto may be spaced apart from each other by h*tan(θ1) in the horizontal direction on the pixel. Here, n may represent a refractive index and h may represent a vertical thickness of a medium between the color separating lens array plane CSLA plane and a sensing plane of the sensor substrate 110, i.e., the spacer layer 120.

For example, when the image sensor 1000 according to an example embodiment is employed in an electronic device to convert an optical image into an electrical signal, light incident on the image sensor 1000 may be converged light. That is, by focusing light reflected from a subject by a lens, an optical image may be obtained in the image sensor 1000.

As such, when the converged light is incident on the image sensor 1000, chief ray may be vertically incident on a center c of the image sensor 1000, whereas the chief ray may be incident at an angle at a periphery of the image sensor 1000, and an angle (θ1) of the chief ray to the vertical direction of the sensing plane of the sensor substrate 110 may become increase toward the periphery of the image sensor 1000.

FIG. 5B illustrates an example in which focused light is incident on the image sensor 1000. When focused light is incident on the image sensor 1000, the areas d1 and d2 of the color separating lens array 130 respectively corresponding to the pixels Pa and Pb of the sensor substrate 110 may correspond to positions spaced apart from positions Pa' and Pb' of the color separating lens array plane CSLA plane on the pixels Pa and Pb by h*tan(θ1) in the horizontal direction. Here, when parallel light is incident on the image sensor 1000, the areas d1 and d2 of the color separating lens array 130 respectively corresponding to the pixels Pa and Pb of the sensor substrate 110 may be located at the positions Pa' and Pb' on the pixels Pa and Pb.

Accordingly, when parallel light is incident on the image sensor 1000, h*tan(θ1)=0, and thus, the first position spaced apart by h*tan(θ1) in the horizontal direction on the DTI structure may be on the DTI structure. When the focused light is incident on the image sensor 1000, h*tan(θ1)=0 at the center of the image sensor 1000, and as it deviates from the center, the value of the h*tan(θ1) may increase, the first position spaced apart by h*tan(θ1) in the horizontal direction on the DTI structure may be located on the DTI structure at the center of the image sensor 1000, and deviate from the DTI structure at a position off the center of the image sensor 1000. Thus, according to the image sensor 1000 of an example embodiment, as the color separating lens array 130 may be provided to include a nanopost array allowing a nanopost not to be arranged at the first position spaced apart by h*tan(θ1) in the horizontal direction on the DTI structure between the plurality of light sensing cells, thereby condensing light to a position outside the DTI structure, and the first position may vary depending on an incident angle of light incident on the image sensor 1000 and a degree of deviation from the center of the image sensor 1000.

As described above, according to the image sensor 1000 of an example embodiment, at least one of the first green pixel 111, the blue pixel 112, the red pixel 113, and the second green pixel 114 of the unit pixel may be provided to include a plurality of light sensing cells to implement the automatic focus function of the camera device including the image sensor 1000, as exemplarily shown in FIG. 5A, and the color separating lens array 130 may be formed to obtain a phase profile allowing light to be mainly collected at a position outside the DTI structure between the light sensing cells.

In FIG. 5A and an example embodiment of the color separating lens array 130 to be described below provided to be correspond thereto, an example of applying the tetracell technology in which the first green pixel 111, the blue pixel 112, the red pixel 113, and the second green pixel 114 have four light sensing cells is described; however, the example embodiment is not limited thereto.

For example, according to another example embodiment, the dual pixel technology of organizing two light sensing cells into one pixel or other technologies of organizing more than four light sensing cells into one pixel may be applied, and in this case, the color separating lens array 130 may be provide to obtain a phase profile allowing light to be collected mainly at a position outside the DTI structure between the light sensing cells in each pixel.

The principle of implementing the automatic focus function by using a difference in signals obtained from each light sensing cell when at least one pixel of the unit pixel includes a plurality of light sensing cells is described later.

Meanwhile, with reference to FIGS. 4A and 4B, the spacer layer 120 may be arranged between the sensor substrate 110 and the color separating lens array 130 to maintain a constant distance between the sensor substrate 110 and the color separating lens array 130. The spacer layer 120 may include material transparent in visible light, for example, a dielectric material having a lower refractive index than a nanopost NP and low absorption rate in visible light band, such as $SiO_2$, siloxane-based spin on glass, etc. The thickness 120*h* of the spacer layer 120 may be determined based on a focal distance of light focused by the color separating lens array 130, and may be, for example, about ½ of a focal distance of light of a reference wavelength $\lambda_0$ as described below. The focal distance f of the light of the reference wavelength $\lambda_0$ focused by the color separating lens array 130 may be represented by the following [Equation 1] where a refractive index of the spacer layer 120 for the reference wavelength $\lambda_0$ is n, and a pitch of a pixel is p:

$$f = \frac{np^2}{\lambda_0} - \frac{\lambda_0}{4n} \quad \text{[Equation 1]}$$

When the reference wavelength $\lambda_0$ is 540 nm, which is green light, the pitch of the first green pixel 111, the blue pixel 112, the red pixel 113, and the second green pixel 114 is 0.8 μm, and the refractive index n of the spacer layer 120 in wavelength of 540 nm is 1.46, the focal distance f of the green light, i.e., a distance between the bottom surface of the color separating lens array 130 and a point on which the green light is converged may be about 1.64 μm, and the thickness 120*h* of the spacer layer 120 may be about 0.82 μm. When the reference wavelength $\lambda_0$ is 540 nm, which is green light, the pitch of the first green pixel 111, the blue pixel 112, the red pixel 113, and the second green pixel 114 is 1.2 μm, and the refractive index n of the spacer layer 120 in wavelength of 540 nm is 1.46, the focal distance f of the green light may be about 3.80 μm, and the thickness 120*h* of the spacer layer 120 may be about 1.90 μm.

To further explain the thickness 120*h* of the spacer layer 120 described above, the thickness 120*h* of the spacer layer 120 may be 70% to 120% of a pixel pitch when the pixel pitch is 0.5 μm to 0.9 μm, and may be 110% to 180% of the pixel pitch when the pixel pitch is 0.9 μm to 1.3 μm.

The color separating lens array 130 may include nanoposts NP which are supported by the spacer layer 120 and change a phase of incident light, and dielectric material provided between the nanoposts NP and having a lower refractive index than the nanoposts NP, such as air or $SiO_2$.

Figure 6A:
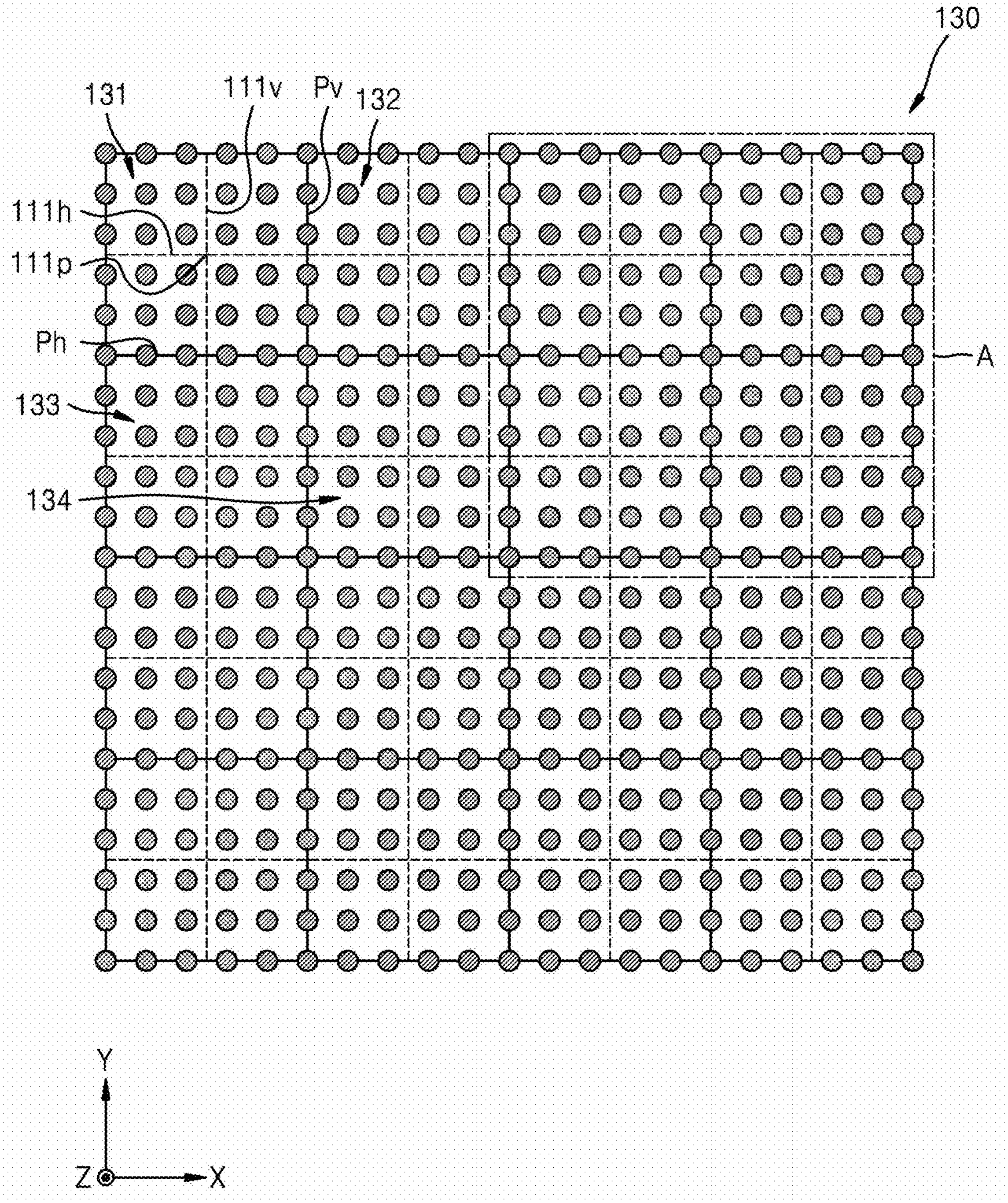
FIG. 6A is a planar view exemplarily illustrating an arrangement of a plurality of nanoposts NP in a plurality of pixel-corresponding areas of a color separating lens array in a pixel array of an image sensor according to an example embodiment.
Figure 6B:
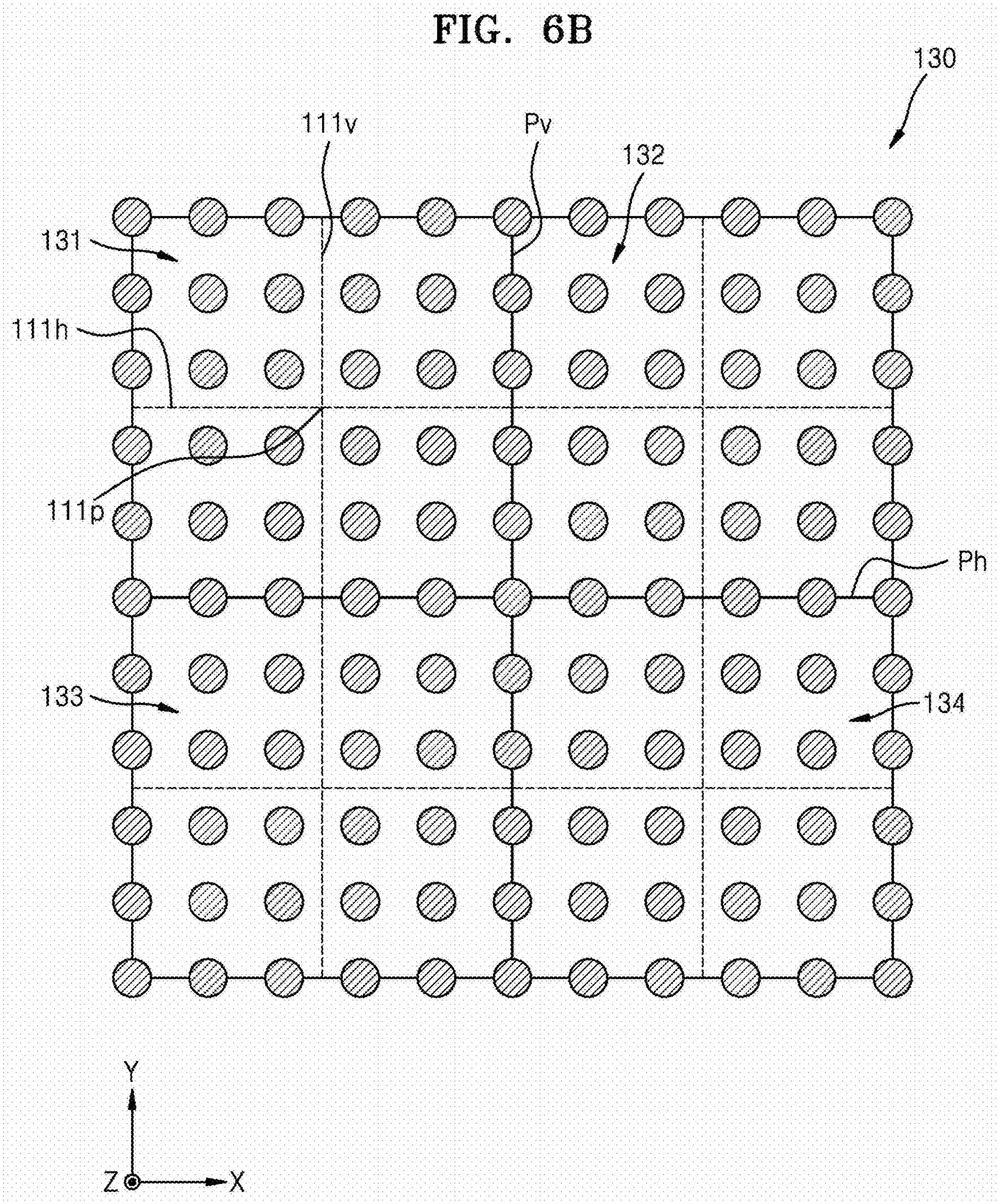
FIG. 6B is a planar view showing an enlarged arrangement of nanoposts NP included in some areas of FIG. 6A, i.e., pixel-corresponding areas corresponding to a unit pixel.

FIG. 6A is a planar view illustrating an arrangement of a plurality of nanoposts NP in a plurality of pixel-corresponding areas of the color separating lens array 130 in the pixel array 1100 of the image sensor 1000 according to an example embodiment, and FIG. 6B is a planar view showing an enlarged arrangement of nanoposts NP included in an area A of FIG. 6A, i.e., pixel-corresponding areas 131, 132, 133, and 134 corresponding to a unit pixel.

With reference to FIGS. 5A, 6A and 6B, the color separating lens array 130 may include, for example, four pixel-corresponding areas 131, 132, 133, and 134 respectively corresponding to the first green pixel 111, the blue pixel 112, the red pixel 113, and the second green pixel 114 of the sensor substrate 110 of FIG. 5A. When the unit pixel of the sensor substrate 110 includes four pixels, i.e., the first green pixel 111, the blue pixel 112, the red pixel 113, and the second green pixel 114, arranged in 2×2 array, four pixel-corresponding areas 131, 132, 133, and 134 of 2×2 array corresponding thereto may be repeated two-dimensionally in the color separating lens array 130. In FIGS. 6A and 6B, the lines partitioning the pixel-corresponding areas 131, 132, 133, and 134 may be a virtual line, and the color separating lens array 130 may not include these lines. For another example, a structure corresponding to the line partitioning the pixel-corresponding areas 131, 132, 133, and 134, may be formed in the color separating lens array 130.

When the pixel array 1100 of the image sensor according to an example embodiment has a Bayer pattern array, the unit pattern of the color separating lens array 130 may include a first green pixel-corresponding area 131, a second green pixel-corresponding area 134, a blue pixel-corresponding area 132, and a red pixel-corresponding area 133. The first green pixel-corresponding area 131 may correspond to the first green pixel 111 and may be provided on the top of the first green pixel 111 in the vertical direction, the blue pixel-corresponding area 132 may correspond to the blue pixel 112, and may be provided on the top of the blue pixel 112 in the vertical direction, the red pixel-corresponding area 133 may correspond to the red pixel 113, and may be provided on the top of the red pixel 113 in the vertical direction, and the second green pixel-corresponding area 134 may correspond to the second green pixel 114, and may be provided on the top of the second green pixel 114 in the vertical direction.

That is, the first green pixel-corresponding area 131, the blue pixel-corresponding area 132, the red pixel-corresponding area 133, and the second green pixel-corresponding area 134 of the color separating lens array 130 may be arranged to respectively face the first green pixel 111, the blue pixel 112, the red pixel 113, and the second green pixel 114 of the sensor substrate 110 in the vertical direction. The first green pixel-corresponding area 131, the blue pixel-corresponding area 132, the red pixel-corresponding area 133, and the second green pixel-corresponding area 134 may be arranged in a 2D manner in the first direction (X direction) and the second direction (Y direction) so that a first row in which the first green pixel-corresponding area 131 and the blue pixel-corresponding area 132 are arranged alternately and a second row in which the red pixel-corresponding area 133 and the second green pixel-corresponding area 134 are arranged alternately are repeated alternately. The color separating lens array 130 may include a plurality of unit patterns arranged in a 2D manner as in the pixel array of the sensor substrate 110, and each unit pattern may include the first green pixel-corresponding area 131, the blue pixel-corresponding area 132, the red pixel-corresponding area 133, and the second green pixel-corresponding area 134 arranged in the form of 2×2 array.

The color separating lens array 130 may include nanoposts NP of which size, shape, interval, and/or arrangement have been determined so that green light is separated and concentrated on the first and second green pixels 111 and 114, blue light is separate and concentrated on the blue pixel 112, and red light is separate and concentrated on the red pixel 113. Meanwhile, the thickness of the color separating lens array 130 in a third direction (Z direction) may be similar to the height of the nanopost NP, and may be about 500 nm to about 1500 nm.

According to the image sensor 1000 of an example embodiment, the first green pixel-corresponding area 131, the blue pixel-corresponding area 132, the red pixel-corresponding area 133, and the second green pixel-corresponding area 134 of the color separating lens array 130 may include, for example, cylindrical nanoposts NP having a circular cross-section, and in each of the first green pixel-corresponding area 131, the blue pixel-corresponding area 132, the red pixel-corresponding area 133, and the second green pixel-corresponding area 134, the nanopost NP may be arranged so that a nanopost NP is located on a position out of the first position in the horizontal direction on the DTI structure between a plurality of light sensing cells of each of the first green pixel 111, the blue pixel 112, the red pixel 113, and the second green pixel 114.

In FIGS. 6A, 6B, and other drawings described below, the reference numerals 111*h* and 111*v* respectively denote a DTI structure between the light sensing cells in the first direction (X direction) and the second direction (Y direction), and the reference numeral 111*p* denotes an intersection of the DTI structure between the light sensing cells in the first direction (X direction) and the second direction (Y direction). In addition, in FIGS. 6A and 6B, and other drawings described below, Ph and Pv respectively correspond to a boundary line between pixels in the first direction (X direction) and in the second direction (Y direction). FIGS. 6A and 6B, and other drawings described below exemplarily illustrate arrangement of the light sensing cells at the center portion of the image sensor 1000 and nanopost arrangement corresponding thereto. The relationship between the light sensing cell arrangement and the nanopost arrangement corresponding thereto may be changed so that a nanopost is not provided at the first position in the horizontal direction on the DTI structure as a distance from the center of the image sensor 1000 increases.

In the image sensor 1000 according an the example embodiment, the DTI structure between the light sensing cells not allowing a nanopost to be provided at the first position in the horizontal direction may be at least one of a DTI structure 111*h* between the light sensing cells in the first direction (X direction), a DTI structure 111*v* between the light sensing cells in the second direction (Y direction), and an intersection 111*p* of the two DTI structures 111*h* and 111*v*. A nanopost NP may be arranged on the boundary lines Ph and Pv between the pixels, intersection of the pixel boundary lines or at a position spaced apart from the pixel boundary lines by the first position in the horizontal direction.

FIGS. 6A and 6B, and example embodiments described below exemplarily illustrate a case where the color separating lens array 130 is arranged so that a nanopost is not located at the first position on the DTI structure 111*h* between the light sensing cells in the first direction (X direction), the DTI structure 111*v* between the light sensing cells in the second direction (Y direction), and the intersection 111*p* of the DTI structures, however, the example embodiments are not limited thereto, and the color separating lens array 130 may be provided so that a nanopost is not provided at the first position in the horizontal direction on one or two of the DTI structure 111*h*, the DTI structure 111*v*, and the intersection 111*p* of the DTI structures or in some areas on the DTI structures 111*h* and 111*v*.

According to an example embodiment, in the first green pixel 111 shown in FIG. 5A, when a plurality of light sensing cells have a structure including four light sensing cells, i.e., a first light sensing cell 111*a* and a second light sensing cell 111*b* arranged in the first direction (X direction), a third light sensing cell 111*c* and a fourth light sensing cell 111*d* arranged in the second direction (Y direction) with respect to the first and second light sensing cells 111*a* and 111*b*, in which each pixel includes four light sensing cells arranged in a 2×2 array, a nanopost array may be provided, which does not include a nanopost at the first position in the horizontal direction on the intersection 111*p* of the first DTI structure and the second DTI structure as shown in FIGS. 6A and 6B. Here, the first DTI structure 111*h* may refer to a DTI structure in the first direction (X direction) between the first and second light sensing cells 111*a* and 111*b* and the third and fourth light sensing cells 111*c* and 111*d*, and the second DTI structure 111*v* may refer to a DTI structure in the second direction (Y direction) between the first and third light sensing cells 111*a* and 111*c* and the second and fourth light sensing cells 111*b* and 111*d*.

When each pixel has a structure including four light sensing cells arranged in a 2×2 array as shown in FIG. 5A, the nanoposts NP may be arranged so that a nanopost NP is not located at the first position on the intersection 111*p* of the DTI structure between a plurality of light sensing cells of each pixel, e.g., the center of the 2×2 light sensing cell array or the center of each pixel as shown in FIGS. 6A and 6B. That is, the nanoposts NP may be arranged so that a nanopost NP is not located at the centers of the first and second green pixel-corresponding areas 131 and 134, the center of the blue pixel-corresponding area 132, and the center of the red pixel-corresponding area 133. Also, as shown in FIGS. 6A and 6B, when the nanoposts NP are arranged at equal intervals, i.e., arranged in the array structure grid points, a nanopost NP may neither be located at the intersection 111*p* of the DTI structure between the light sensing cells of each pixel nor at the first position in the horizontal direction on the DTI structures 111*h* and 111*v* between the plurality of light sensing cells in the first direction (X direction) and the second direction (Y direction). For another example, the nanopost array may be arranged so that while a array structure grid point in which a nanopost is arranged is not located at the first position in the horizontal direction on the intersection 111*p*, the nanoposts NP are arranged in at least some of the array structure grid points, e.g., some or every array structure grid points.

FIGS. 6A and 6B illustrate an example in which the nanoposts NP are arranged in a 11×11 array structure in four pixel-corresponding areas, i.e., the first green pixel-corresponding area 131, the blue pixel-corresponding area 132, the red pixel-corresponding area 133, and the second green pixel-corresponding area 134, corresponding to the unit pixel. As such, when the array structure grid points have a 11×11 array structure with respect to the unit pixel of the sensor substrate 110, and a nanopost is arranged in some or every array structure grid points, thereby arranging the nanoposts NP in a 11×11 array structure, a nanopost may not be provided at the first position in the horizontal direction on the DTI structure 111*h* and 111*v* between a plurality of light sensing cells and on the intersection 111*p* of the DTI structure, and accordingly, the nanopost may not be provided at the first position in the horizontal direction at the center of each of the first green pixel-corresponding area 131, the blue pixel-corresponding area 132, the red pixel-corresponding area 133, and the second green pixel-corresponding area 134.

As described above, according to the image sensor 1000 of an example embodiment, as the nanoposts NP may be arranged so that a nanopost is not located at the center of the first green pixel-corresponding area 131, the blue pixel-corresponding area 132, the red pixel-corresponding area 133, and the second green pixel-corresponding area 134 of the color separating lens array 130, light may not be concentrated at the center of each of the first green pixel 111, the blue pixel 112, the red pixel 113, and the second green pixel 114, which corresponds to the intersection 111*p* of the DTI structure, and the light efficiency and automatic focus signal ratio may be improved.

Meanwhile, in the arrangement structure of FIGS. 6A and 6B, and other example embodiments described below, the nanoposts NP are described as having the same cross-section size; however, such description is provided only as an example to illustrate the arrangement structure of the nanoposts NP, and does not limit a size of cross-sections of the nanoposts NP. The cross-section size of the nanoposts NP may be changed according to a position of the nanoposts NP. Nanoposts NP of various shapes, sizes, and arrays may be applied, as needed.

For example, the nanoposts NP provided in the first and second green pixel-corresponding areas 131 and 134 may have different distribution rules in the first direction (X direction) and the second direction (Y direction). The nanoposts NP arranged in the first and second green pixel-corresponding areas 131 and 134 may have arrangements of different size in the first direction (X direction) and the second direction (Y direction). The cross-sectional area of, among the nanoposts NP, a nanopost arranged on the boundary of the blue pixel-corresponding area 132 adjacent to the first green pixel-corresponding area 131 in the first direction (X direction) may be different than that of a nanopost arranged on the boundary of the red pixel-corresponding area 133 adjacent to the first green pixel-corresponding area 131 in the second direction (Y direction). Similarly, the cross-sectional area of, among the nanoposts NP, a nanopost arranged on the boundary of the red pixel-corresponding area 133 adjacent to the second green pixel-corresponding area 134 in the first direction (X direction) may be different than that of a nanopost arranged on the boundary of the blue pixel-corresponding area 132 adjacent to the second green pixel-corresponding area 134 in the second direction (Y direction).

On the other hand, the nanoposts NP arranged in the blue pixel-corresponding area 132 and the red pixel-corresponding area 133 may have a symmetrical distribution rule in the first direction (X direction) and the second direction (Y direction). The cross-sectional area of, among the nanoposts NP, a nanopost arranged on the boundary of pixels adjacent to the blue pixel-corresponding area 132 in the first direction (X direction) may be the same as that of a nanopost arranged on the boundary of pixels adjacent to the blue pixel-corresponding area 132 in the second direction (Y direction), and the cross-sectional area of a nanopost arranged on the boundary of pixels adjacent to the red pixel-corresponding area 133 in the first direction (X direction) may be the same as that of a nanopost arranged on the boundary of pixels adjacent to the red pixel-corresponding area 133 in the second direction (Y direction).

This profile is due to the pixel array of the Bayer pattern. Both of the blue pixel 112 and the red pixel 113 may have the same neighboring pixels, i.e., the first and second green pixels 111 and 114 in the first direction (X direction) and second direction (Y direction), whereas the first green pixel 111 may have two different neighboring pixels, i.e., the blue pixel 112 adjacent in the first direction (X direction) and the red pixel 113 adjacent in the second direction (Y direction), and the second green pixel 114 may have two different neighboring pixels, i.e., the red pixel 113 adjacent in the first direction (X direction) and the blue pixel 112 adjacent in the second direction (Y direction). Further, pixels adjacent to the first and second green pixels 111 and 114 in four diagonal directions may be green pixels, and pixels adjacent to the blue pixel 112 in four diagonal directions may be the red pixel 113, and pixels adjacent to the red pixel 113 in four diagonal directions may be the blue pixel 112. Therefore, in the blue and red pixel-corresponding areas 132 and 133 corresponding to the blue pixel 112 and the red pixel 113, respectively, the nanoposts NP may be arranged in the form of 4-fold symmetry, and in the first and second green pixel-corresponding areas 131 and 134, the nanoposts NP may be arranged in the form of 2-fold symmetry. In particular, the first and second green pixel-corresponding areas 131 and 134 may have nanopost distribution rules to be rotated 90 degrees from each other.

Meanwhile, the arrangement structures in the example embodiments of FIGS. 6A, 6B, and other example embodiments described below describe that the nanoposts NP have a symmetrical circular cross-section; however, a nanopost having an asymmetrical cross-section may also be included. For example, a nanopost having an asymmetrical cross-sectional shape with different widths in the first direction (X direction) and the second direction (Y direction) may be employed in the first and second green pixel-corresponding areas 131 and 134, a nanopost having a symmetrical cross-sectional shape with the same width both in the first direction (X direction) and the second direction (Y direction) may be employed in the blue and red pixel-corresponding areas 132 and 133. The arrangement rules of the nanopost NP described above are provided as an example, and are not limited to the illustrated patterns.

Figure 7A:
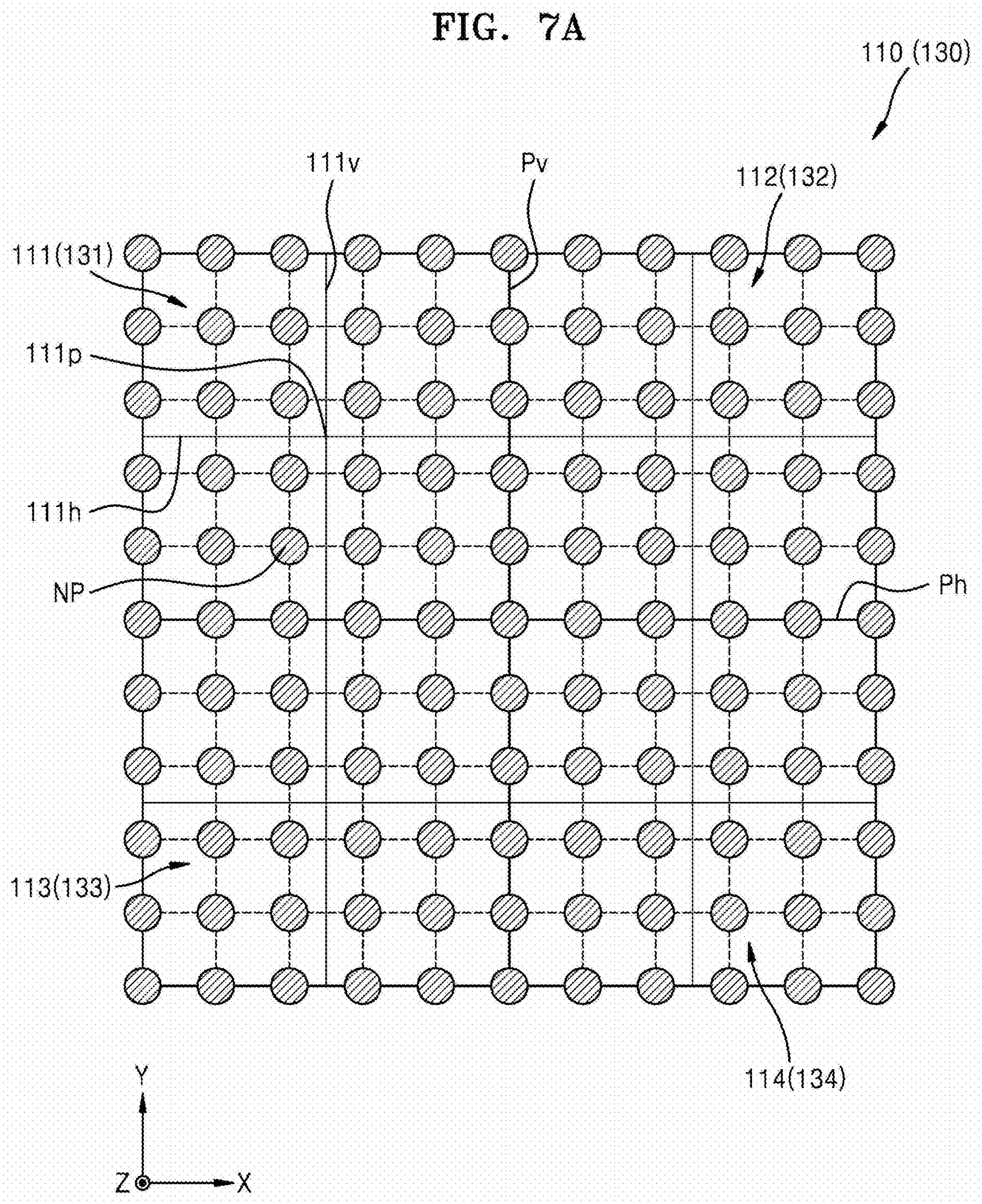
FIG. 7A is a planar view showing a unit pixel of an image sensor in which nanoposts NP are arranged.
Figure 7B:
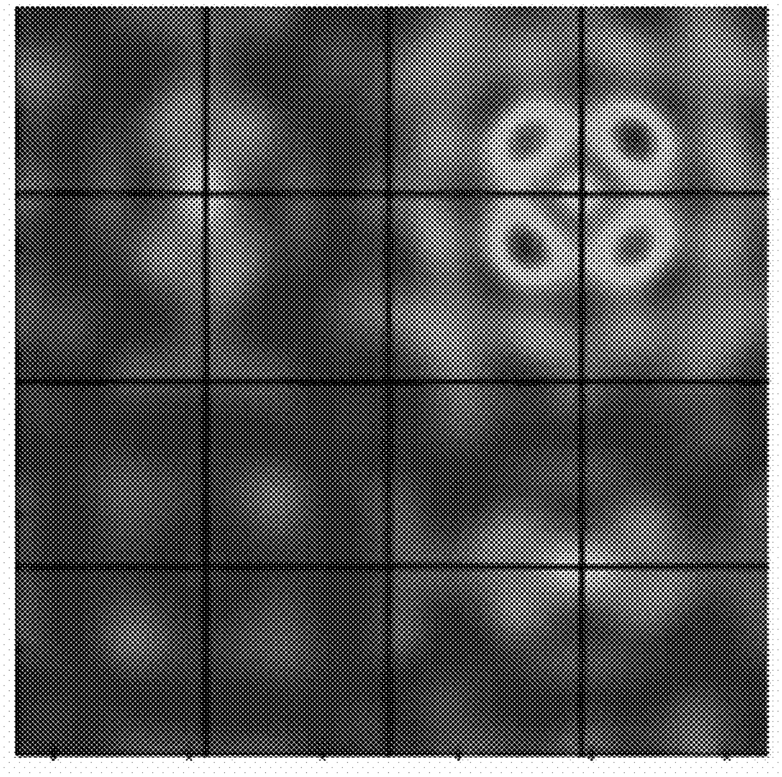
FIG. 7B is a diagram illustrating an optical field profile formed in a unit pixel of the image sensor of FIG. 7A.

FIG. 7A is a planar view showing a unit pixel of an image sensor in which nanoposts NP are arranged according to an example embodiment. FIG. 7B is a diagram illustrating an optical field profile formed in a unit pixel of the image sensor of FIG. 7A. The line connecting the nanoposts NP in FIG. 7A is a virtual line, and is provided to show the relationship between the DTI structures 111*h* and 111*v* between the light sensing cells of each of the first green pixel 111, the blue pixel 112, the red pixel 113, and the second green pixel 114 of the sensor substrate 110, boundary lines Ph and Pv between the pixels, and the nanopost NP array. FIG. 7B exemplarily illustrates a field profile of blue light concentrated on the blue pixel 112.

With reference to FIG. 7A, the nanoposts NP may be arranged in an N×N array structure, for example, in a 11×11 array structure with respect to the unit pixel of the image sensor so that a nanopost is not located at the first position in the horizontal direction on the DTI structures 111*h* and 111*v* between the light sensing cells of each of the first green pixel 111, the blue pixel 112, the red pixel 113, and the second green pixel 114 and/or on the intersection 111*p* of the DTI structure.

As shown in FIG. 7A, when the nanoposts NP are arranged in a 11×11 array structure, a nanopost may not be located in first position in the horizontal direction on both of the DTI structures 111*h* and 111*v* between the plurality of light sensing cells of each pixel and on the intersection 111*p* of the DTI structure. As described above, the nanopost NP may be arranged so that a nanopost is not located at the first position in the horizontal direction on any one of or both of the DTI structures 111*h* and 111*v* and the intersection 111*p* of the DTI structure, or on some areas on the DTI structures 111*h* and 111*v*.

Meanwhile, as shown in FIG. 7A, when connecting the nanoposts NP with a virtual line, the positions in which the nanopost NP are arranged may correspond to the array structure grid points. As shown in FIG. 7A, when the nanoposts NP are arranged in the 11×11 array structure with respect to the unit pixel, the array structure grid points may not be located at the first position in the horizontal direction on the DTI structures 111*h* and 111*v* and on the intersection 111*p* of the DTI structure.

FIG. 7A exemplarily illustrates that the nanoposts NP are arranged in the unit pixel so that a nanopost is located on each array structure grid point, however, such description is merely an example, and a nanopost may be arranged on only some of the array structure grid points for optimization of the light efficiency and automatic focus signal ratio. Further, in FIG. 7A, the cross-section size of the nanoposts NP arranged on the array structure grid points may be changed according to the positions for optimization of the light efficiency and automatic focus signal ratio.

According to the nanopost NP array structure of the example embodiment shown in FIG. 7A, the nanopost NP may not be located at the first position in the horizontal direction on the DTI structures 111*h* and 111*v* between the light sensing cells of each the first green pixel 111, the blue pixel 112, the red pixel 113, and the second green pixel 114, and may not be located at the first position in the horizontal direction on the intersection 111*p* of the DTI structure. Thus, for example, as shown in FIG. 7B, the blue light concentrated on the blue pixel 112 may be concentrated at a position out of the intersection 111*p* of the DTI structure between the light sensing cells and/or the DTI structures 111*h* and 111*v* between the light sensing cells. Similarly, the green light concentrated on the first and second green pixels 111 and 114 may be concentrated at a position out of the intersection 111*p* of the DTI structure between the light sensing cells and/or the DTI structures 111*h* and 111*v* between the light sensing cells. Also, the red light concentrated on the red pixel 113 may be concentrated at a position out of the intersection 111*p* of the DTI structure between the light sensing cells and/or the DTI structures 111*h* and 111*v* between the light sensing cells.

As such, when the nanoposts NP are arranged with respect to the unit pixel of the image sensor so that a nanopost is not located at the first position in the horizontal direction both on the DTI structures 111*h* and 111*v* between the plurality of light sensing cells of each of the first green pixel 111, the blue pixel 112, the red pixel 113, and the second green pixel 114, and on the intersection 111*p* of the DTI structure, an optical field may be formed at a position out of the DTI structures 111*h* and 111*v* between the light sensing cells and the intersection 111*p* of the DTI structure in each of the first green pixel 111, the blue pixel 112, the red pixel 113, and the second green pixel 114 as exemplarily shown in FIG. 7B.

The example in which the nanoposts NP are arranged in the 11×11 array structure with respect to the unit pixel of the image sensor to form the optical field at a position out of the DTI structures 111*h* and 111*v* between the light sensing cells and/or the intersection 111*p* of the DTI structure in each pixel is described and illustrated above, however, the example embodiment is not limited thereto, and the nanopost NP may be arranged in various array structures with respect to the unit pixel. That is, in at least one pixel of the unit pixels, the nanoposts NP may be arranged in various array structures so that a nanopost is not located at the first position in the horizontal direction on both of the DTI structures 111*h* and 111*v* and the intersection 111*p* of the DTI structure, or the nanopost is not located at the first position in the horizontal direction on at least one or two of the DTI structures 111*h* and 111*v*, and the intersection 111*p* of the DTI structure, or in some areas on the DTI structures 111*h* and 111*v*.

FIGS. 8 to 11 are planar views showing a unit pixel of an image sensor having a nanopost NP array structure of various example embodiments. The line connecting the nanosposts NP in FIGS. 8 to 11 is a virtual line, and is provided to show the relationship between the DTI structures 111*h* and 111*v* between the light sensing cells of each of the first green pixel 111, the blue pixel 112, the red pixel 113, and the second green pixel 114 of the sensor substrate 110, boundary lines Ph and Pv between the pixels, and the nanopost NP array structure.

With reference to FIGS. 8 to 11, the array structure grid points may have a 7×7, 8×8, or 12×12 array structure with respect to the unit pixel of the sensor substrate 110, and a nanopost may be arranged on some or every array structure grid points.

Figure 8:
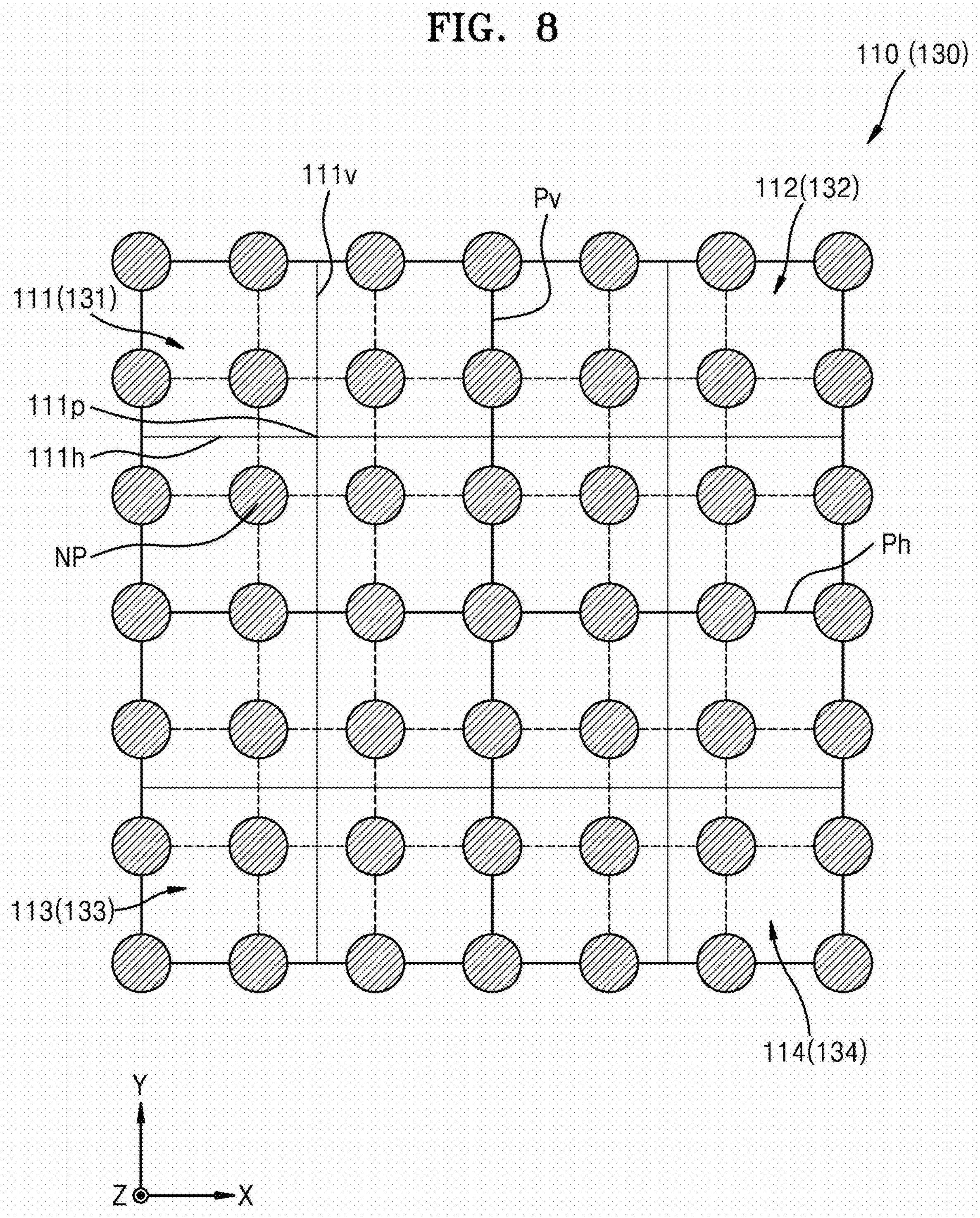
FIGS. 8 to 11 are planar views showing a unit pixel of an image sensor having a nanopost NP array structure of various example embodiments.
Figure 9:
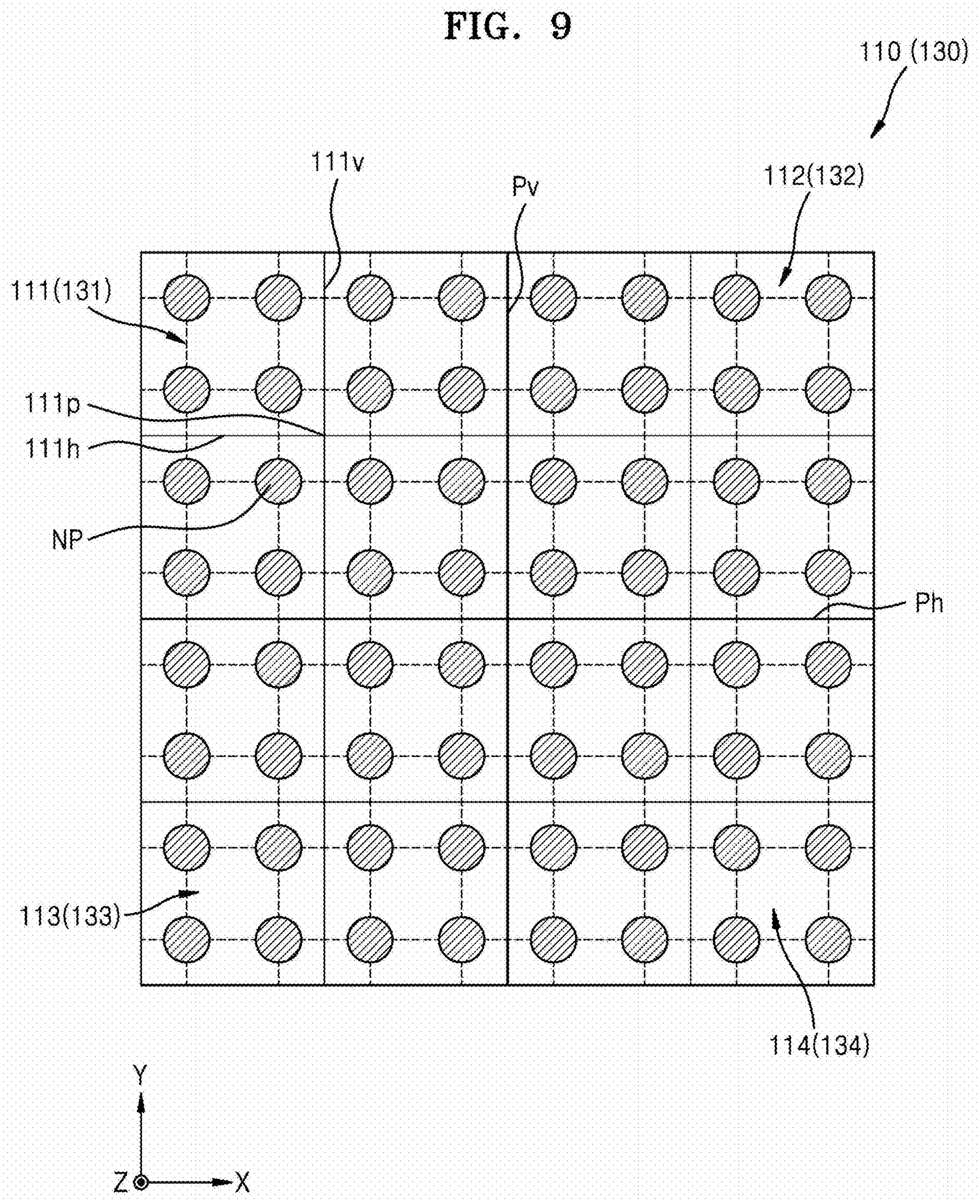
Figure 10:
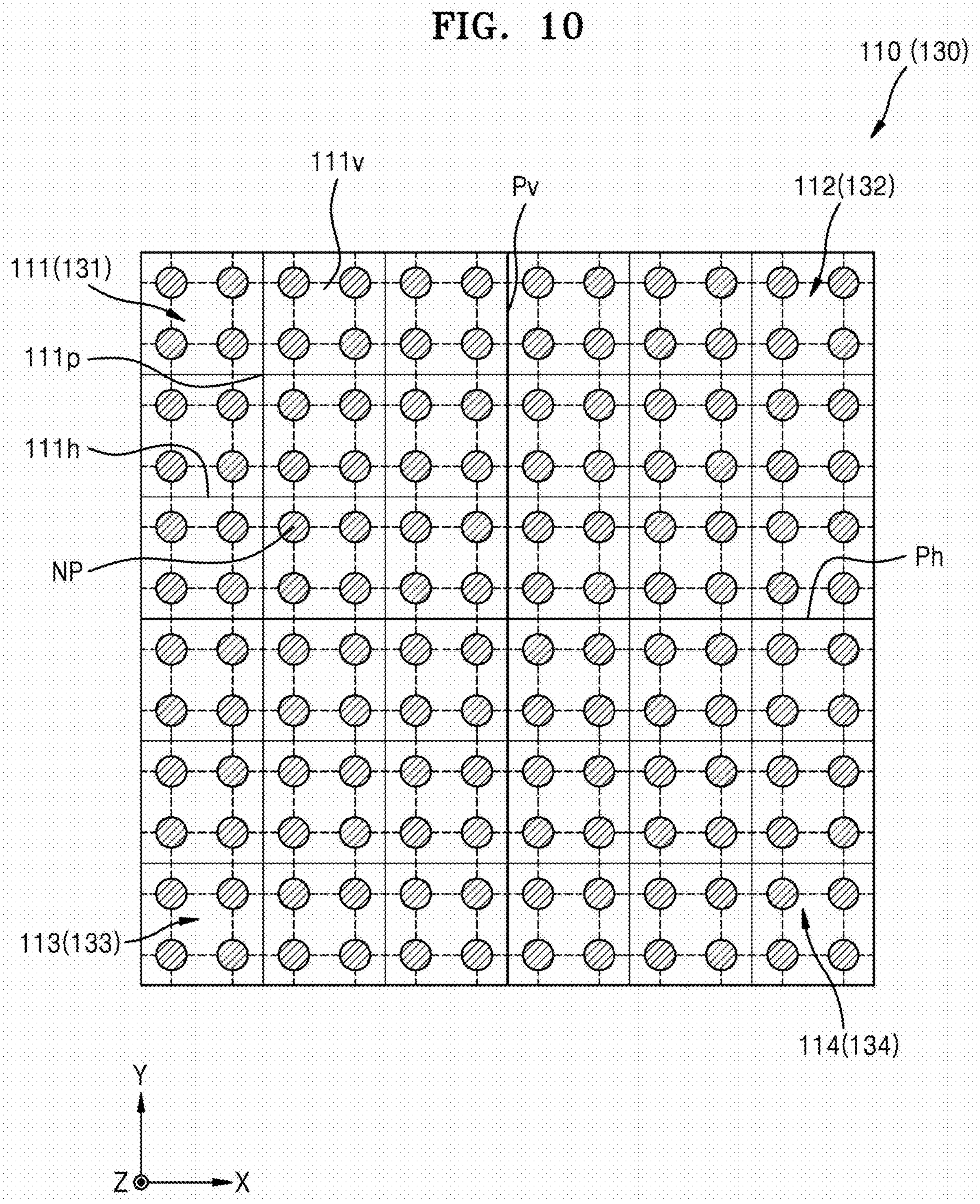

For example, the nanoposts NP may be arranged in the 7×7 array structure with respect to the unit pixel of the image sensor as shown in FIG. 8. The nanoposts NP may be arranged in the 8×8 array structure with respect to the unit pixel of the image sensor as shown in FIG. 9. The nanoposts NP may be arranged in the 12×12 array structure with respect to the unit pixel of the image sensor as shown in FIG. 10. As shown in FIGS. 8 to 10, when connecting the nanoposts NP with a virtual line, the nanoposts NP may be arranged on the array structure grid points. FIGS. 8 to 10 exemplarily illustrate that the nanoposts NP are arranged so that a nanopost NP is located on each array structure grid point, however, the example embodiment is not limited thereto. For example, for optimization of light efficiency and automatic focus signal ratio, the nanoposts NP may be arranged only on some intersections of the grid. Further, In FIGS. 8 to 10, the nanoposts NP arranged in the intersections of the grid may vary in size according to the positions of the grid points for optimization of light efficiency and automatic focus signal ratio.

In the image sensor 1000 according to an example embodiment, the arrangement of the array structure grid points may have various array structures in addition to the 7×7, 8×8, and 12×12 array structures with respect to the unit pixel of the sensor substrate 110. In this case, by moving the position of the nanopost or arbitrarily changing the size of the nanopost, the nanopost may not be provided at the first position in the horizontal direction on the DTI structure and/or intersection of the DTI structure, for example, at the center of each pixel.

Meanwhile, according to the image sensor 1000 of an example embodiment, to adjust the light efficiency and automatic focus signal ratio, an additional displacement may be applied to a nanopost NP close to the first position in the horizontal direction on the intersection 111*p* of the DTI structure between the light sensing cells in a direction proceeding away from the first position with respect to the array structure grid point. For example, when at least one pixel of the unit pixel has a structure including four light sensing cells arranged in 2×2 array, by symmetrically moving the positions of the nanoposts close to the central positions of the 2×2 arrays of the light sensing cells, the phase profile may be further fine-adjusted. At this time, the additional change of the nanopost may be made in a direction to enhance the light efficiency and/or improve the automatic focus signal ratio, and the displacement of the nanopost may be adjusted independently for each color channel.

Figure 11:
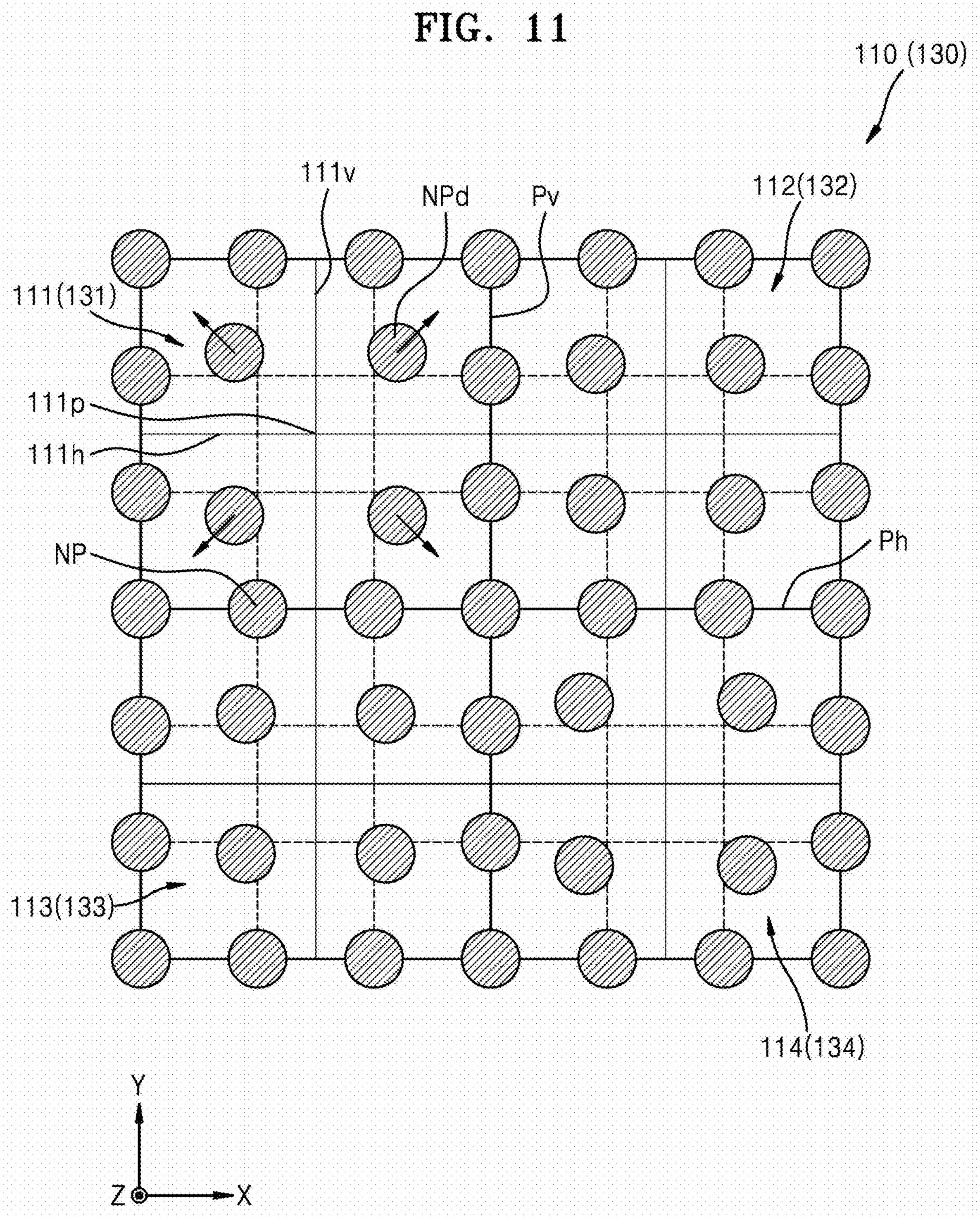

FIG. 11 shows an example in which an additional displacement is applied to a nanopost close to the first position in the horizontal direction on the intersection 111*p* of the DTI structure between the light sensing cells in a direction proceeding away from the first position.

With reference to FIG. 11, in at least one pixel of the unit pixel, an additional displacement may be applied to, among the nanoposts NP, at least some of the nanoposts close to the first position in the horizontal direction on the intersection 111*p* of the DTI structure between the light sensing cells in a direction proceeding away from the first position, for example, the intersection 111*p*. In FIG. 11, NPd represents deviated nanoposts to which additional displacement is applied in a direction proceeding away from the first position, for example, the intersection 111*p* of the DTI structure, with respect to the array structure grid point.

As shown in FIG. 11, when connecting the nanoposts NP with a virtual line, most of the nanosposts NP may be arranged on the array structure grid points, and the deviated nanopost NPd may be positioned out of the array structure grid points.

For example, when the unit pixel includes four pixels, i.e., the first green pixel 111, the blue pixel 112, the red pixel 113, and the second green pixel 114 arranged in a 2×2 array, the nanoposts NP may be arranged with respect to the unit pixel of the image sensor so that the deviated nanoposts NPd are included in at least one pixel. FIG. 11 shows an example in which the nanoposts NP are arranged so that each of the first green pixel 111, the blue pixel 112, the red pixel 113, and the second green pixel 114 includes the deviated nanoposts NPd. The magnitude of displacement of the deviated nanoposts NPd in each of the first green pixel 111, the blue pixel 112, the red pixel 113, and the second green pixel 114 may be different for each pixel, that is, for each color channel.

That is, the magnitude of displacement of the deviated nanoposts NPd may be optimized in accordance with each wavelength.

FIG. 11 illustrate an example in which the nanoposts NP are arranged in the 7×7 array with respect to the unit pixel of the image sensor in correspondence with FIG. 8, and additional displacement is applied to the nanoposts close to the first position in the horizontal direction on the intersection 111*p* of the DTI structure in a direction proceeding away from the first position, for example, from the intersection; however, such description is provided merely as an example, and the additional displacement may also be applied to various other array structures. For example, the additional displacement applied to arrange the nanoposts close to the first position in the horizontal direction on the intersection of the DTI structure at a position further moved in a direction proceeding away from the first position, for example, from the intersection 111*p* of the DTI structure may also be applied to other array structures, for example, the 11×11 array structure shown in FIGS. 6A, 6B, and 7A, the 8×8 array structure shown in FIG. 9, and the 12×12 array structure shown in FIG. 10 in addition to the 7×7 array structure shown in FIG. 8. In addition to the above, the additional displacement applied to arrange the nanoposts close to the first position in the horizontal direction on the intersection of the DTI structure at a position further moved in a direction proceeding away from the first position, for example, from the intersection may also be applied to various other array structures. The additional displacement applied to the nanoposts close to the first position, for example, the intersection 111*p* of the DTI structure may be different for each pixel to adjust light efficiency and automatic focus signal ratio. That is, the magnitude of the additional displacement may be different in every color channel and optimized for each wavelength.

Figure 12A:
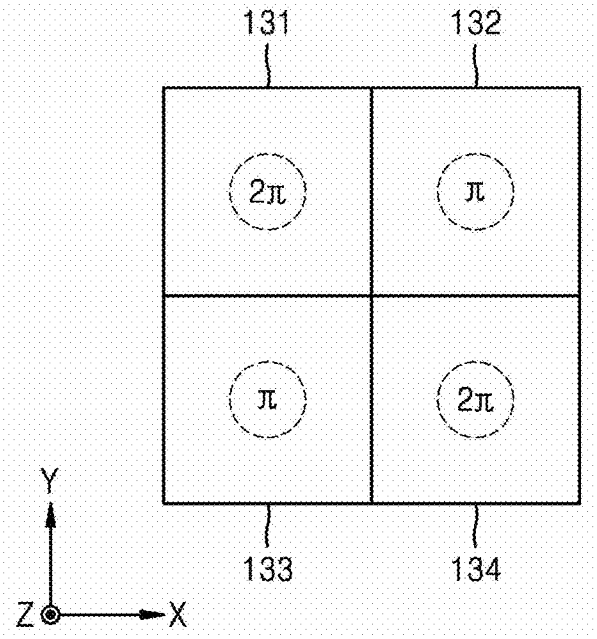
FIG. 12A is a diagram showing a phase in pixel-corresponding areas of green light passed through a color separating lens array.
Figure 12B:
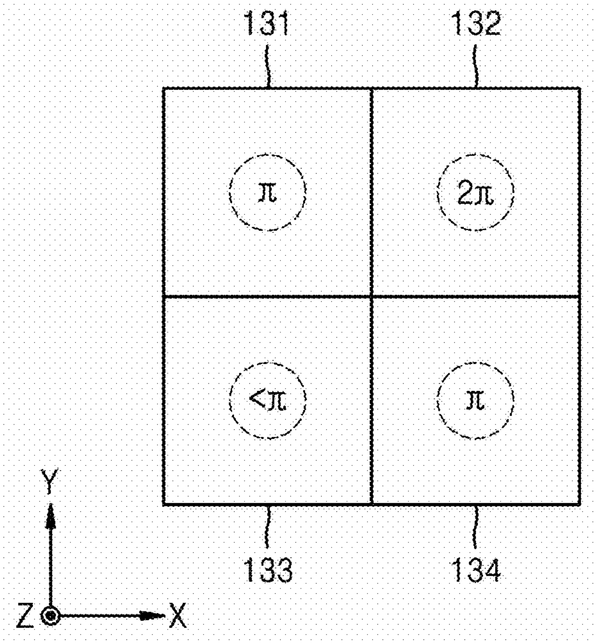
FIG. 12B is a diagram showing a phase in pixel-corresponding areas of blue light passed through a color separating lens array.

FIG. 12A shows a phase of green light passed through the color separating lens array 130 in the first green pixel-corresponding area 131, the blue pixel-corresponding area 132, the red pixel-corresponding area 133, and the second green pixel-corresponding area 134, and FIG. 12B shows a phase of blue light passed through the color separating lens array 130 in the first green pixel-corresponding area 131, the blue pixel-corresponding area 132, the red pixel-corresponding area 133, and the second green pixel-corresponding area 134. With reference to FIG. 12A, a phase of the green light at a position immediately after the green light has passed through the color separating lens array 130, i.e., on the bottom surface of the color separating lens array 130 or on the top surface of the spacer layer 120 may be maximized in the first green pixel-corresponding area 131, may be minimized in the blue and red pixel-corresponding areas 132 and 133 in the X and Y directions, and may be minimized at contact point between the first and second green pixel-corresponding areas 131 and 134 in the diagonal direction. When the phase of the green light emitted from the first green pixel-corresponding area 131 is 2π, light having a phase of 0.9π to 1.1π may be emitted from the blue and red pixel-corresponding areas 132 and 133, light of a phase of 2π may be emitted from the second green pixel-corresponding area 134, and light having a phase of 1.1π to 1.5π may be emitted from the contact point between the first green pixel-corresponding area 131 and the second green pixel-corresponding area. Accordingly, a phase difference between the green light passed through the first green pixel-corresponding area 131 and the green light passed through the blue pixel-corresponding area 132 and the red pixel-corresponding area 133 may be 0.9π to 1.1π.

With reference to FIG. 12B, a phase of blue light at a position immediately after the blue light has passed through the color separating lens array 130 may maximized in the blue pixel-corresponding area 132, may be minimized in the first and second green pixel-corresponding areas 131 and 134 in the X direction and the Y directions, and may be minimized in the red pixel-corresponding area 133 in the diagonal direction. When the phase of the blue light in the blue pixel-corresponding area 132 is 2π, the phase in the first and second green pixel-corresponding areas 131 and 134 may be, for example, 0.9π to 1.1π, and the phase in the red pixel-corresponding area 133 may be a value smaller than the phase in the first and second green pixel-corresponding areas 131 and 134, for example, 0.5π to 0.9π.

Figure 12C:
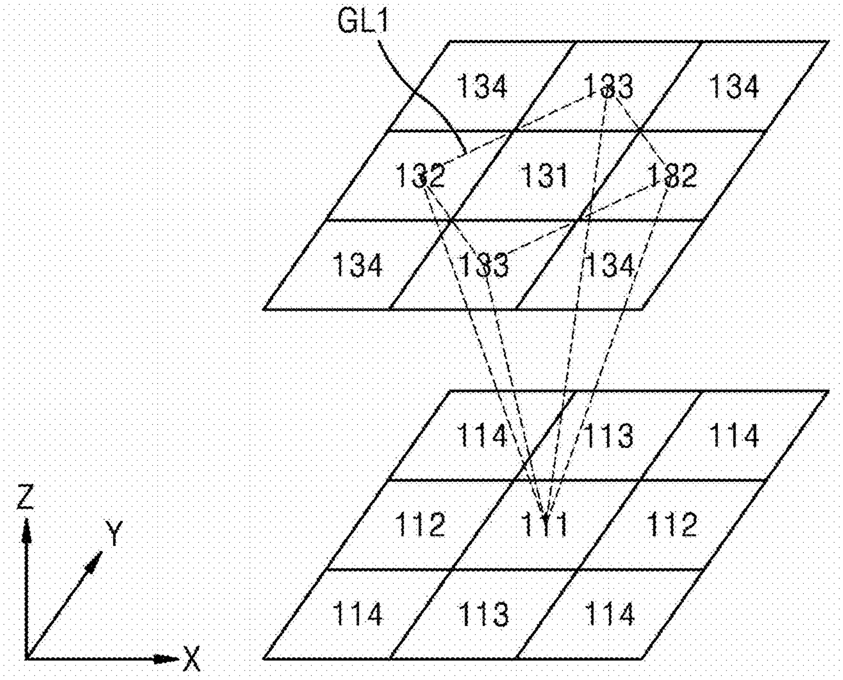
FIG. 12C illustrates an example of a proceeding direction of green light incident on a first green light concentration area.
Figure 12D:
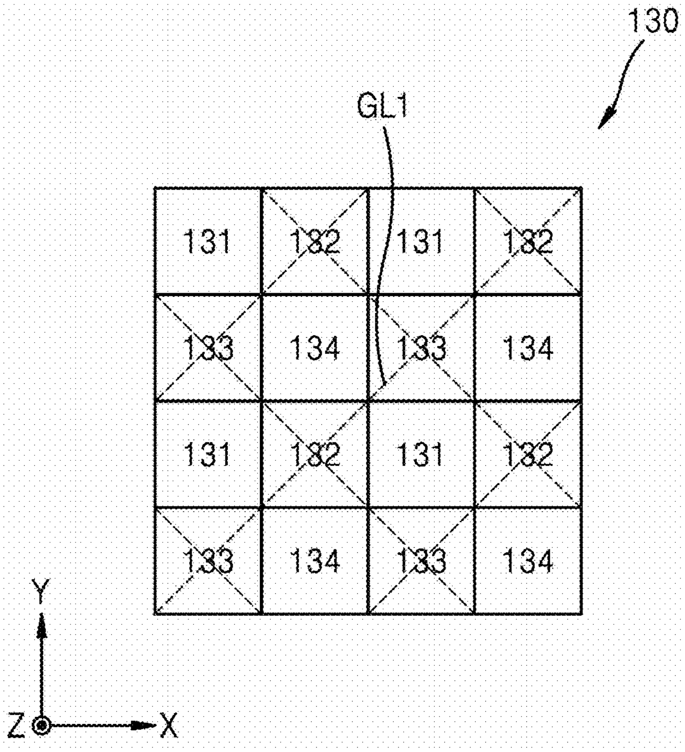
FIG. 12D is a diagram of an example of an array of a first green light concentration area.

FIG. 12C illustrates an example of a proceeding direction of green light incident on a first green light concentration area, and FIG. 12D is a diagram of an example of an array of a first green light concentration area.

The green light incident on the periphery of the first green pixel-corresponding area 131 may be concentrated on the first green pixel 111 by the color separating lens array 130, as shown in FIG. 12C, and the green light from the blue and red pixel-corresponding areas 132 and 133, in addition to the first green pixel-corresponding area 131, may be incident on the first green pixel 111. That is, according to the phase profile of the green light described with reference to FIG. 12A, the green light passed through the first green light concentration area GL1 connecting the center of the two blue pixel-corresponding areas 132 and the two red pixel-corresponding areas 133, which are adjacent to the first green pixel-corresponding area 131 by engaging one side of each area, may be concentrated on the first green pixel 111. Therefore, the color separating lens array 130 may operate as an array of the first green light concentration area GL1 concentrating green light on the first green pixel 111 as shown in FIG. 12D. The first green light concentration area GL1 may be, for example, 1.2 to 2 times greater than the corresponding first green pixel 111.

Figure 12E:
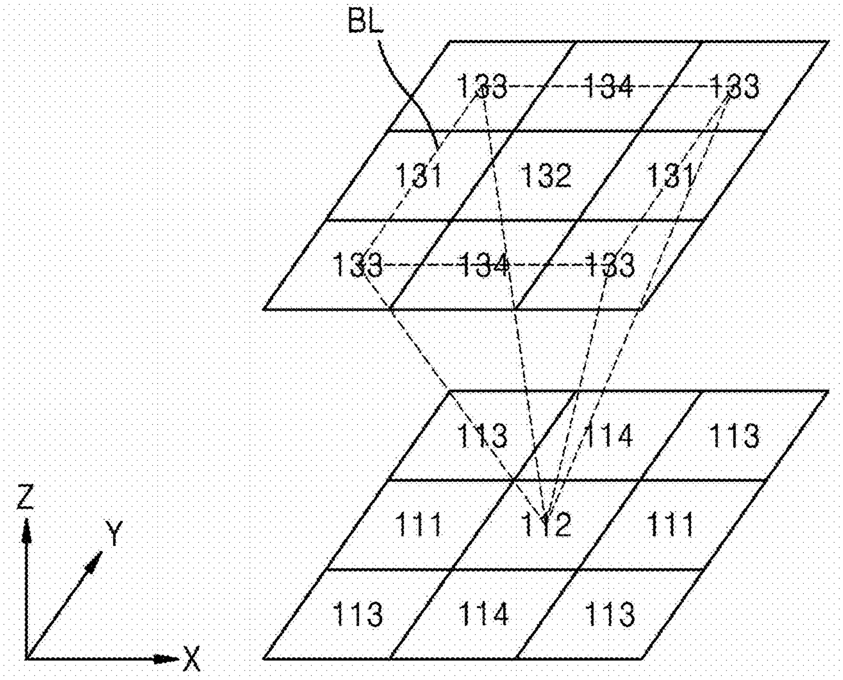
FIG. 12E illustrates an example of a proceeding direction of blue light incident on a blue light concentration area.
Figure 12F:
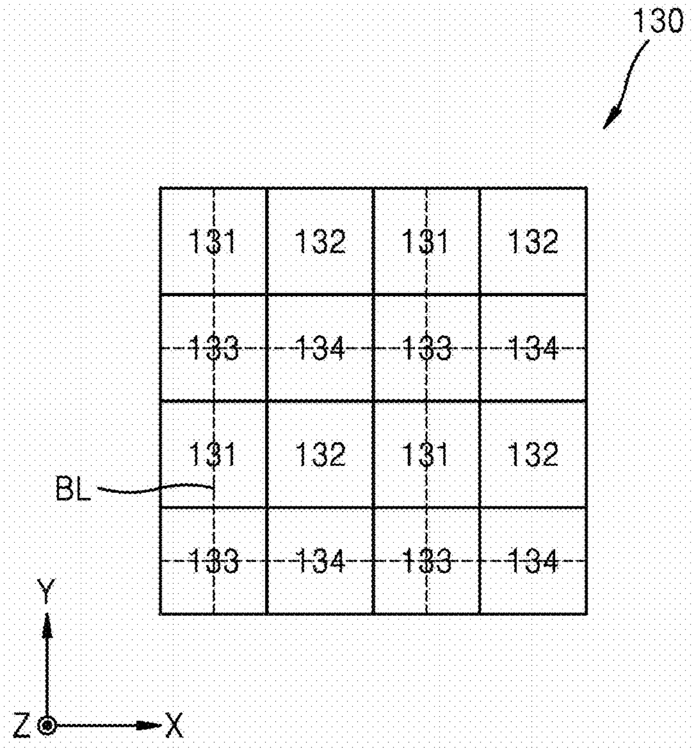
FIG. 12F is a diagram of an example of an array of a blue light concentration area.

FIG. 12E illustrates an example of a proceeding direction of blue light incident on a blue light concentration area, and FIG. 12F is a diagram of an example of an array of a blue light concentration area.

The blue light may be concentrated on the blue pixel 112 by the color separating lens array 130 as described in FIG. 12E, and blue light from the first green pixel-corresponding area 131, the blue pixel-corresponding area 132, the red pixel-corresponding area 133, and the second green pixel-corresponding area 134 may be incident on the blue pixel 112. That is, according to the phase profile of the blue light described with reference to FIG. 12B, the blue light passed through the blue light concentration area BL connecting the center of the four red pixel-corresponding areas 133, which are adjacent to the blue pixel-corresponding area 132 by engaging their vertexes, may be concentrated on the blue pixel 112. Therefore, the color separating lens array 130 may operate as an array of the blue light concentration area BL concentrating blue light on the blue pixel as shown in FIG. 12F. The blue light concentration area BL may be, for example, 1.5 to 4 times greater than the corresponding blue pixel 112. A part of the blue light concentration area BL may overlap with the first green light concentration area GL1, a second green light concentration area GL2 and a red light concentration area RL described below.

Figure 13A:
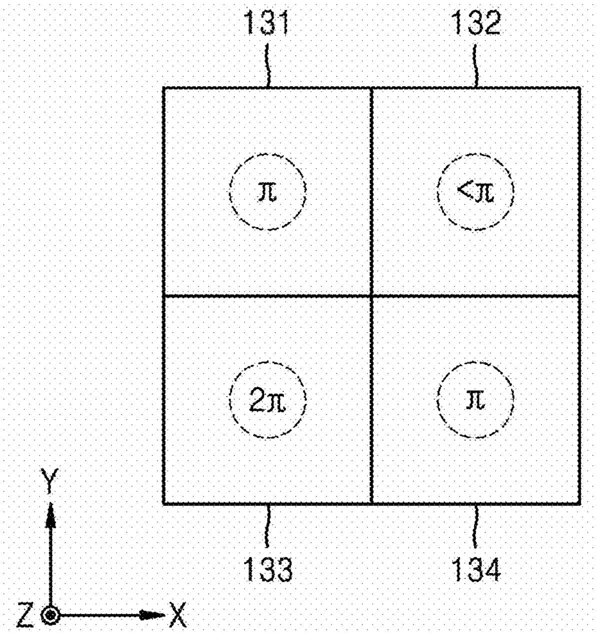
FIG. 13A is a diagram showing a phase in pixel-corresponding areas of red light passed through a color separating lens array.
Figure 13B:
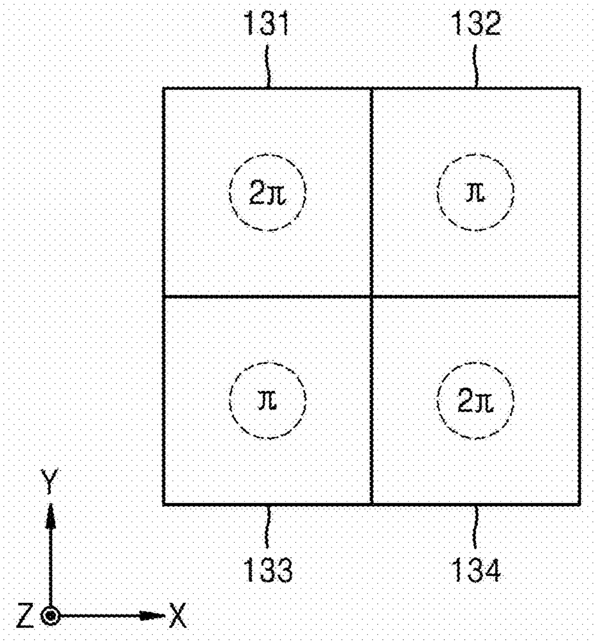
FIG. 13B is a diagram showing a phase in pixel-corresponding areas of green light passed through a color separating lens array.

FIG. 13A shows a phase of red light passed through the color separating lens array 130 in the first green pixel-corresponding area 131, the blue pixel-corresponding area 132, the red pixel-corresponding area 133, and the second green pixel-corresponding area 134, and FIG. 13B shows a phase of green light passed through the color separating lens array 130 in the first green pixel-corresponding area 131, the blue pixel-corresponding area 132, the red pixel-corresponding area 133, and the second green pixel-corresponding area 134.

With reference to FIG. 13A, a phase of red light at a position immediately after the red light has passed through the color separating lens array 130 may be maximized in the red pixel-corresponding area 133, may be minimized in the first and second green pixel-corresponding areas 131 and 134 in the X direction and the Y direction, and may be minimized in the blue pixel-corresponding area 132 in the diagonal direction. When the phase of the red light in the red pixel-corresponding area 133 is 2π, the phase in the first and second green pixel-corresponding areas 131 and 134 may be, for example, 0.9π to 1.1π, and the phase in the blue pixel-corresponding area 132 may be a value smaller than the phase in the first and second green pixel-corresponding areas 131 and 134, for example, 0.6π to 0.9π.

With reference to FIG. 13B, the green light passed through the color separating lens array 130 may be maximized in the second green pixel-corresponding area 134. The phase profiles of FIGS. 12A and 13B showing the profiles at the center of the first green pixel-corresponding area 131, the blue pixel-corresponding area 132, the red pixel-corresponding area 133, and the second green pixel-corresponding area 134 may be the same. To further explain the phase profile of the green light based on the second green pixel-corresponding area 134, when the phase of light emitted from the second green pixel-corresponding area 134 is 2π, light having a phase of 0.9π to 1.1π may be emitted from blue and red pixel-corresponding areas 132 and 133, light having a phase of 2π may be emitted from the first green pixel-corresponding area 131, and light having a phase of 1.1π to 1.5π may be emitted from the contact point between the first green pixel-corresponding area 131 and the second green pixel-corresponding area 134.

Figure 13C:
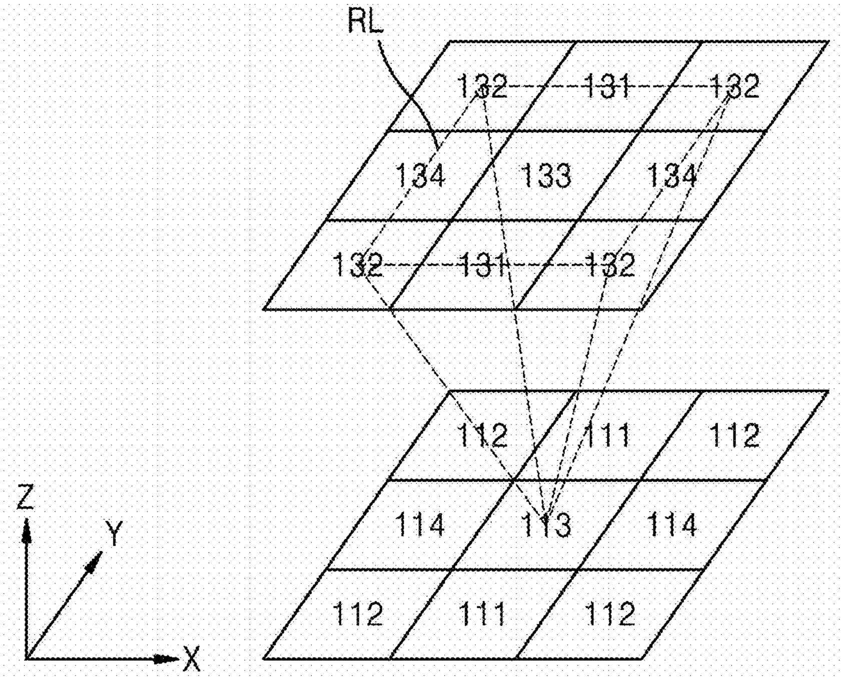
FIG. 13C illustrates an example of a proceeding direction of red light incident on a red light concentration area.
Figure 13D:
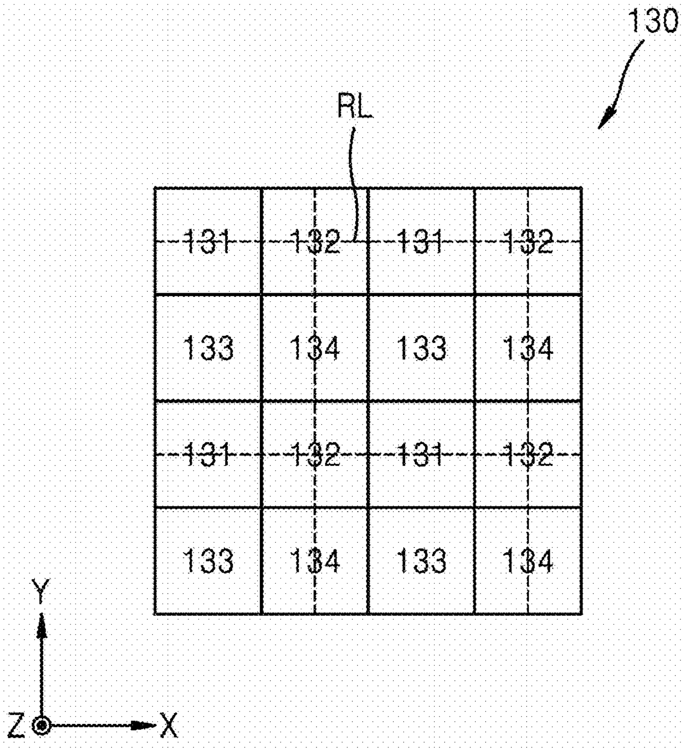
FIG. 13D is a diagram of an example of an array of a red light concentration area.

FIG. 13C illustrates an example of a proceeding direction of red light incident on a red light concentration area, and FIG. 13D is a diagram of an example of an array of a red light concentration area.

The red light may be concentrated on the red pixel 113 by the color separating lens array 130 as described in FIG. 13C, and red light from the first green pixel-corresponding area 131, the blue pixel-corresponding area 132, the red pixel-corresponding area 133, and the second green pixel-corresponding area 134 may be incident on the red pixel 113. According to the phase profile of the red light described with reference to FIG. 13A, the red light passed through the red light concentration area RL connecting the center of the four blue pixel-corresponding areas 132, which are adjacent to the red pixel-corresponding area 133 by engaging their vertexes, may be concentrated on the red pixel 113. Therefore, the color separating lens array 130 may operate as an array of the red light concentration area RL concentrating red light on the red pixel 113 as shown in FIG. 13D. The red light concentration area RL may be, for example, 1.5 to 4 times greater than the corresponding red pixel 113. A part of the red light concentration area RL may overlap with the first and second green light concentration areas GL1 and GL2 and the blue light concentration area BL.

Figure 13E:
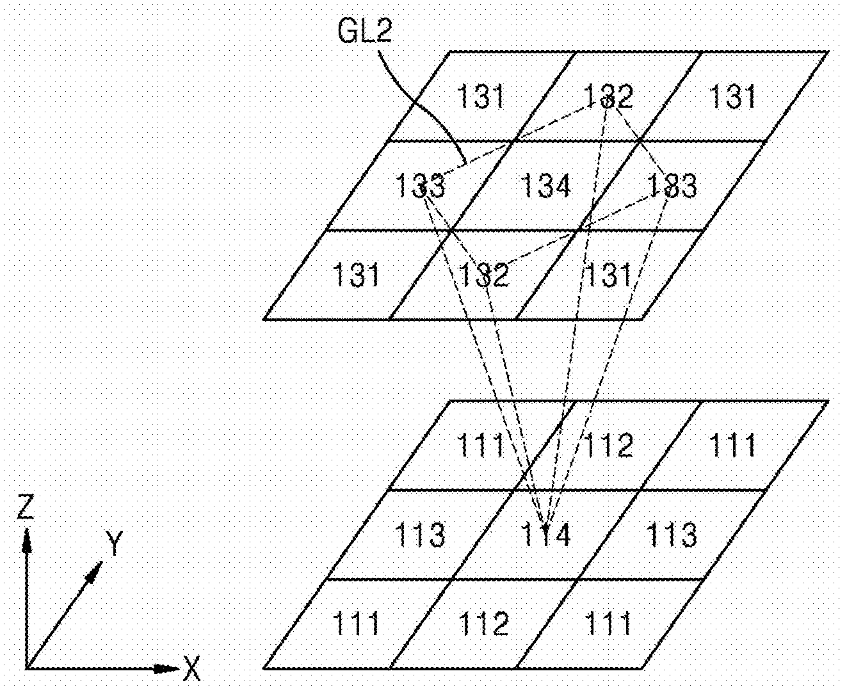
FIG. 13E illustrates an example of a proceeding direction of green light incident on a green light concentration area.
Figure 13F:
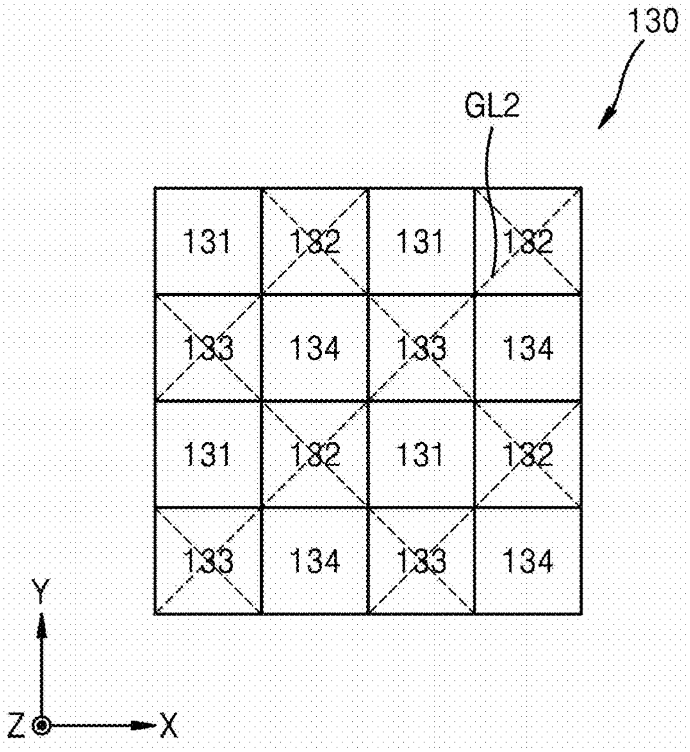
FIG. 13F is a diagram of an example of an array of a green light concentration area.

With reference to FIGS. 13E and 13F, the green light incident on the periphery of the second green pixel-corresponding area 134 may proceed in a similar way as the green light incident on the periphery of the first green pixel-corresponding area 131, and may be concentrated on the second green pixel 114 as illustrated in FIG. 13E. Therefore, the color separating lens array 130 may operate as an array of the second green light concentration area GL2 concentrating green light on the second green pixel 114 as shown in FIG. 13F. The second green light concentration area GL2 may be, for example, 1.2 to 2 times greater than the corresponding second green pixel 114.

The color separating lens array 130 of the image sensor 1000 according to an example embodiment may be designed automatically through computer simulation using various methods. For example, the structures of the first green pixel-corresponding area 131, the blue pixel-corresponding area 132, the red pixel-corresponding area 133, and the second green pixel-corresponding area 134 may be optimized by using nature-inspired algorithms, such as a genetic algorithm, particle swarm optimization algorithm, ant colony optimization, etc. or reverse engineering methods based on an adjoint optimization algorithm.

To design a color separating lens array, the performance of a plurality of color separating lens array candidates may be evaluated based on evaluation components, including a color separating spectrum, light efficiency, signal to noise ratio, and simultaneously, the structure of the green, blue, red, and infrared light-pixel corresponding areas may be optimized. For example, the structures of the green, blue, red, and infrared light pixel-corresponding areas may be optimized by, after predetermining target numerical values for each evaluation component, minimizing the sum of differences with the target numerical values for each evaluation component. Alternatively, the structure of the green, blue, red, and infrared light pixel-corresponding areas may be optimized by indexing the performance by each evaluation component so that the values representing the performance may be maximized.

The color separating lens array 130 as described above are exemplary, and various types of color separating lens array may be obtained through an optimization design according to a size and thickness of the color separating lens array, color characteristics and pixel pitch of an image sensor employing the color separating lens array, distance between the color separating lens array and the image sensor, incident angle of incident light, etc.

Figure 14A:
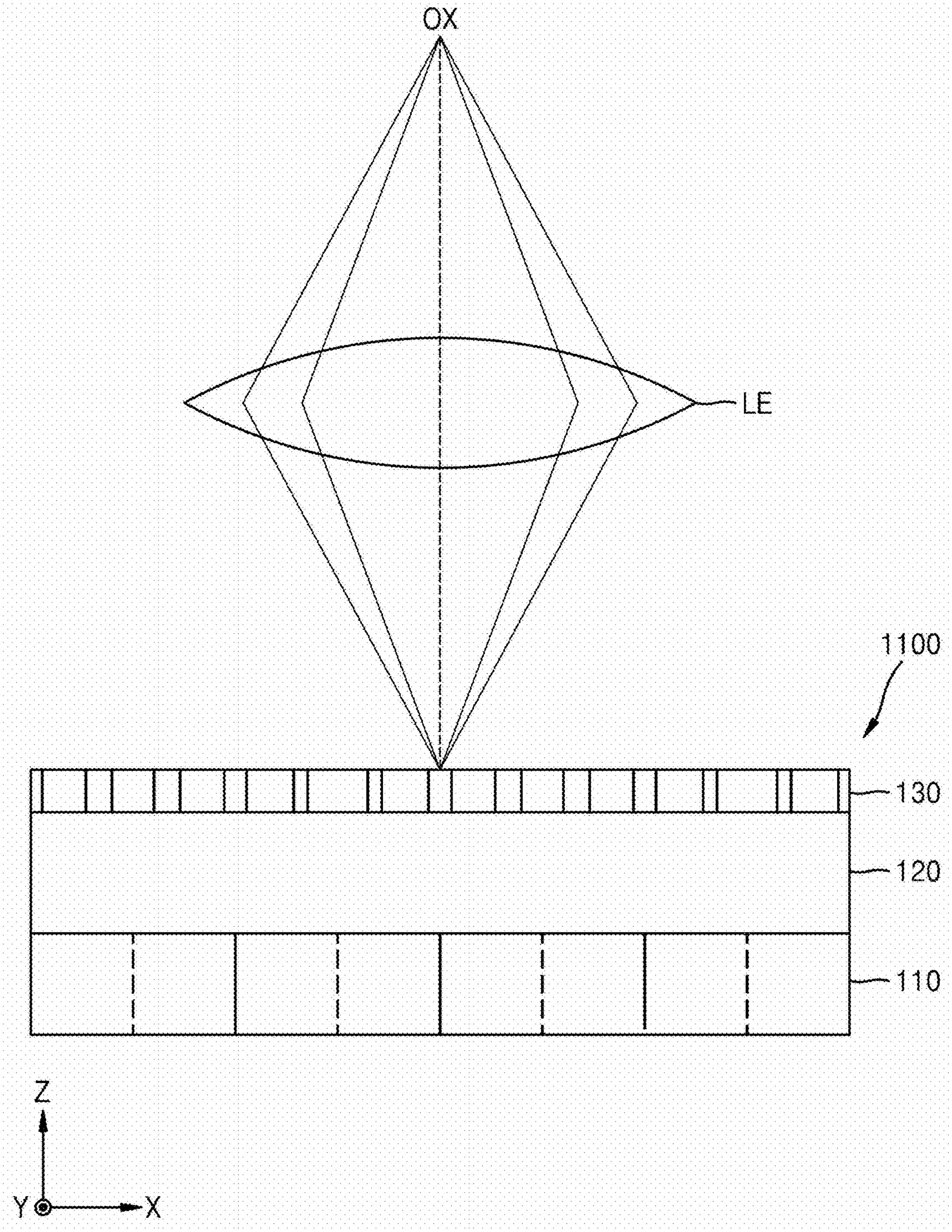
FIGS. 14A, 14B and 14C are diagrams exemplarily illustrating a change in distribution of light incident on a pixel array of an image sensors according to a change in distance between the pixel array of the image sensor and a lens to explain principles of an automatic focus function.
Figure 14B:
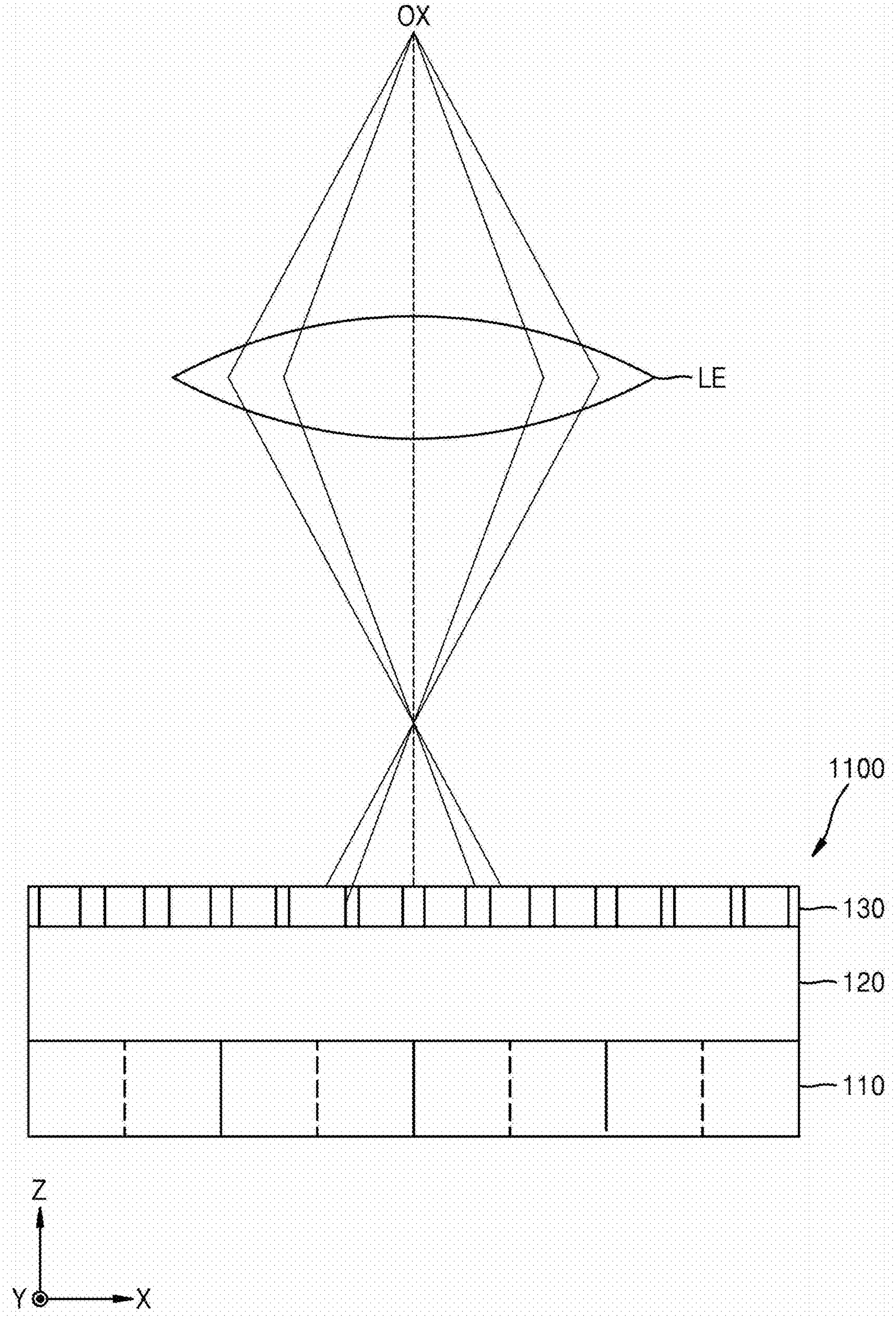
Figure 14C:
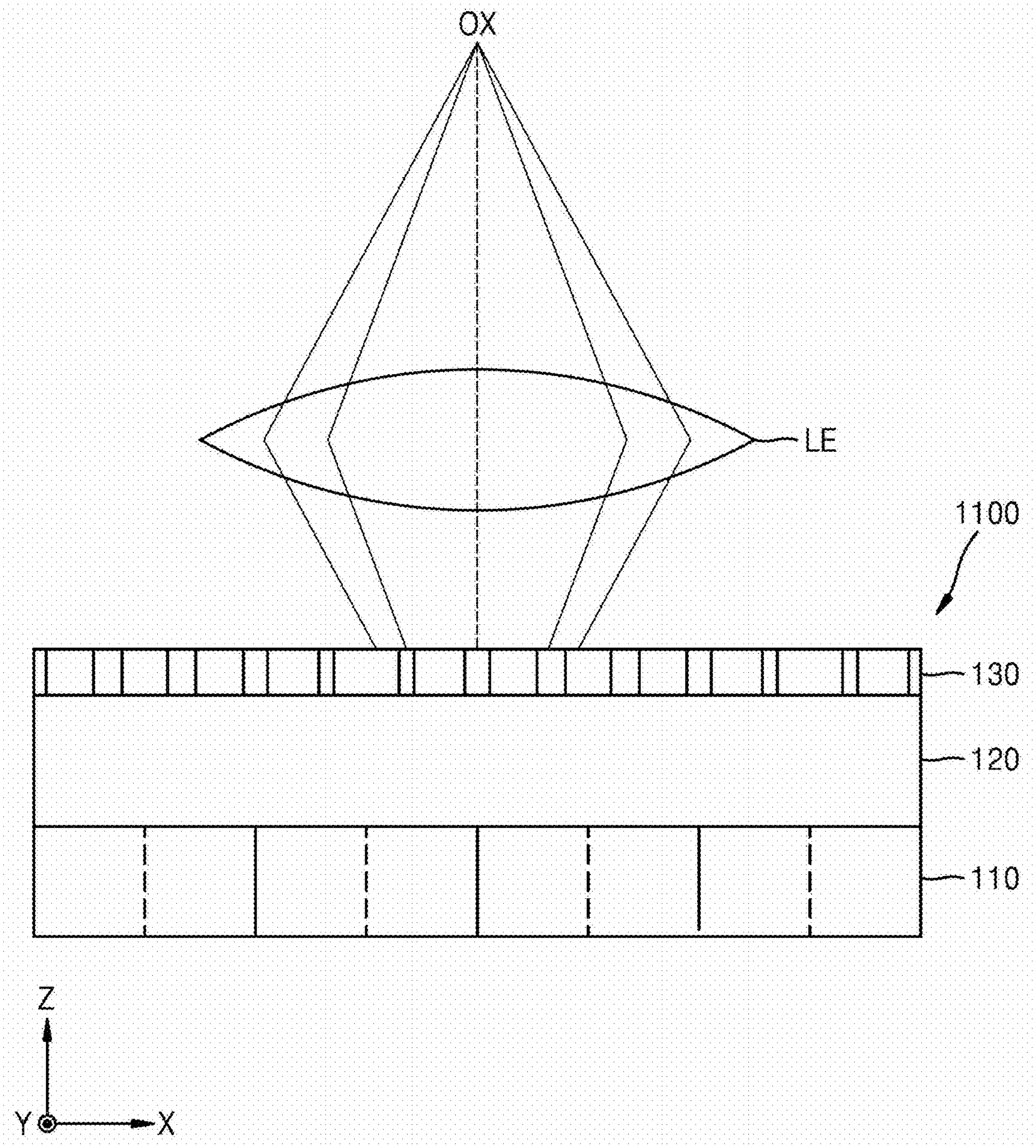

As described above, when at least one pixel of unit pixel includes a plurality of light sensing cells, the automatic focus function may be implemented by using a difference between signals obtained from each light sensing cell. FIGS. 14A to 14C are diagrams exemplarily illustrating a change in distribution of light incident on a pixel array of an image sensors according to a change in a distance between the pixel array of the image sensor and a lens to explain principles of the automatic focus function.

FIG. 14A illustrates an example in which a focus of a lens LE is formed on a surface of the pixel array 1100. In this case, the light departing from a point on an optical axis OX arranged on an object side of the lens LE and passed through either edge of the lens LE may be concentrated on a point on a surface of the pixel array 1100. Therefore, when the focus is accurately applied, the light departing from a point and passed through both edge of the lens LE may be incident on each pixel of the pixel array 1100 with the same intensity. FIG. 14B illustrates an example in which a focus of a lens LE is formed in front of a surface of the pixel array 1100. In this case, the lights departing from a point on an optical axis OX arranged on an object side of the lens LE and passed through both edge of the lens LE may be inclinedly incident on different points on a surface of the pixel array 1100 while crossing a focal point. For example, the light passed through the left edge of the lens LE may be inclinedly incident on a point on the surface of the pixel array 1100 on the right of the optical axis OX after passing the focus, and the light passed through the right edge of the lens LE may be inclinedly incident on a point on the surface of the pixel array 1100 on the left of the optical axis OX after passing the focus. FIG. 14C illustrates an example in which a focus of the lens LE is formed in the rear of a surface of the pixel array 1100. In this case, the light departing from a point on an optical axis OX arranged on an object side of the lens LE and passed through both edges of the lens LE may be inclinedly incident on different points on a surface of the pixel array 1100 before reaching the focus. For example, the light passed through the left edge of the lens LE may be inclinedly incident on a point on the surface of the pixel array 1100 on the left of the optical axis OX before reaching the focus, and the light passed through the right edge of the lens LE may be inclinedly incident on a point on the surface of the pixel array 1100 on the right of the optical axis OX. Therefore, when the focus is not accurately applied, as shown in FIGS. 14B and 14C, the light departing from a point and passed through both edges of the lens LE may be incident on different pixels of the pixel array 1100. Then, the light passed through either one of the edges of the lens LE of the light departing from one point may be inclinedly incident.

Figure 15A:
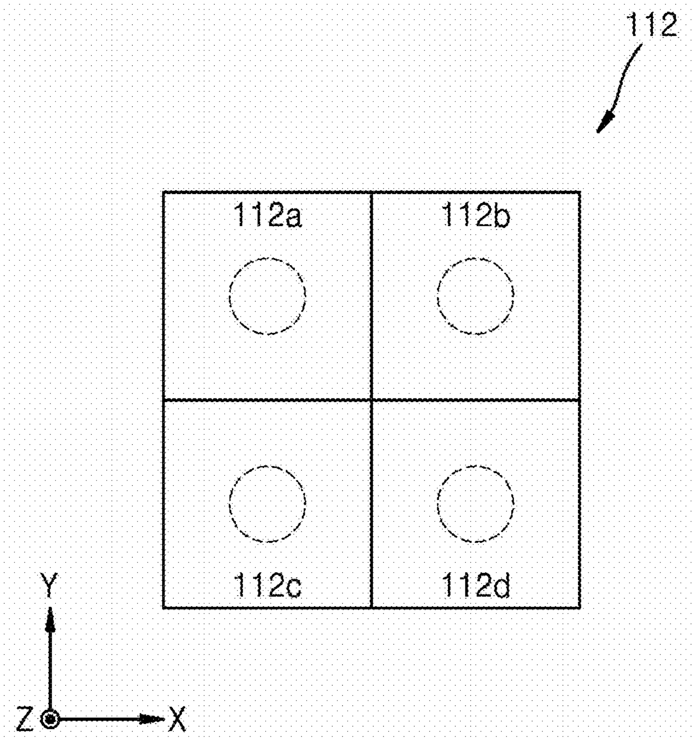
FIG. 15A exemplarily illustrates a light distribution formed on a sensor substrate when light is vertically incident on a pixel array of an image sensor, and FIG. 15B exemplarily illustrates a light distribution formed on a sensor substrate when light is inclinedly incident on a pixel array of an image sensor.
Figure 15B:
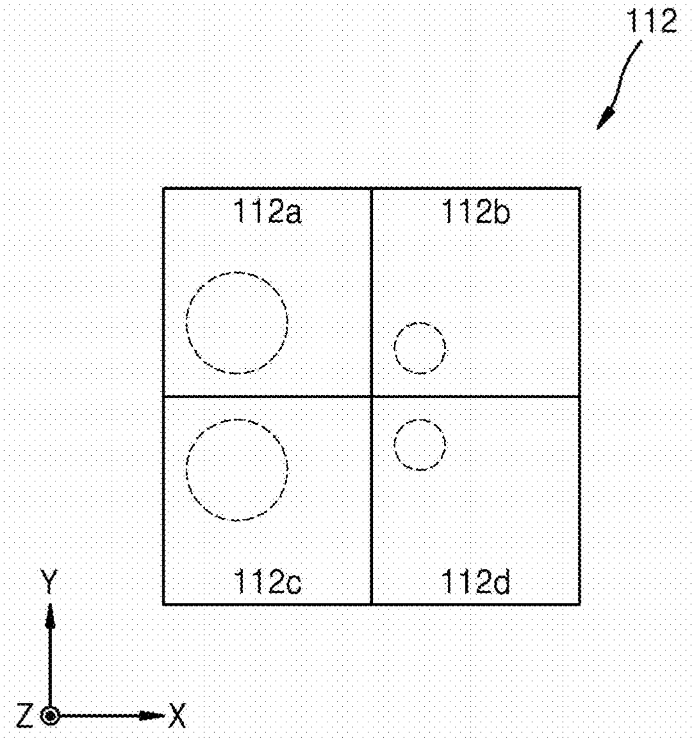

FIG. 15A exemplarily illustrates a light distribution formed on a sensor substrate when light is vertically incident on a pixel array of an image sensor, and FIG. 15B exemplarily illustrates a light distribution formed on a sensor substrate when light is inclinedly incident on a pixel array of an image sensor.

With reference to FIG. 15A, when the blue light incident vertically on the blue light concentration area of the color separating lens array 130 is focused on the blue pixel 112, four light concentration parts may be formed uniformly in light sensing cells 112*a*, 112*b*, 112*c*, and 112*d* of the blue pixel 112. On the contrary, with reference to FIG. 15B, when the blue light incident in an inclined manner on the blue light concentration area of the color separating lens array 130 is focused on the blue pixel 112, four light concentration parts may be formed ununiformly in the light sensing cells 112*a*, 112*b*, 112*c*, and 112*d* of the blue pixel 112. In comparison with FIG. 15A, the four light concentration parts may be located biased to the left, and the area or intensity of the light concentration parts formed in the left light sensing cells 112*a* and 112*c* may be greater than those of the light concentration parts formed in the right light sensing cells 112*b* and 112*d*. The shift direction of the light concentration part and the size of the light concentration part may vary according to a distance between the pixel array 1100 and a focus and a relative position of a pixel on the pixel array 1100. Although FIGS. 15A and 15B only illustrate blue light as an example, green light and red light may also form a light distribution similar to the light distribution shown in FIGS. 15A and 15B.

As described above, as one pixel includes a plurality of light sensing cells configured to independently sense light, by using the difference between signals output from the plurality of light sensing cells, an automatic focus signal may be provided in a phase-detection auto-focus manner.

Figure 16:
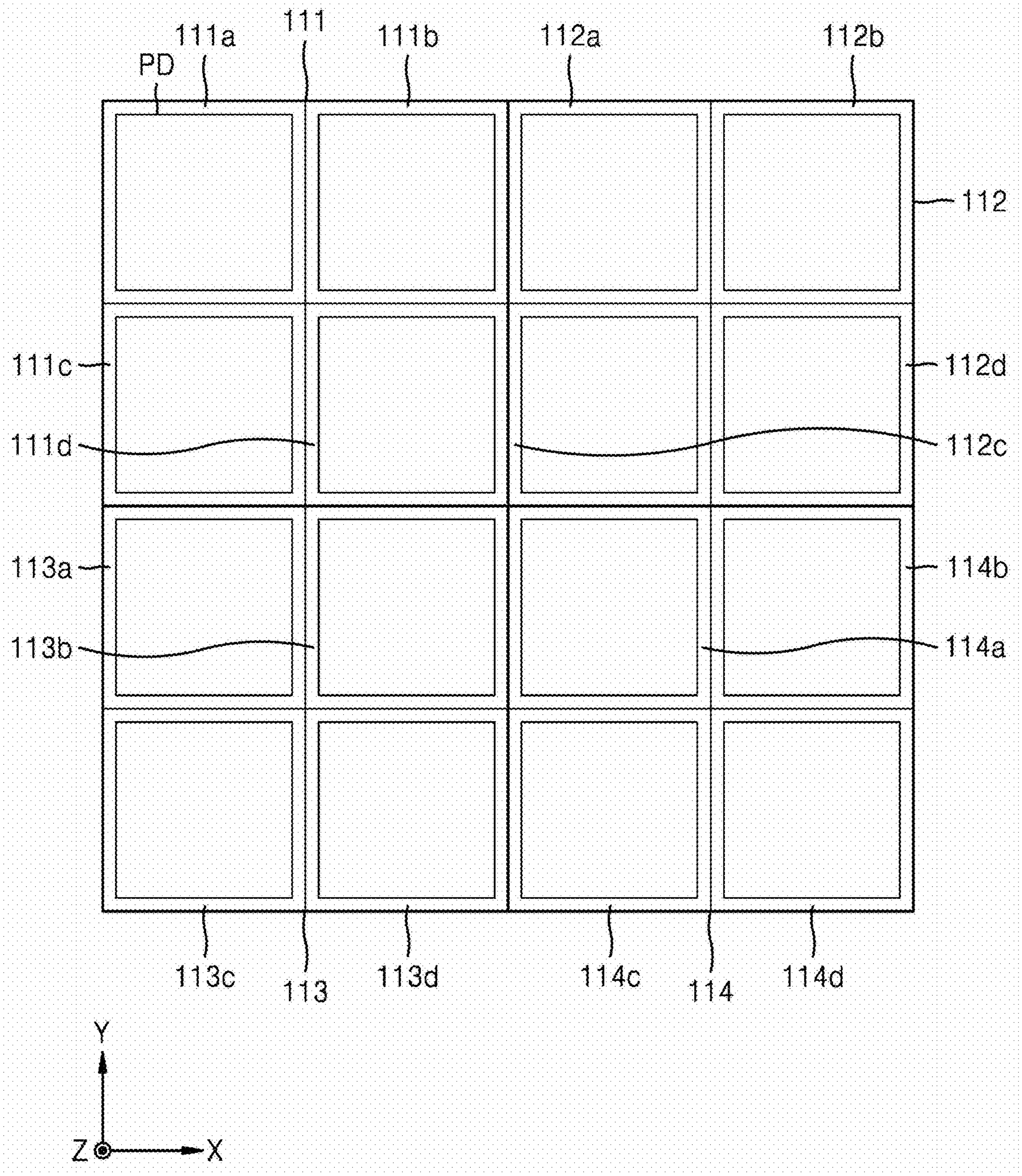
FIGS. 16 to 18 are planar views showing an example structure of a pixel array of an image sensor according to an example embodiment for providing an automatic focus signal by a phase-detection auto-focus method.
Figure 17:
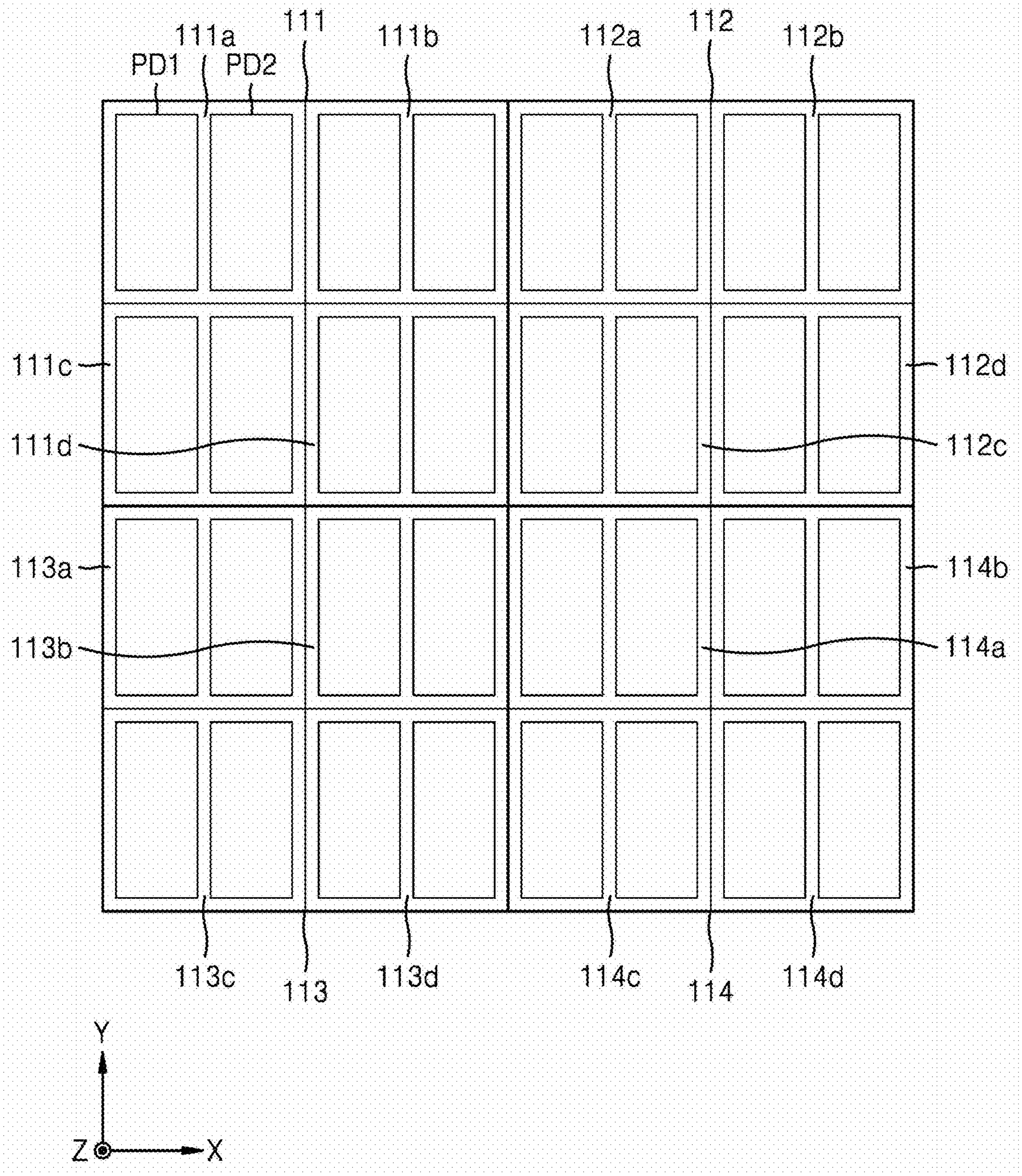
Figure 18:
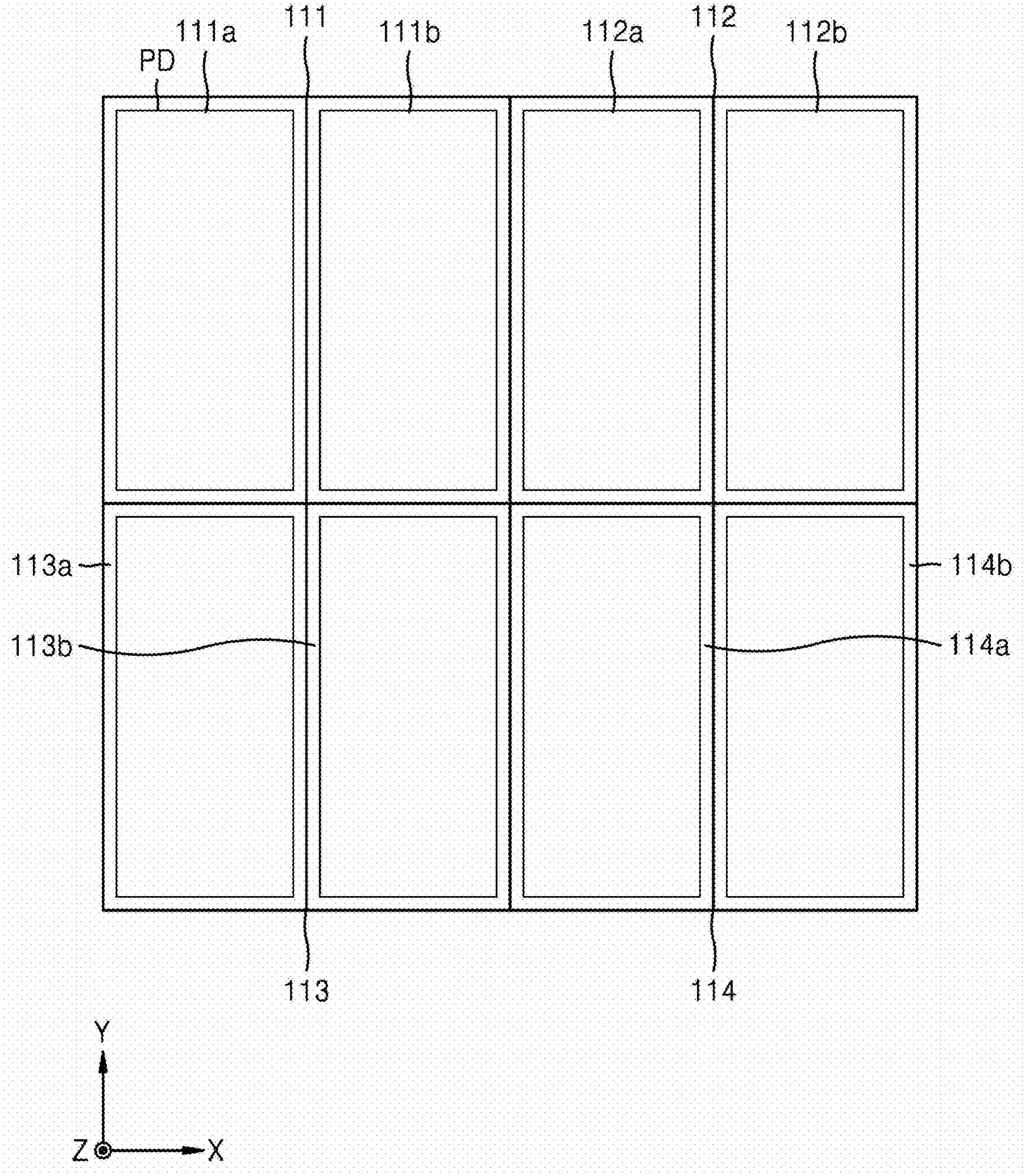

FIGS. 16 to 18 are planar views showing an example structure of a pixel array of an image sensor according to an example embodiment for providing an automatic focus signal in a phase-detection auto-focus method.

With reference to FIG. 16, when each of the first green pixel 111, the blue pixel 112, the red pixel 113, and the second green pixel 114 includes four light sensing cells arranged in 2×2 array, each of the light sensing cells of the pixels may include only one photodiode PD. In the case of blue pixel 112, for example, a light sensing signal output from a photodiode PD of the first and third blue light sensing cells 112*a* and 112*c* and a light sensing signal output from a photodiode PD of the second and fourth blue light sensing cells 112*b* and 112*d* may be detected, and accordingly, an automatic focus signal may be obtained from a difference between the light sensing signal of the first and third blue light sensing cells 112*a* and 112*c* and the light sensing signal of the second and fourth blue light sensing cells 112*b* and 112*d*.

FIG. 17 is a planar view showing an example structure of a pixel array of an image sensor according to another example embodiment for providing an automatic focus signal in a phase-detection auto-focus method.

With reference to FIG. 17, when each of the first green pixel 111, the blue pixel 112, the red pixel 113, and the second green pixel 114 includes four light sensing cells arranged in 2×2 array, each of the light sensing cells of the first green pixel 111, the blue pixel 112, the red pixel 113, and the second green pixel 114 may include a plurality of photodiodes arranged in the X direction, for example, a first photodiode PD1 and a second photodiode PD2. The first photodiode PD1 and the second photodiode PD2 in one light sensing cell may independently output a light sensing signal. In other words, each pixel may include a plurality of independent light sensing cells, and each of the light sensing cells may include two independent photodiodes, i.e., first and second photodiodes PD1 and PD2. A general image signal of each of the light sensing cells may be obtained by combining light sensing signals of the first photodiode PD1 and the second photodiode PD2.

In the above pixel structure, one pixel may be divided into edge areas spaced apart from each other in the X direction, and a middle area between the edge areas. To obtain a high contrast ratio, the automatic focus signal may be obtained from a difference between the light sensing signals output from the two photodiodes arranged in the edge areas most spaced apart from each other in the X direction. In the case of blue pixel 112, for example, the first photodiode PD1 of the first blue light sensing cell 112*a* arranged in the left edge area in the blue pixel 112 is most spaced apart from the second photodiode PD2 of the second blue light sensing cell 112*b* arranged in the right edge area in the X direction. Also, the first photodiode PD1 of the third blue light sensing cell 112*c* in the blue pixel 112 is most spaced apart from the second photodiode PD2 of the fourth blue light sensing cell 112*d* in the X direction.

Accordingly, the automatic focus signal may be obtained from a difference between the light sensing signal output from the first photodiode PD1 of the first blue light sensing cell 112*a* of the blue pixel 112 and the light sensing signal output from the second photodiode PD2 of the second blue light sensing cell 112*b* of the blue pixel 112. Alternatively, the automatic focus signal may be obtained from a difference between the light sensing signal output from the first photodiode PD1 of the third blue light sensing cell 112*c* and the light sensing signal output from the second photodiode PD2 of the fourth blue light sensing cell 112*d*. Alternatively, the automatic focus signal may be obtained from a difference between the sum of the light sensing signals output from the first photodiode PD1 of the first blue light sensing cell 112*a* and the first photodiode PD1 of the third blue light sensing cell 112*c* and the sum of the light sensing signals output from the second photodiode PD2 of the second blue light sensing cell 112*b* and the second photodiode PD2 of the fourth blue light sensing cell 112*d*.

For another example, when each of the light sensing cells of the first green pixel 111, the blue pixel 112, the red pixel 113, and the second green pixel 114 includes a plurality of photodiodes arranged in the X direction, for example, the first photodiode PD1 and the second photodiode PD2, a light sensing signal output from the first and second photodiodes PD1 and PD2 of the first and third blue light sensing cells 112*a* and 112*c* and a light sensing signal output from the first and second photodiodes PD1 and PD2 of the second and fourth blue light sensing cells 112*b* and 112*d* may be detected, and accordingly, an automatic focus signal may be obtained from a difference between the light sensing signal of the first and third blue light sensing cells 112*a* and 112*c* and the light sensing signal of the second and fourth blue light sensing cells 112*b* and 112*d*.

The automatic focus signal may be obtained in the first green pixel 111, the red pixel 113 and the second green pixel 113 in the same manner as it is obtained in the blue pixel 112. The automatic focus signal may be obtained through every pixels in the image sensor or obtained through some selected pixels in the image sensor.

FIGS. 16 and 17 illustrate that one pixel has four light sensing cells arranged in 2×2 array; however, the example embodiment is not limited thereto.

For example, as shown in FIG. 18, one pixel may include a first and second light sensing cells arranged in the first direction (X direction), and each of the first and second light sensing cells may include one photodiode PD. For example, the blue pixel 112 may include the first and second light sensing cells 112*a* and 112*b* arranged in the first direction (X direction), and each of the first and second light sensing cells 112*a* and 112*b* may include one photodiode. For another example, when the blue pixel 112 includes the first and second light sensing cells 112*a* and 112*b* arranged in the first direction (X direction), each of the first and second light sensing cells 112*a* and 112*b* may include a plurality of photodiodes arranged in the first direction (X direction). In this case, when the color separating lens array 130 according to an example embodiment has a nanopost array of various structures described above, a nanopost may not be located at the first position in the horizontal direction on the DTI structure between the first and second light sensing cells 112*a* and 112*b*, and the automatic focus signal may be obtained from a difference between a light sensing signal of the first light sensing cell 112*a* and a light sensing signal of the second light sensing cell 112*b*. Further, the automatic focus signal may be obtained in the green pixel 111, the red pixel 113 and the second green pixel 113 in the same manner as it is obtained in the blue pixel 112. The automatic focus signal may be obtained through every pixels in the image sensor or obtained through some selected pixels in the image sensor.

For another example, one pixel of unit pixel may include nine light sensing cells arranged in 3×3 array, sixteen light sensing cells arranged in 4×4 array, or a plurality of light sensing cells arranged in greater arrays.

As the image sensor 1000 including the pixel array 1100 described above hardly causes optical loss by a color filter, for example, an organic color filter, even though the size of pixels becomes smaller, sufficient light may be provided to the pixels. Accordingly, it is possible to manufacture an ultra-high resolution and high-sensitivity ultra-small image sensor having hundreds of millions of pixels or more. Such ultra-high resolution and high-sensitivity ultra-small image sensor may be employed in various high performance optical devices or high performance electronic devices. The electronic devices may include, for example, smartphones, mobile phones, cellular phones, personal digital assistants (PDA), laptop computers, personal computers (PC), various portable devices, home appliances, security cameras, medical cameras, automobiles, Internet of Things (IoT) devices, and other mobile or no-mobile computing devices, but the disclosure is not limited thereto.

The electronic devices may further include, in addition to the image sensor 1000, a processor for controlling an image sensor, for example, an application processor (AP), control a number of hardware or software constituent elements by driving operating systems or application programs through the processor, and perform various data processing and calculations. The processors may further include graphics processing units (GPU) and/or image signal processors. The processor may control operations of the image sensor 1000, and store and output a signal generated by the image sensor 1000. That is, when the processors include image signal processors, an image (or video) obtained through an image sensor may be stored and/or output using the processor. In addition, the processor may receive a light sensing signal of a plurality of light sensing cells in each pixel of the image sensor and generate an automatic focus signal based on a difference between the light sensing signals.

FIG. 19 is a schematic block diagram of an electronic device ED01 including the image sensor 1000, according to an example embodiment.

Referring to FIG. 19, in a network environment ED00, the electronic device ED01 may communicate with another electronic device ED02 through a first network ED98 (short-range wireless communication network, and the like), or communicate with another electronic device ED04 and/or a server ED08 through a second network ED99 (long-range wireless communication network, and the like). The electronic device ED01 may communicate with the electronic device ED04 through the server ED08. The electronic device ED01 may include a processor ED20, a memory ED30, an input device ED50, an audio output device ED55, a display device ED60, an audio module ED70, a sensor module ED76, an interface ED77, a haptic module ED79, a camera module ED80, a power management module ED88, a battery ED89, a communication module ED90, a subscriber identification module ED96, and/or an antenna module ED97. In the electronic device ED01, some (the display device ED60, and the like) of constituent elements may be omitted or other constituent elements may be added. Some of the constituent elements may be implemented by one integrated circuit. For example, the sensor module ED76 (a fingerprint sensor, an iris sensor, an illuminance sensor, and the like) may be implemented by being embedded in the display device ED60 (a display, and the like).

The processor ED20 may control one or a plurality of other constituent elements (hardware and software constituent elements, and the like) of the electronic device ED01 connected to the processor ED20 by executing software (a program ED40, and the like), and perform various data processing or calculations. As part of the data processing or calculations, the processor ED20 may load, in a volatile memory ED32, commands and/or data received from other constituent elements (the sensor module ED76, the communication module ED90, and the like), process the command and/or data stored in the volatile memory ED32, and store result data in a non-volatile memory ED34. The processor ED20 may include a main processor ED21 (a central processing unit, an application processor, and the like) and an auxiliary processor ED23 (a graphics processing unit, an image signal processor, a sensor hub processor, a communication processor, and the like) that is operable independently of or together with the main processor ED21. The auxiliary processor ED23 may use less power than the main processor ED21 and may perform a specialized function.

Instead of the main processor ED21 when the main processor ED21 is in an inactive state (sleep state), or with the main processor ED21 when the main processor ED21 is in an active state (application execution state), the auxiliary processor ED23 may control functions and/or states related to some constituent elements (the display device ED60, the sensor module ED76, the communication module ED90, and the like) of the constituent elements of the electronic device ED01. The auxiliary processor ED23 (an image signal processor, a communication processor, and the like) may be implemented as a part of functionally related other constituent elements (the camera module ED80, the communication module ED90, and the like).

The memory ED30 may store various data needed by the constituent elements (the processor ED20, the sensor module ED76, and the like) of the electronic device ED01. The data may include, for example, software (the program ED40, and the like) and input data and/or output data about commands related thereto. The memory ED30 may include the volatile memory ED32 and/or the non-volatile memory ED34. The non-volatile memory ED34 may include an internal memory ED36 fixedly installed in the electronic device ED01 and an external memory ED38 that is removable.

The program ED40 may be stored in the memory ED30 as software, and may include an operating system ED42, middleware ED44, and/or an application ED46.

The input device ED50 may receive commands and/or data to be used for constituent elements (the processor ED20, and the like) of the electronic device ED01, from the outside (a user, and the like) of the electronic device ED01. The input device ED50 may include a microphone, a mouse, a keyboard, and/or a digital pen (a stylus pen, and the like).

The audio output device ED55 may output an audio signal to the outside of the electronic device ED01. The audio output device ED55 may include a speaker and/or a receiver. The speaker may be used for general purposes such as multimedia playback or recording playback, and the receiver can be used to receive incoming calls. The receiver may be implemented by being coupled as a part of the speaker or by an independent separate device.

The display device ED60 may visually provide information to the outside of the electronic device ED01. The display device ED60 may include a display, a hologram device, or a projector, and a control circuit to control a corresponding device. The display device ED60 may include a touch circuitry set to detect a touch and/or a sensor circuit (a pressure sensor, and the like) set to measure the strength of a force generated by the touch.

The audio module ED70 may convert sound into electrical signals or reversely electrical signals into sound. The audio module ED70 may obtain sound through the input device ED50, or output sound through a speaker and/or a headphone of another electronic device (the electronic device ED02, and the like) connected to the audio output device ED55 and/or the electronic device ED01 in a wired or wireless manner.

The sensor module ED76 may detect an operation state (power, temperature, and the like) of the electronic device ED01, or an external environment state (a user state, and the like), and generate an electrical signal and/or a data value corresponding to a detected state. The sensor module ED76 may include a gesture sensor, a gyro sensor, a barometric pressure sensor, a magnetic sensor, an acceleration sensor, a grip sensor, a proximity sensor, a color sensor, an IR sensor, a biometric sensor, a temperature sensor, a humidity sensor, and/or an illuminance sensor.

The interface ED77 may support one or a plurality of specified protocols used for the electronic device ED01 to be connected to another electronic device (the electronic device ED02, and the like) in a wired or wireless manner. The interface ED77 may include a high definition multimedia interface (HDMI), a universal serial bus (USB) interface, an SD card interface, and/or an audio interface.

A connection terminal ED78 may include a connector for the electronic device ED01 to be physically connected to another electronic device (the electronic device ED02, and the like). The connection terminal ED78 may include an HDMI connector, a USB connector, an SD card connector, and/or an audio connector (a headphone connector, and the like).

The haptic module ED79 may convert electrical signals into mechanical stimuli (vibrations, movements, and the like) or electrical stimuli that are perceivable by a user through tactile or motor sensations. The haptic module ED79 may include a motor, a piezoelectric device, and/or an electrical stimulation device.

The camera module ED80 may capture a still image and a video. The camera module ED80 may include a lens assembly including one or a plurality of lenses, the image sensor 1000 of FIG. 1, image signal processors, and/or flashes. The lens assembly included in the camera module ED80 may collect light emitted from a subject for image capturing.

The power management module ED88 may manage power supplied to the electronic device ED01. The power management module ED88 may be implemented as a part of a power management integrated circuit (PMIC).

The battery ED89 may supply power to the constituent elements of the electronic device ED01. The battery ED89 may include non-rechargeable primary cells, rechargeable secondary cells, and/or fuel cells.

The communication module ED90 may establish a wired communication channel and/or a wireless communication channel between the electronic device ED01 and another electronic device (the electronic device ED02, the electronic device ED04, the server ED08, and the like), and support a communication through an established communication channel. The communication module ED90 may be operated independent of the processor ED20 (the application processor, and the like), and may include one or a plurality of communication processors supporting a wired communication and/or a wireless communication. The communication module ED90 may include a wireless communication module ED92 (a cellular communication module, a short-range wireless communication module, a global navigation satellite system (GNSS) communication module, and the like), and/or a wired communication module ED94 (a local area network (LAN) communication module, a power line communication module, and the like). Among the above communication modules, a corresponding communication module may communicate with another electronic device through the first network ED98 (a short-range communication network such as Bluetooth, WiFi Direct, or infrared data association (IrDA)) or the second network ED99 (a long-range communication network such as a cellular network, the Internet, or a computer network (LAN, WAN, and the like)). These various types of communication modules may be integrated into one constituent element (a single chip, and the like), or may be implemented as a plurality of separate constituent elements (multiple chips). The wireless communication module ED92 may verify and authenticate the electronic device ED01 in a communication network such as the first network ED98 and/or the second network ED99 by using subscriber information (an international mobile subscriber identifier (IMSI), and the like) stored in the subscriber identification module ED96.

The antenna module ED97 may transmit signals and/or power to the outside (another electronic device, and the like) or receive signals and/or power from the outside. An antenna may include an emitter formed in a conductive pattern on a substrate (a printed circuit board (PCB), and the like). The antenna module ED97 may include one or a plurality of antennas. When the antenna module ED97 includes a plurality of antennas, the communication module ED90 may select, from among the antennas, an appropriate antenna for a communication method used in a communication network such as the first network ED98 and/or the second network ED99. Signals and/or power may be transmitted or received between the communication module ED90 and another electronic device through the selected antenna. Other parts (an RFIC, and the like) than the antenna may be included as a part of the antenna module ED97.

Some of the constituent elements may be connected to each other through a communication method between peripheral devices (a bus, general purpose input and output (GPIO), a serial peripheral interface (SPI), a mobile industry processor interface (MIPI), and the like) and may mutually exchange signals (commands, data, and the like).

The command or data may be transmitted or received between the electronic device ED01 and the external electronic device ED04 through the server ED08 connected to the second network ED99. The electronic devices ED02 and ED04 may be of a type that is the same as or different from the electronic device ED01. All or a part of operations executed in the electronic device ED01 may be executed in one or a plurality of the electronic devices (ED02, ED04, and ED08). For example, when the electronic device ED01 needs to perform a function or service, the electronic device ED01 may request one or a plurality of electronic devices to perform part of the whole of the function or service, instead of performing the function or service. The one or a plurality of the electronic devices receiving the request may perform additional function or service related to the request, and transmit a result of the performance to the electronic device ED01. To this end, cloud computing, distributed computing, and/or client-server computing technology may be used.

Figure 20:
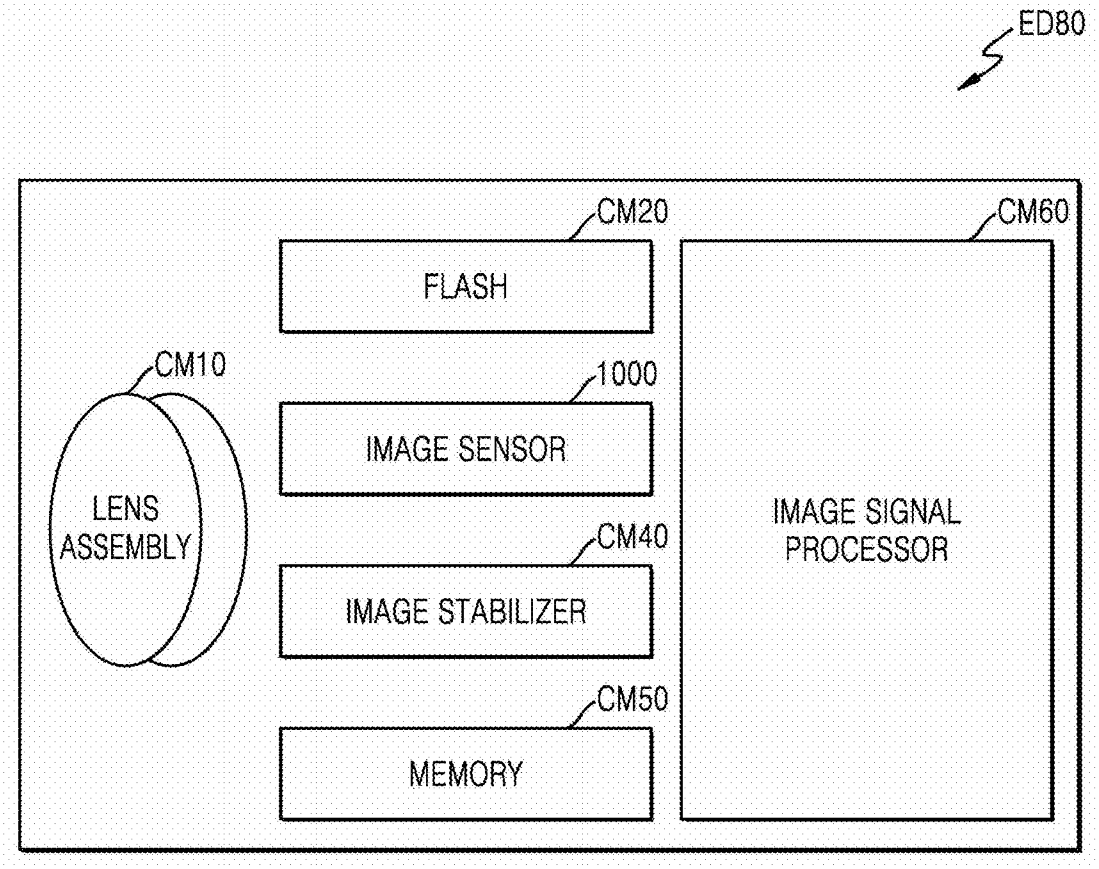
FIG. 20 is a block diagram of a camera module of FIG. 19.

FIG. 20 is a schematic block diagram of the camera module ED80 of FIG. 19.

Referring to FIG. 20, the camera module ED80 may include a lens assembly CM10, a flash CM20, the image sensor 1000 (the image sensor 1000 of FIG. 1, and the like), an image stabilizer CM40, a memory CM50 (a buffer memory, and the like), and/or an image signal processor CM60. The lens assembly CM10 may collect light emitted from a subject for image capturing. The camera module ED80 may include a plurality of lens assemblies CM10, and in this case, the camera module ED80 may include a dual camera, a 360 degrees camera, or a spherical camera. Some of the lens assemblies CM10 may have the same lens attributes (a viewing angle, a focal length, auto focus, F Number, optical zoom, and the like), or different lens attributes. The lens assembly CM10 may include a wide angle lens or a telescopic lens.

The flash CM20 may emit light used to reinforce light emitted or reflected from a subject. The flash CM20 may include one or a plurality of light-emitting diodes (a red-green-blue (RGB) LED, a white LED, an infrared LED, an ultraviolet LED, and the like), and/or a xenon lamp. The image sensor 1000 may include the image sensor of FIG. 1, and convert light emitted or reflected from the subject and transmitted through the lens assembly CM10 into electrical signals, thereby obtaining an image corresponding to the subject. The image sensor 1000 may include one or a plurality of sensors selected from image sensors having different attributes such as an RGB sensor, a black and white (BW) sensor, an IR sensor, or UV sensor. Each sensor included in the image sensor 1000 may be implemented by a charged coupled device (CCD) sensor and/or a complementary metal oxide semiconductor (CMOS) sensor.

The image stabilizer CM40 may move, in response to a movement of the camera module ED80 or an electronic device ED01 including the same, one or a plurality of lenses included in the lens assembly CM10 or the image sensor 1000 in a particular direction or may compensate a negative affect due to the movement by controlling (adjusting a read-out timing, and the like) the movement characteristics of the image sensor 1000. The image stabilizer CM40 may detect a movement of the camera module ED80 or the electronic device ED01 by using a gyro sensor or an acceleration sensor arranged inside or outside the camera module ED80. The image stabilizer CM40 may be implemented in an optical form.

The memory CM50 may store a part or entire data of an image obtained through the image sensor 1000 for a subsequent image processing operation. For example, when a plurality of images are obtained at high speed, only low resolution images are displayed while the obtained original data (Bayer-Patterned data, high resolution data, and the like) is stored in the memory CM50. Then, the memory CM50 may be used to transmit the original data of a selected (user selection, and the like) image to the image signal processor CM60. The memory CM50 may be incorporated into the memory ED30 of the electronic device ED01, or configured to be an independently operated separate memory.

The image signal processor CM60 may perform image processing on the image obtained through the image sensor 1000 or the image data stored in the memory CM50. The image processing may include depth map generation, three-dimensional modeling, panorama generation, feature point extraction, image synthesis, and/or image compensation (noise reduction, resolution adjustment, brightness adjustment, blurring, sharpening, softening, and the like). The image signal processor CM60 may perform control (exposure time control, or read-out timing control, and the like) on constituent elements (the image sensor 1000, and the like) included in the camera module ED80. The image processed by the image signal processor CM60 may be stored again in the memory CM50 for additional processing or provided to external constituent elements (the memory ED30, the display device ED60, the electronic device ED02, the electronic device ED04, the server ED08, and the like) of the camera module ED80. The image signal processor CM60 may be incorporated into the processor ED20, or configured to be a separate processor operated independently of the processor ED20. When the image signal processor CM60 is configured by a separate processor from the processor ED20, the image processed by the image signal processor CM60 may undergo additional image processing by the processor ED20 and then displayed through the display device ED60.

Further, the image signal processor CM60 may independently receive at least two light sensing signals in each pixel of the image sensor 1000 and generate an automatic focus signal from a difference between the at least two light sensing signals. The image signal processor CM60 may control the lens assembly CM10 to accurately apply the focus of the lens assembly CM10 on the surface of the image sensor 1000 based on the automatic focus signal.

The electronic device ED01 may include a plurality of camera modules ED80 having different attributes or functions. In this case, one of the camera modules ED80 may be a wide angle camera, and another may be a telescopic camera. Similarly, one of the camera modules ED80 may be a front side camera, and another may be a read side camera.

Figure 21:
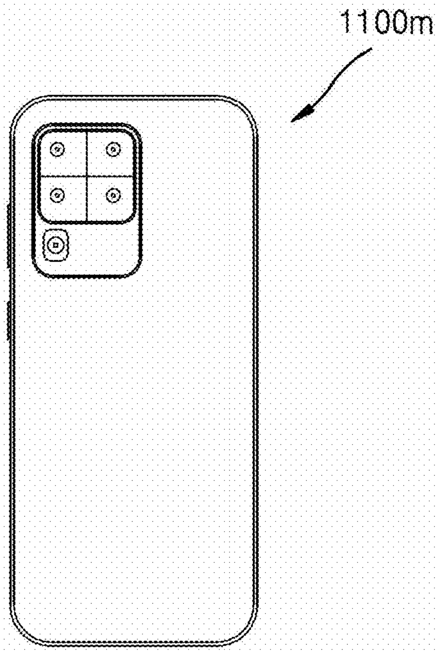
FIGS. 21 to 30 are diagrams of various examples of electronic devices including image sensors according to example embodiments.
Figure 22:
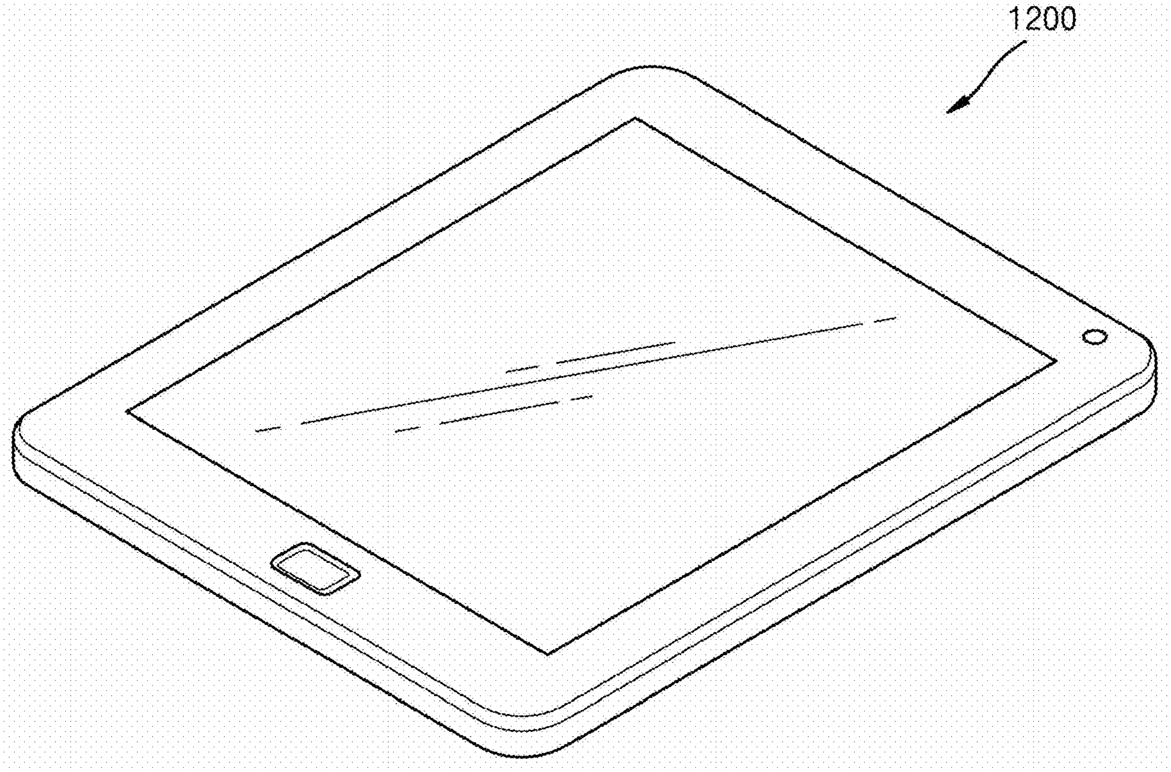
Figure 23:
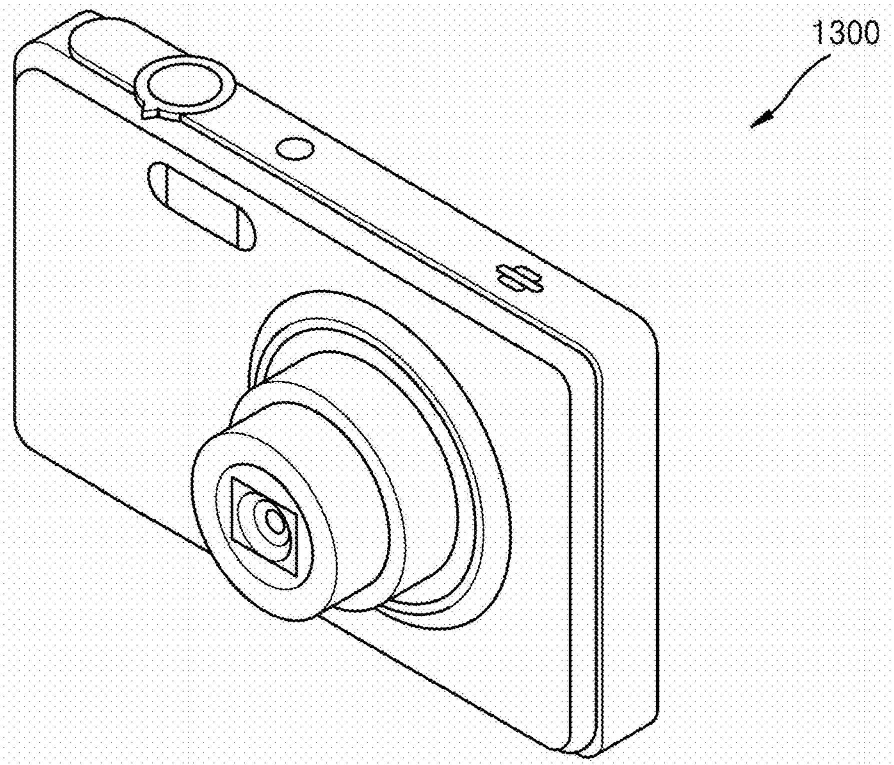
Figure 24:
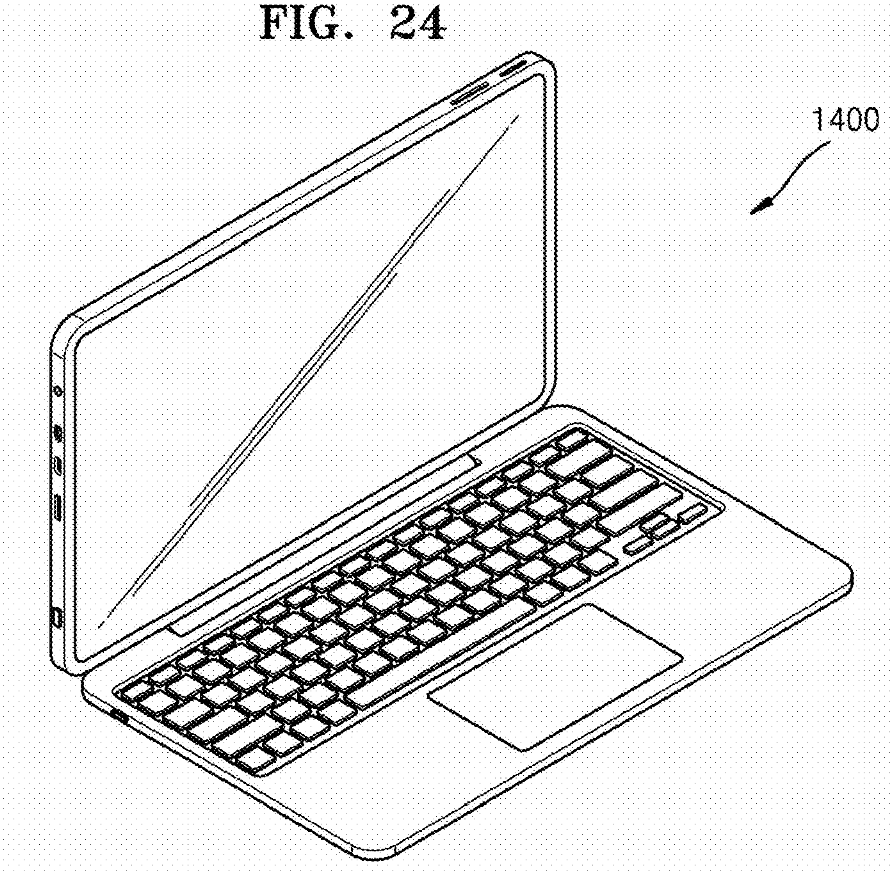
Figure 25:
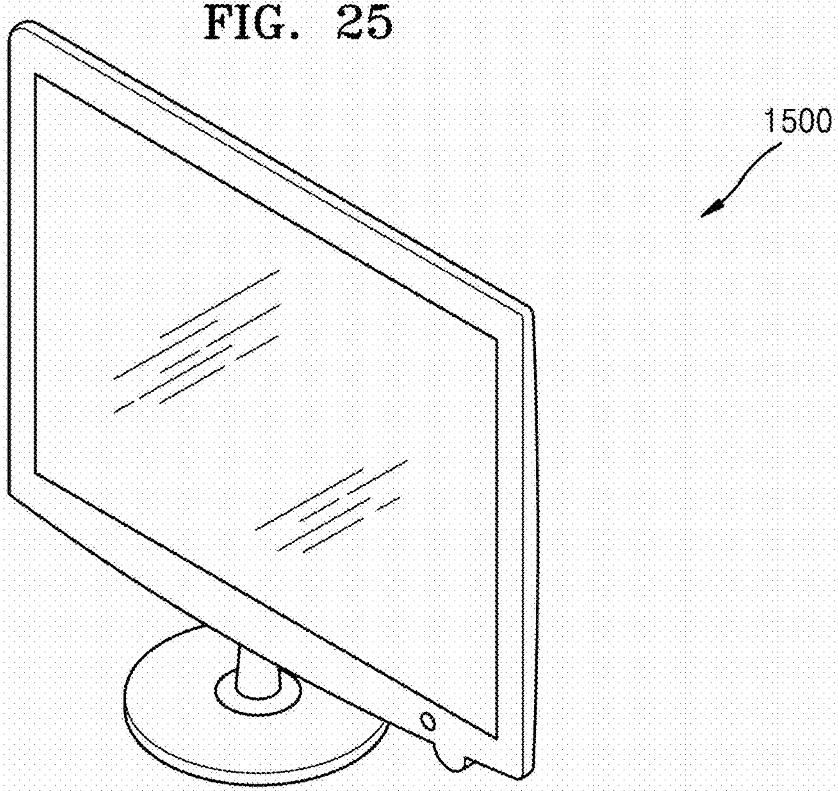

The image sensor 1000 according to example embodiments may be applied to a mobile phone or smartphone 1100*m* illustrated in FIG. 21, a tablet or smart tablet 1200 illustrated in FIG. 22, a digital camera or camcorder 1300 illustrated in FIG. 23, a notebook computer 1400 illustrated in FIG. 24, a television or smart television 1500 illustrated in FIG. 25, and the like. For example, the smartphone 1100*m* or the smart tablet 1200 may include a plurality of high resolution cameras, each having a high resolution image sensor mounted thereon. By using a high resolution cameras, depth information of subjects in an image may be extracted, out focusing of the image may be adjusted, or subjects in the image may be automatically identified.

Figure 26:
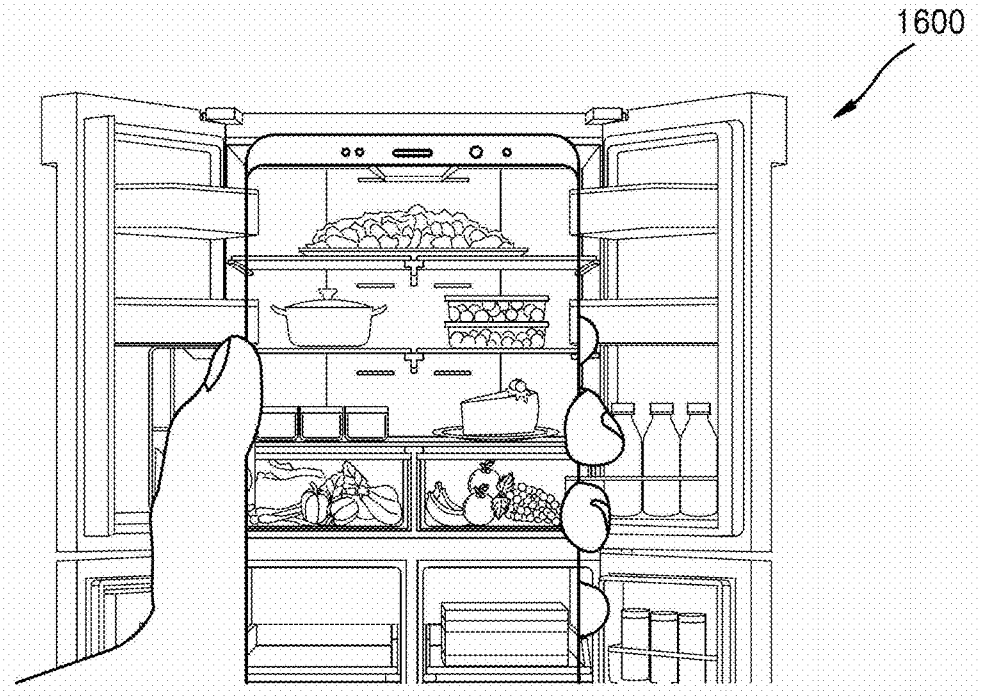
Figure 27:
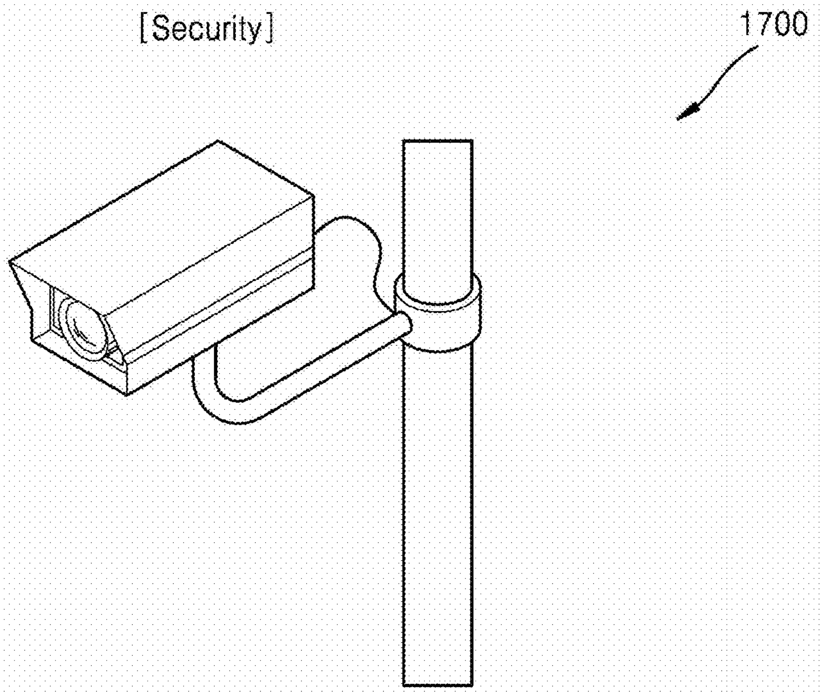
Figure 28:
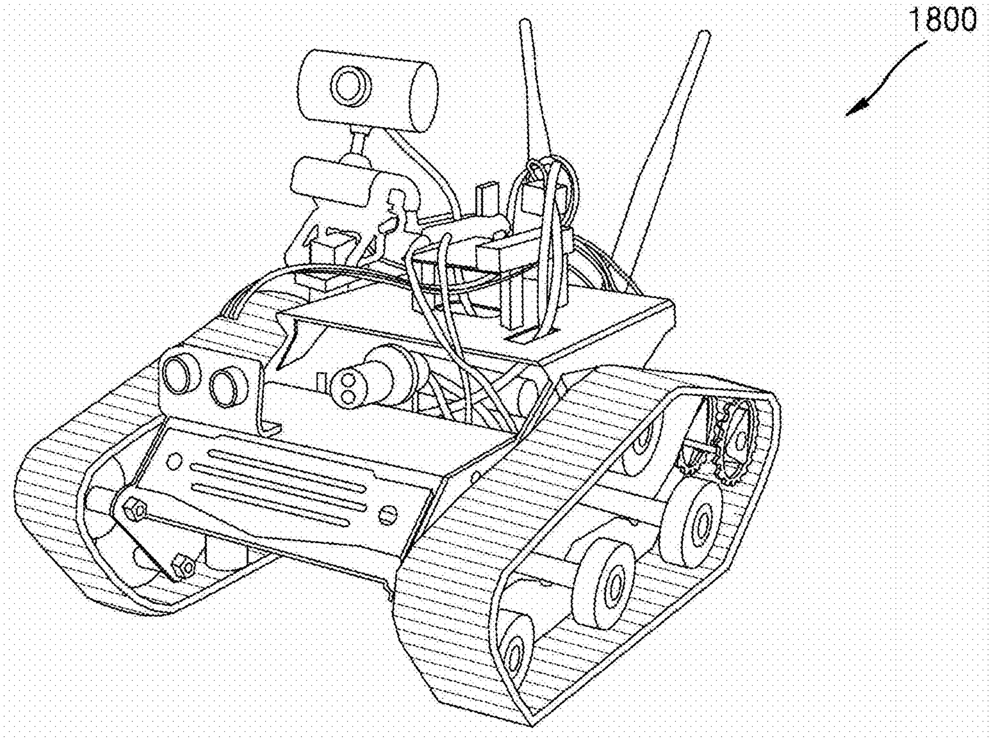
Figure 29:
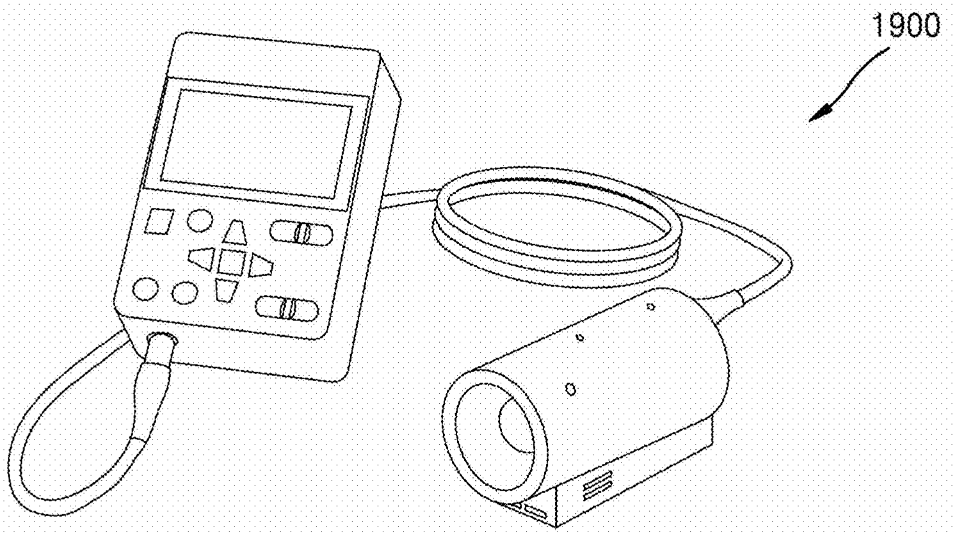

Furthermore, the image sensor 1000 may be applied to a smart refrigerator 1600 illustrated in FIG. 26, a security camera 1700 illustrated in FIG. 27, a robot 1800 illustrated in FIG. 28, a medical camera 1900 illustrated in FIG. 29, and the like. For example, the smart refrigerator 1600 may automatically recognize food in a refrigerator, by using an image sensor, and notify a user of the presence of a particular food, the type of food that is input or output, and the like, through a smartphone. The security camera 1700 may provide an ultrahigh resolution image and may recognize an object or a person in an image in a dark environment by using high sensitivity. The robot 1900 may be provided in a disaster or industrial site that is not directly accessible by people, and may provide a high resolution image. The medical camera 1900 may provide a high resolution image for diagnosis or surgery, and thus a field of vision may be dynamically adjusted.

Figure 30:
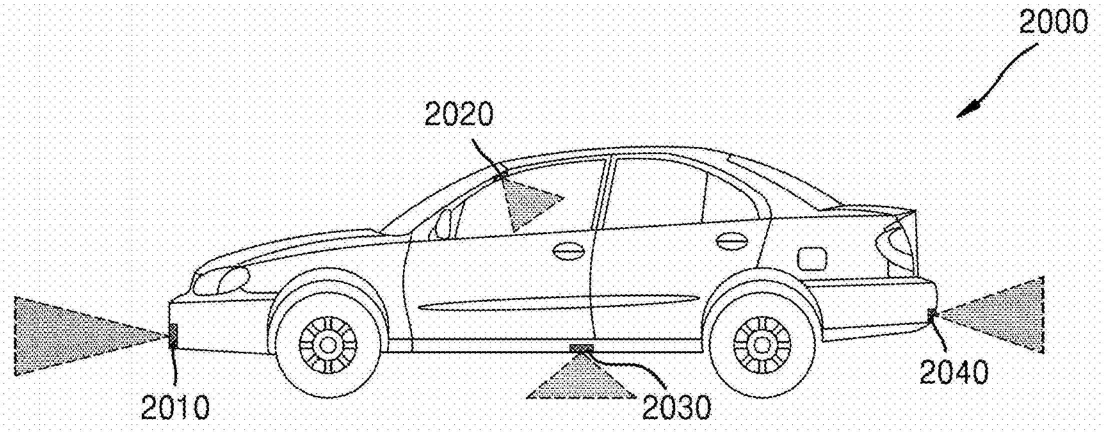

Furthermore, the image sensor 1000 may be applied to a vehicle 2000 as illustrated in FIG. 30. The vehicle 2000 may include a plurality of vehicle cameras 2010, 2020, 2030, and 2040 arranged at various positions. Each of the vehicle cameras 2010, 2020, 2030, and 2040 may include an image sensor according to an example embodiment. The vehicle 2000 may provide to a driver with various pieces of information about the inside or periphery of the vehicle 2000, by using the vehicle cameras 2010, 2020, 2030, and 2040, and thus an object or people in an image may be automatically recognized and information needed for autonomous driving is provided.

According to an image sensor and an electronic device including the same, a color separating lens array may concentrate light by separating incident light based on a wavelength without absorbing or blocking the incident light, and as a phase profile allowing light to be concentrated at a position out of a DTI structure between light sensing cells in a pixel including a plurality light sensing cells of the image sensor may be formed, the light utilization efficiency may be enhanced.

Further, by providing an automatic focus signal having a high contrast ratio, the automatic focus performance of the image sensor and the electronic device may be improved.

It should be understood that example embodiments described herein should be considered in a descriptive sense only and not for purposes of limitation. Descriptions of features or aspects within each example embodiment should typically be considered as available for other similar features or aspects in other example embodiments. While one or more example embodiments have been described with reference to the figures, it will be understood by those of ordinary skill in the art that various changes in form and details may be made therein without departing from the spirit and scope as defined by the following claims.

What is claimed is:

1. An image sensor comprising:

a sensor substrate including a plurality of first pixels configured to sense light of a first wavelength and a plurality of second pixels configured to sense light of a second wavelength different from the first wavelength, wherein the sensor substrate includes a two-dimensional array of unit pixels including the plurality of first pixels and the plurality of second pixels; and a color separating lens array comprising a plurality of nanoposts provided in a nanopost array, the color separating lens array divided into a plurality of first wavelength concentration areas and a plurality of second wavelength concentration areas, wherein the plurality of first wavelength concentration areas configured to concentrate the light of the first wavelength on each of the plurality of first pixels by changing a phase of the light of the first wavelength, wherein the plurality of second wavelength concentration areas configured to concentrate the light of the second wavelength on each of the plurality of second pixels by changing a phase of the light of the second wavelength, wherein each of the unit pixels includes a plurality of light sensing cells arranged in at least one direction of a first direction and a second direction perpendicular to the first direction, and each of the plurality of light sensing cells configured to independently sense light by being electrically separated by a deep trench isolation (DTI) structure, wherein, with respect to each of the unit pixels, the color separating lens array does not include any nanoposts provided at first positions which are spaced apart in a horizontal direction from the DTI structure of a respective pixel, among the unit pixels, so that light is concentrated away from the DTI structure of the respective pixel by the color separating lens array, wherein the first positions are based on $h*\tan(\theta 1)$, where h is a distance between the color separating lens array and the sensor substrate, and $\theta 1$ is an angle formed in a vertical direction by an area of the color separating lens array corresponding to the respective pixel of the sensor substrate, among the plurality of first wavelength concentration areas and the plurality of second wavelength concentration areas, and wherein the first positions vary based on a degree of deviation of the respective pixel from a center of the image sensor.

2. The image sensor of claim 1, wherein the plurality of light sensing cells include a first light sensing cell and a second light sensing cell arranged in the first direction, a third light sensing cell and a fourth light sensing cell arranged in the second direction with respect to the first light sensing cell and the second light sensing cell, wherein a first DTI structure is provided in the first direction between the first and second light sensing cells and the third and fourth light sensing cells, wherein a second DTI structure is provided in the second direction between the first and third light sensing cells and the second and fourth light sensing cells, and wherein the nanopost array does not include a nanopost at a first position, among the first positions, in the horizontal direction, the first position being an intersection of the first DTI structure with the second DTI structure.

3. The image sensor of claim 2, wherein the nanopost array does not include a nanopost at the first position in the horizontal direction, the first position being at least one of the first DTI structure and the second DTI structure.

4. The image sensor of claim 2, wherein each of the first light sensing cell, the second light sensing cell, the third light sensing cell and the fourth light sensing cell includes a photodiode or a plurality of photodiodes arranged in the first direction.

5. The image sensor of claim 2, wherein the nanopost array includes a deviated nanopost provided at a second position away from the first position in the horizontal direction on the intersection of the first DTI structure with the second DTI structure.

6. The image sensor of claim 2, wherein the nanopost array comprises a plurality of grid points in an array structure, wherein one or more of the plurality of grid points includes a nanopost, among the plurality of nanoposts, and wherein the grid points of the array structure are not provided at the first position in the horizontal direction on the intersection of the first and second DTI structures.

7. The image sensor of claim 6, wherein each grid point, among the plurality of grid points in the array structure includes a nanopost.

8. The image sensor of claim 7, wherein an additional displacement is applied to a nanopost close to the first position in the horizontal direction on the intersection of the first DTI structure with the second DTI structure in a direction proceeding away from the first position with respect to the grid point.

9. The image sensor of claim 6, wherein the plurality of grid points has an array structure of 7×7, 8×8, 11×11, or 12×12 with respect to the unit pixel of the sensor substrate, and wherein the one or more of the plurality of grid points includes a nanopost, among the plurality of nanoposts or each grid point, among the plurality of grid points in the array structure includes a nanopost.

10. The image sensor of claim 1, wherein the plurality of light sensing cells include a first light sensing cell and a second light sensing cell arranged in the first direction, and the nanopost array is provided so that a nanopost is not provided at a first position, among the first positions, in the horizontal direction on the DTI structure between the first light sensing cell and the second light sensing cell.

11. The image sensor of claim 10, wherein each of the first and second light sensing cells includes a photodiode or a plurality of photodiodes arranged in the first direction.

12. The image sensor of claim 10, wherein the nanopost array comprises a plurality of grid points in an array structure, wherein one or more of the plurality of grid points includes a nanopost, among the plurality of nanoposts, and wherein the one or more of the plurality of grid points are not provided at the first position in the horizontal direction on the DTI structure.

13. The image sensor of claim 12, wherein the one or more of the plurality of grid points includes a nanopost, among the plurality of nanoposts or each grid point, among the plurality of grid points in the array structure includes a nanopost.

14. The image sensor of claim 12, wherein the plurality of grid points has an array structure of 7×7, 8×8, 11×11, or 12×12 with respect to the unit pixel of the sensor substrate, and wherein the one or more of the plurality of grid points includes a nanopost, among the plurality of nanoposts or each grid point, among the plurality of grid points in the array structure includes a nanopost.

15. An electronic device comprising:

an image sensor configured to convert an optical image into an electrical signal;

a processor configured to control operations of the image sensor and store an output signal generated by the image sensor; and a lens assembly configured to provide light from a subject to the image sensor, wherein the image sensor includes:

a sensor substrate including a plurality of first pixels configured to sense light of a first wavelength and a plurality of second pixels configured to sense light of a second wavelength different from the first wavelength, wherein the sensor substrate includes a two-dimensional array of unit pixels including the plurality of first pixels and the plurality of second pixels; and a color separating lens array comprising a plurality of nanoposts provided in a nanopost array, the color separating lens array divided into a plurality of first wavelength concentration areas and a plurality of second wavelength concentration areas, wherein the plurality of first wavelength concentration areas configured to concentrate the light of the first wavelength on each of the plurality of first pixels by changing a phase of the light of the first wavelength, wherein the plurality of second wavelength concentration areas configured to concentrate the light of the second wavelength on each of the plurality of second pixels by changing a phase of the light of the second wavelength, wherein each of the unit pixels includes a plurality of light sensing cells arranged in at least one direction of a first direction and a second direction perpendicular to the first direction and each of the plurality of light sensing cells configured to independently sense light by being electrically separated by a deep trench isolation (DTI) structure, wherein, with respect to each of the unit pixels, the color separating lens array does not include any nanoposts provided at first positions which are spaced apart in a horizontal direction from the DTI structure of a respective pixel, among the unit pixels, so that light is concentrated at a second position away from the DTI structure of the respective pixel by the color separating lens array, wherein the first positions are based on $h*\tan(\theta 1)$, where h is a distance between the color separating lens array and the sensor substrate, and θ1 is an angle formed in a vertical direction by an area of the color separating lens array corresponding to the respective pixel of the sensor substrate, among the plurality of first wavelength concentration areas and the plurality of second wavelength concentration areas, wherein the processor is configured to generate an automatic focus signal based on a difference between light sensing signals of the plurality of light sensing cells, and wherein the first positions vary based on a degree of deviation of the respective pixel from a center of the image sensor.

16. The electronic device of claim 15, wherein the plurality of light sensing cells include a first light sensing cell and a second light sensing cell arranged in the first direction, a third light sensing cell and a fourth light sensing cell arranged in the second direction with respect to the first light sensing cell and the second light sensing cell, wherein a first DTI structure is provided in the first direction between the first and second light sensing cells and the third and fourth light sensing cells, wherein a second DTI structure is provided in the second direction between the first and third light sensing cells and the second and fourth light sensing cells, wherein the nanopost array does not include a nanopost at a first position, among the first positions, in the horizontal direction, the first position being an intersection of the first DTI structure with the second DTI structure, and wherein the processor is further configured to generate an automatic focus signal based on a difference between a light sensing signal of the first and third light sensing cells and a light sensing signal of the second and fourth light sensing cells.

17. The electronic device of claim 16, wherein each of the first lighting sensing cell, the second lighting sensing cell, the third lighting sensing cell and the fourth light sensing cell includes a photodiode or a plurality of photodiodes arranged in the first direction.

18. The electronic device of claim 16, wherein the plurality of light sensing cells include a first light sensing cell and a second light sensing cell arranged in the first direction, and the nanopost array is provided so that a nanopost is not provided at the first position on the first DTI structure between the first light sensing cell and the second light sensing cell, and wherein the processor is configured to generate an automatic focus signal based on a difference between a light sensing signal of the first light sensing cell and a light sensing signal of the second light sensing cell.

19. The electronic device of claim 18, wherein each of the first and second light sensing cells includes a photodiode or a plurality of photodiodes arranged in the first direction.

20. The electronic device of claim 16, wherein the nanopost array comprises a plurality of grid points in an array structure, wherein one or more of the plurality of grid points includes a nanopost, among the plurality of nanoposts, wherein the plurality of grid points are not provided at the first position on the first DTI structure, wherein the array structure grid point includes an array structure of 7×7, 8×8, 11×11, or 12×12 with respect to the unit pixel of the sensor substrate, and wherein a nanopost is provided in some or every array structure grid points.

21. An image sensor comprising:

a sensor substrate including a plurality of pixels configured to sense light based on a wavelength; and a color separating lens array comprising a plurality of nanoposts provided in a nanopost array, the color separating lens array divided into a plurality of concentration areas configured to direct the light on to the plurality of pixels based on the wavelength, wherein each of the plurality of pixels, includes a plurality of light sensing cells arranged in a first direction and a second direction perpendicular to the first direction and each of the plurality of light sensing cells configured to independently sense light by being electrically separated by a deep trench isolation (DTI) structure, wherein, with respect to each of the plurality of pixels, the color separating lens array does not include any nanopost provided at first positions spaced apart in a horizontal direction from the DTI structure so that light is directed away from the DTI structure by the color separating lens array, wherein the first positions are based on a distance between the color separating lens array and the sensor substrate, and an angle formed in a vertical direction by an area of the color separating lens array corresponding to the respective pixel of the sensor substrate, among the plurality of concentration areas, and wherein the first positions vary based on a degree of deviation of the respective pixel from a center of the image sensor.

22. The image sensor according to claim 21, wherein the first positions are spaced apart by h*tan(θ1) in the horizontal direction from the DTI structure of the respective pixel, and where h is the distance between the color separating lens array and the sensor substrate, and θ1 is the angle formed by the area of the color separating lens array corresponding to the respective pixel of the sensor substrate.

23. The image sensor according to claim 22, wherein the nanopost array comprises a plurality of grid points in an array structure, wherein one or more of the plurality of grid points includes a nanopost, among the plurality of nanoposts, and wherein the plurality of grid points are not provided at a first position, among the first positions.

24. The image sensor according to claim 22, wherein, wherein the plurality of light sensing cells include a first light sensing cell and a second light sensing cell arranged in the first direction, a third light sensing cell and a fourth light sensing cell arranged in the second direction with respect to the first light sensing cell and the second light sensing cell, wherein a first DTI structure is provided in the first direction between the first and second light sensing cells and the third and fourth light sensing cells, wherein a second DTI structure is provided in the second direction between the first and third light sensing cells and the second and fourth light sensing cells, and wherein the nanopost array does not include a nanopost at a first position, among the first positions, in the horizontal direction, the first position being any of:

a position on the first DTI structure;

a position on the second DTI structure; or a position at an intersection of the first DTI structure with the second DTI structure.

25. The image sensor according to claim 24, wherein the nanopost array includes a deviated nanopost provided at a second position away from the first position in the horizontal direction on the intersection of the first DTI structure with the second DTI structure.

* * * * *